(12) United States Patent
Okuyama et al.

(10) Patent No.: US 12,349,591 B2
(45) Date of Patent: Jul. 1, 2025

(54) LIGHT-EMITTING DEVICE, LIGHT-EMITTING APPARATUS, ELECTRONIC DEVICE, AND LIGHTING DEVICE

(71) Applicant: SEMICONDUCTOR ENERGY LABORATORY CO., LTD., Atsugi (JP)

(72) Inventors: Takumu Okuyama, Tokyo (JP); Hiromi Seo, Kanagawa (JP); Naoaki Hashimoto, Kanagawa (JP); Yusuke Takita, Kanagawa (JP); Tsunenori Suzuki, Kanagawa (JP); Satoshi Seo, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 739 days.

(21) Appl. No.: 17/605,379

(22) PCT Filed: Apr. 21, 2020

(86) PCT No.: PCT/IB2020/053746
§ 371 (c)(1),
(2) Date: Oct. 21, 2021

(87) PCT Pub. No.: WO2020/217162
PCT Pub. Date: Oct. 29, 2020

(65) Prior Publication Data
US 2022/0209128 A1    Jun. 30, 2022

(30) Foreign Application Priority Data
Apr. 26, 2019 (JP) .................. 2019-085571

(51) Int. Cl.
*H01L 51/00* (2006.01)
*C09K 11/02* (2006.01)
(Continued)

(52) U.S. Cl.
CPC .......... *H10K 85/636* (2023.02); *C09K 11/02* (2013.01); *C09K 11/06* (2013.01); *H10K 85/30* (2023.02);
(Continued)

(58) Field of Classification Search
None
See application file for complete search history.

(56) References Cited

U.S. PATENT DOCUMENTS 8,252,889 B2   8/2012   Elschner et al.
8,841,655 B2   9/2014   Okamoto
(Continued)

FOREIGN PATENT DOCUMENTS

CN   101003665 A    7/2007
DE   102006002798   8/2007
(Continued)

OTHER PUBLICATIONS

International Search Report (Application No. PCT/IB2020/053746) Dated Jul. 21, 2020.
(Continued)

*Primary Examiner* — Long Pham
(74) *Attorney, Agent, or Firm* — Fish & Richardson P.C.

(57) ABSTRACT

A novel light-emitting device is provided. A light-emitting device with high emission efficiency is provided. A light-emitting device with a favorable lifetime is provided. A light-emitting device with low driving voltage is provided. A light-emitting device with favorable display quality is provided. A light-emitting device that includes an anode, a cathode, and an EL layer positioned between the anode and the cathode, in which the EL layer includes a hole-injection layer, a light-emitting layer, and an electron-transport layer; in which the electron-transport layer contains an electron-transport material and an alkali metal, an alkaline earth (Continued)

metal, a compound of an alkali metal or an alkaline earth metal, or a complex thereof; and in which the resistivity of the hole-injection layer is within a certain range, is provided.

20 Claims, 27 Drawing Sheets

(51) Int. Cl.
*C09K 11/06* (2006.01)
*H10K 85/30* (2023.01)
*H10K 85/60* (2023.01)
*H10K 50/16* (2023.01)

(52) U.S. Cl.
CPC ......... *H10K 85/615* (2023.02); *H10K 85/626* (2023.02); *H10K 85/633* (2023.02); *H10K 85/6572* (2023.02); *C09K 2211/1007* (2013.01); *C09K 2211/1014* (2013.01); *C09K 2211/1022* (2013.01); *H10K 50/16* (2023.02); *H10K 85/6574* (2023.02)

(56) References Cited

U.S. PATENT DOCUMENTS

| | | | |
|---|---|---|---|
| 9,647,228 B2 | 5/2017 | Seo et al. | |
| 10,326,079 B2 | 6/2019 | Hayashi et al. | |
| 11,489,133 B2 * | 11/2022 | Seo | H10K 59/00 |
| 11,751,476 B2 | 9/2023 | Cho et al. | |
| 11,974,447 B2 * | 4/2024 | Seo | H10K 50/171 |
| 2007/0172702 A1 | 7/2007 | Elschner et al. | |
| 2017/0117485 A1 | 4/2017 | Cho et al. | |
| 2018/0114916 A1 | 4/2018 | Hayashi et al. | |
| 2020/0395568 A1 * | 12/2020 | Seo | H10K 50/165 |
| 2021/0249619 A1 | 8/2021 | Seo et al. | |
| 2021/0367177 A1 | 11/2021 | Seo et al. | |
| 2022/0077397 A1 * | 3/2022 | Hashimoto | H10K 85/6572 |
| 2022/0123251 A1 * | 4/2022 | Yamazaki | H10K 50/11 |
| 2022/0209128 A1 * | 6/2022 | Okuyama | C09K 11/06 |
| 2023/0104201 A1 * | 4/2023 | Seo | H10K 50/16 257/40 |
| 2023/0138085 A1 * | 5/2023 | Kawakami | H10K 85/30 257/40 |

FOREIGN PATENT DOCUMENTS

| | | |
|---|---|---|
| EP | 1810986 A | 7/2007 |
| EP | 3282496 A | 2/2018 |
| EP | 3291323 A | 3/2018 |
| JP | 2007-191715 A | 8/2007 |
| JP | 2011-040479 A | 2/2011 |
| JP | 2016-208021 A | 12/2016 |
| JP | 2017-510071 | 4/2017 |
| KR | 2007-0077123 A | 7/2007 |
| KR | 2012-0127256 A | 11/2012 |
| KR | 2016-0125140 A | 10/2016 |
| KR | 2017-0141736 A | 12/2017 |
| TW | 200801112 | 1/2008 |
| WO | WO-2011/065136 | 6/2011 |
| WO | WO-2015/142036 | 9/2015 |
| WO | WO-2016/163276 | 10/2016 |
| WO | WO-2016/175211 | 11/2016 |

OTHER PUBLICATIONS

Written Opinion (Application No. PCT/IB2020/053746) Dated Jul. 21, 2020.

Okachi.T et al., "Determination of Charge-Carrier Mobility in Organic Light-Emitting Diodes by Impedance Spectroscopy in Presence of Localized States", Jpn. J. Appl. Phys. (Japanese Journal of Applied Physics), Dec. 19, 2008, vol. 47, No. 12, pp. 8965-8972.

* cited by examiner

FIG. 1A1
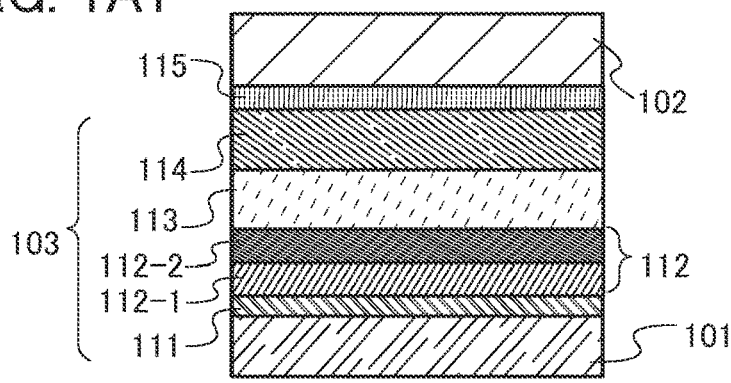
FIG. 1A2
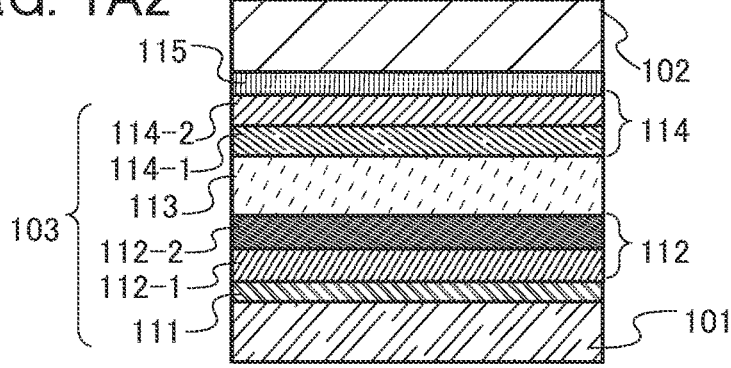
FIG. 1B
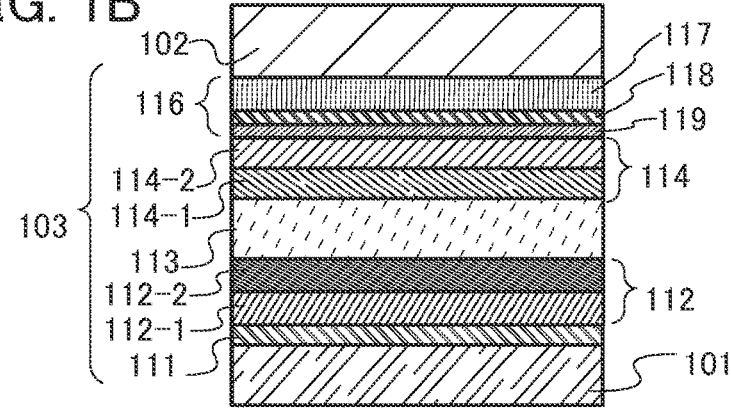
FIG. 1C
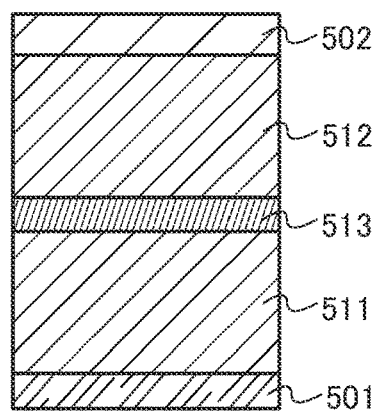

FIG. 2A1
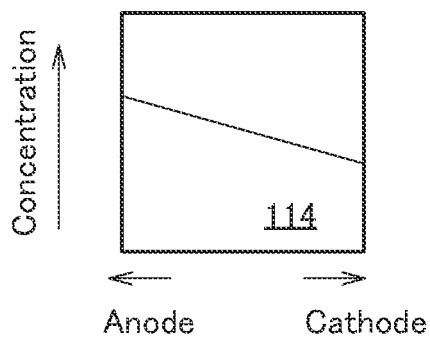
FIG. 2A2
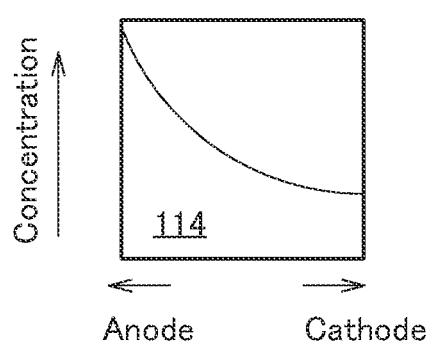
FIG. 2B1
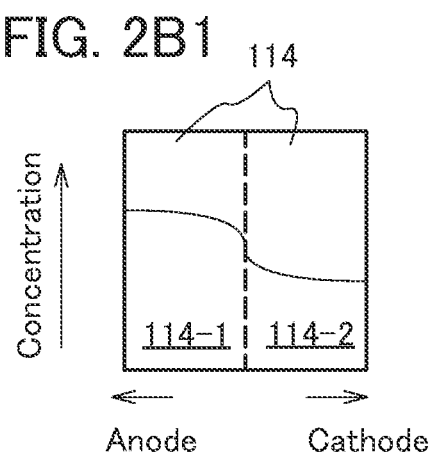
FIG. 2B2
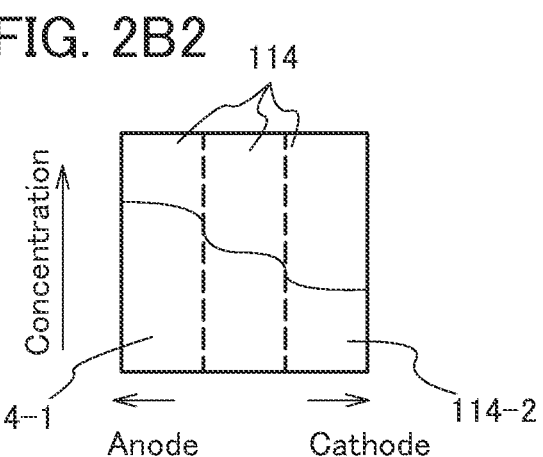

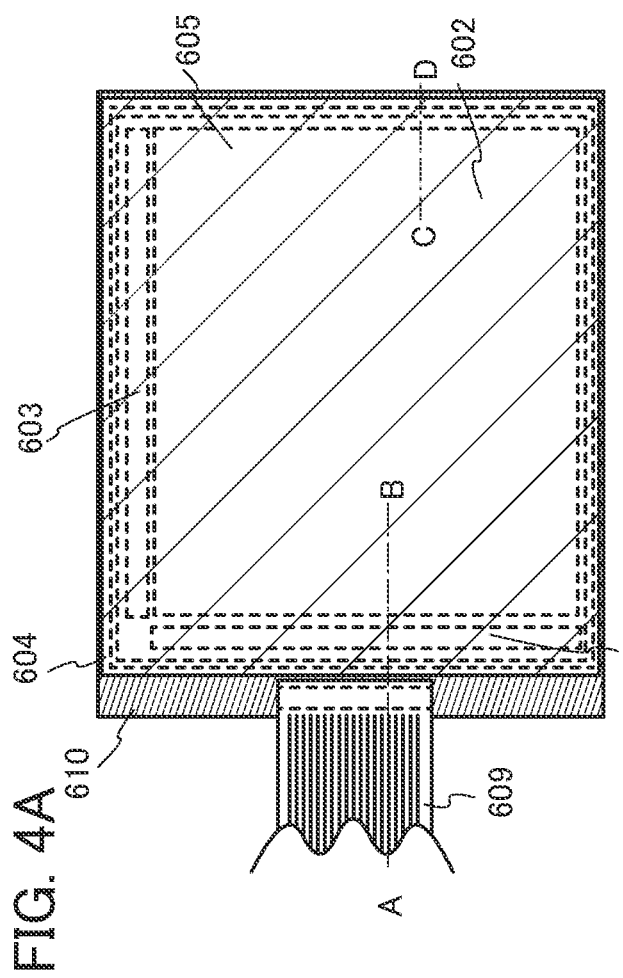
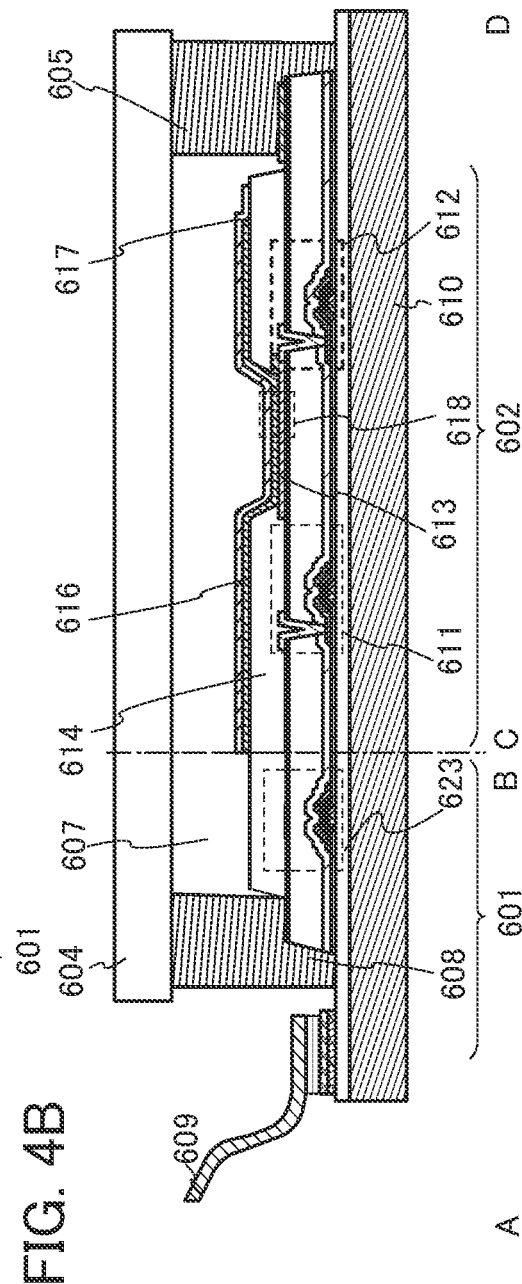

FIG. 8A
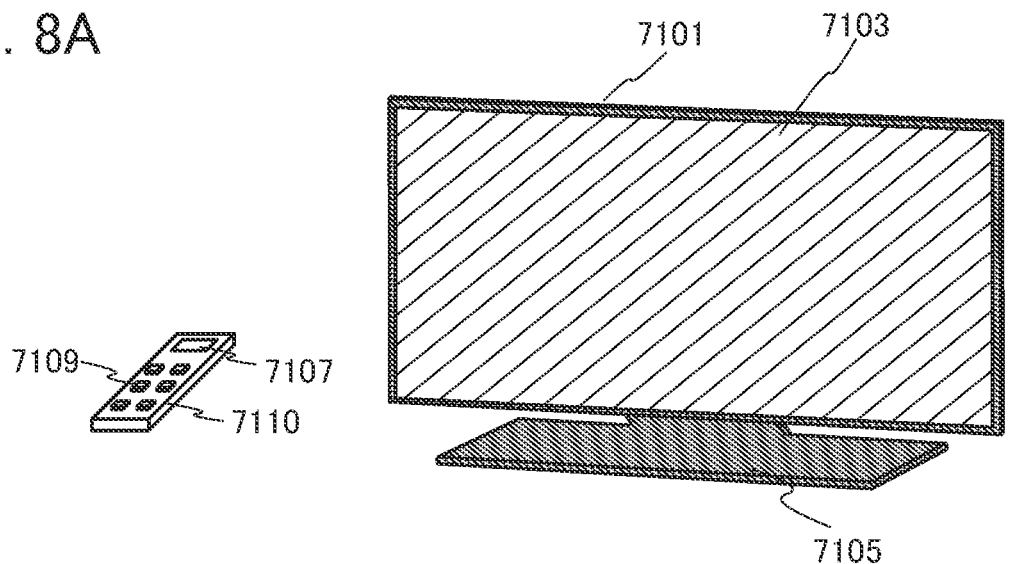
FIG. 8B1
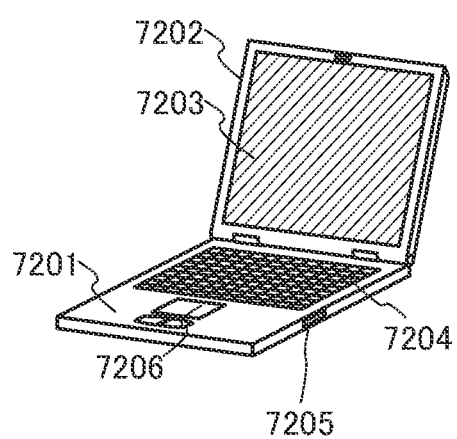
FIG. 8B2
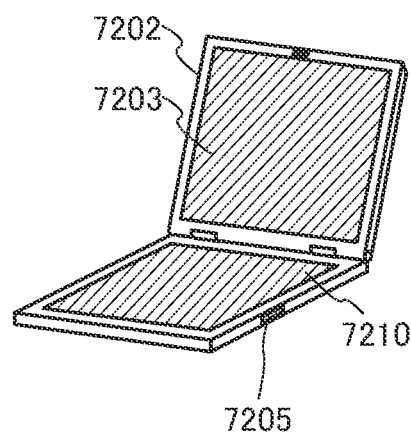
FIG. 8C
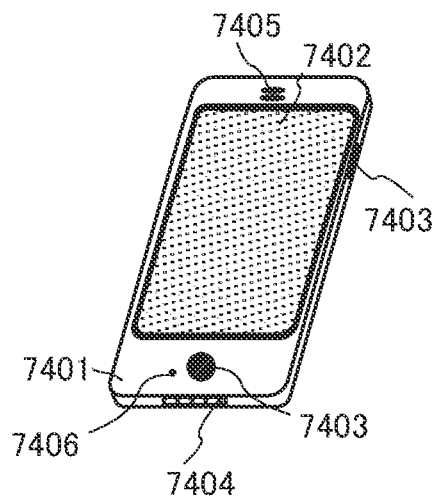

LIGHT-EMITTING DEVICE, LIGHT-EMITTING APPARATUS, ELECTRONIC DEVICE, AND LIGHTING DEVICE

CROSS REFERENCE TO RELATED APPLICATIONS

This application is a U.S. National Phase Application under 35 U.S.C. § 371 of International Application PCT/IB2020/053746, filed on Apr. 21, 2020, which is incorporated by reference and claims the benefit of a foreign priority application filed in Japan on Apr. 26, 2019, as Application No. 2019-085571.

TECHNICAL FIELD

One embodiment of the present invention relates to a light-emitting element, a light-emitting device, a display module, a lighting module, a display device, a light-emitting apparatus, an electronic device, and a lighting device. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting apparatus, a lighting device, a power storage device, a memory device, an imaging device, a driving method thereof, and a manufacturing method thereof.

BACKGROUND ART

Light-emitting devices (organic EL elements) that use organic compounds and utilize electroluminescence (EL) have been put into practical use. In the basic structure of such light-emitting devices, an organic compound layer containing a light-emitting material (an EL layer) is interposed between a pair of electrodes. Carriers are injected by application of voltage to the element, and recombination energy of the carriers is used, whereby light emission can be obtained from the light-emitting material.

Such light-emitting devices are of self-light-emitting type and thus, when used as pixels of a display, have advantages over liquid crystal displays, such as high visibility and no need for backlight, and are suitable as flat panel display elements. Displays using such light-emitting devices are also highly advantageous in that they can be thin and lightweight. Moreover, an extremely fast response speed is also a feature.

Since light-emitting layers of such light-emitting devices can be successively formed two-dimensionally, planar light emission can be obtained. This feature is difficult to realize with point light sources typified by incandescent lamps and LEDs or linear light sources typified by fluorescent lamps; thus, the light-emitting devices also have great potential as planar light sources, which can be applied to lighting devices and the like.

Thus, displays or lighting devices using light-emitting devices can be suitably used for a variety of electronic devices, and research and development of light-emitting devices have progressed for higher efficiency and longer lifetime.

In a structure disclosed in Patent Document 1, a hole-transport material whose HOMO level is between the HOMO level of a first hole-injection layer and the HOMO level of a host material is provided between a light-emitting layer and a first hole-transport layer in contact with the hole-injection layer.

The characteristics of light-emitting devices have been improved considerably, but are still insufficient to satisfy advanced requirements for various characteristics such as efficiency and durability.

REFERENCE

Patent Document

[Patent Document 1] PCT International Publication No. WO2011/065136

SUMMARY OF THE INVENTION

Problems to be Solved by the Invention

An object of one embodiment of the present invention is to provide a novel light-emitting device. Another object is to provide a light-emitting device with high emission efficiency. Another object is to provide a light-emitting device with a favorable lifetime. Another object is to provide a light-emitting device with low driving voltage. A light-emitting apparatus with favorable display quality can be provided.

An object of another embodiment of the present invention is to provide a light-emitting apparatus, an electronic device, and a display device each having high reliability. An object of another embodiment of the present invention is to provide a light-emitting apparatus, an electronic device, and a display device each having low power consumption.

It is only necessary that at least one of the above-described objects be achieved in the present invention.

Means for Solving the Problems

One embodiment of the present invention is a light-emitting device including an anode, a cathode, and an EL layer positioned between the anode and the cathode, in which the EL layer includes a hole-injection layer, a light-emitting layer, and an electron-transport layer; the electron-transport layer contains an electron-transport material and an alkali metal, an alkaline earth metal, a compound of an alkali metal or an alkaline earth metal, or a complex thereof; and the resistivity of the hole-injection layer is higher than or equal to $1 \times 10^4$ [Ω·cm] and lower than or equal to $1 \times 10^7$ [Ω·cm].

Another embodiment of the present invention is a light-emitting device including an anode, a cathode, and an EL layer positioned between the anode and the cathode, in which the EL layer includes a hole-injection layer, a light-emitting layer, and an electron-transport layer; the electron-transport layer includes an electron-transport material and a metal complex containing a ligand having a 8-hydroxyquinolinato structure and a monovalent metal ion; and the resistivity of the hole-injection layer is higher than or equal to $1 \times 10^4$ [Ω·cm] and lower than or equal to $1 \times 10^7$ [Ω·cm].

Another embodiment of the present invention is a light-emitting device including an anode, a cathode, and an EL layer positioned between the anode and the cathode, in which the EL layer includes a hole-injection layer, a light-emitting layer, and an electron-transport layer; the electron-transport layer includes an electron-transport material and a lithium complex containing a ligand having a 8-hydroxyquinolinato structure; and the resistivity of the hole-injection layer is higher than or equal to $1\times10^4$ [Ω·cm] and lower than or equal to $1\times10^7$ [Ω·cm].

Another embodiment of the present invention is a light-emitting device including an anode, a cathode, and an EL layer positioned between the anode and cathode, in which the EL layer includes a hole-injection layer, a light-emitting layer, and an electron-transport layer; the electron-transport layer contains an electron-transport material; the HOMO level of the electron-transport material is higher than or equal to $-6.0$ eV; and the resistivity of the hole-injection layer is higher than or equal to $1\times10^4$ [Ω·cm] and lower than or equal to $1\times10^7$ [Ω·cm].

Another embodiment of the present invention is a light-emitting device including an anode, a cathode, and an EL layer positioned between the anode and the cathode, in which the EL layer includes a hole-injection layer, a light-emitting layer, and an electron-transport layer; the electron-transport layer contains an electron-transport material; the electron-transport material is an organic compound having an anthracene skeleton; and the resistivity of the hole-injection layer is higher than or equal to $1\times10^4$ [Ω·cm] and lower than or equal to $1\times10^7$ [Ω·cm].

Another embodiment of the present invention is a light-emitting device including an anode, a cathode, and an EL layer positioned between the anode and the cathode, in which the EL layer includes a hole-injection layer, a light-emitting layer, and an electron-transport layer; the electron mobility of the electron-transport layer in the case where the square root of the electric field strength [V/cm] is 600 is higher than or equal to $1\times10^{-7}$ cm$^2$/Vs and lower than or equal to $5\times10^{-5}$ cm$^2$/Vs; and the resistivity of the hole-injection layer is higher than or equal to $1\times10^4$ [Ω·cm] and lower than or equal to $1\times10^7$ [Ω·cm].

Another embodiment of the present invention is a light-emitting device including an anode, a cathode, and an EL layer positioned between the anode and the cathode, in which the EL layer includes a hole-injection layer, a light-emitting layer, and an electron-transport layer; the electron-transport layer contains an electron-transport material and an alkali metal, an alkaline earth metal, a compound of an alkali metal or an alkaline earth metal, or a complex thereof; the electron-transport layer includes a first region and a second region; the first region is positioned between the light-emitting layer and the second region; the concentration of the alkali metal, the alkaline earth metal, the compound of an alkali metal or an alkaline earth metal, or the complex thereof is different between the first region and the second region; and the resistivity of the hole-injection layer is higher than or equal to $1\times10^4$ [Ω·cm] and lower than or equal to $1\times10^7$ [Ω·cm].

Another embodiment of the present invention is the light-emitting device having the above structure, in which the concentration of the alkali metal, the alkaline earth metal, the compound of an alkali metal or an alkaline earth metal, or the complex thereof in the first region is high.

Another embodiment of the present invention is the light-emitting device having the above structure, in which the concentration of the alkali metal, the alkaline earth metal, the compound of an alkali metal or an alkaline earth metal, or the complex thereof in the second region is high.

Another embodiment of the present invention is the light-emitting device having the above structure, in which the concentration of the alkali metal, the alkaline earth metal, the compound of an alkali metal or an alkaline earth metal, or the complex thereof in the first region or the second region is 0.

Another embodiment of the present invention is the light-emitting device having the above structure, in which the hole-injection layer contains a hole-transport material and an electron-accepting material; the electron-accepting material exhibits an electron-accepting property with respect to the hole-transport material; and the hole-transport material is an organic compound having a HOMO level of higher than or equal to $-5.7$ eV and lower than or equal to $-5.4$ eV.

Another embodiment of the present invention is the light-emitting device having the above structure, in which the electron mobility of the hole-transport material in the case where the square root of the electric field strength [V/cm] is 600 is lower than or equal to $1\times10^{-3}$ cm$^2$/Vs.

Another embodiment of the present invention is the light-emitting device having the above structure, in which the resistivity of the hole-injection layer is higher than or equal to $5\times10^4$ [Ω·cm] and lower than or equal to $1\times10^7$ [Ω·cm].

Another embodiment of the present invention is the light-emitting device having the above structure, in which the resistivity of the hole-injection layer is higher than or equal to $1\times10^5$ [Ω·cm] and lower than or equal to $1\times10^7$ [Ω·cm].

Another embodiment of the present invention is the light-emitting device having the above structure, in which the EL layer includes a hole-transport layer between the hole-injection layer and the light-emitting layer.

Another embodiment of the present invention is the light-emitting device having the above structure, in which the hole-transport layer has a two-layer structure of a first hole-transport layer positioned on the hole-injection layer side and a second hole-transport layer positioned on the light-emitting layer side.

Another embodiment of the present invention is the light-emitting device having the above structure, in which the second hole-transport layer also functions as an electron-blocking layer.

Another embodiment of the present invention is the light-emitting device having the above structure, in which the light-emitting layer contains a host material and an emission center material; and the electron mobility of the electron-transport material is lower than the electron mobility of the host material.

Another embodiment of the present invention is the light-emitting device having the above structure, in which the emission center material exhibits fluorescence.

Another embodiment of the present invention is the light-emitting device having the above structure, in which the emission center material exhibits blue fluorescence.

Another embodiment of the present invention is an electronic device including the above light-emitting device and at least one of a sensor, an operation button, a speaker, or a microphone.

Another embodiment of the present invention is a light-emitting apparatus including the above light-emitting device, a transistor, and a substrate.

Another embodiment of the present invention is a lighting device including the above light-emitting device and a housing.

Note that the light-emitting apparatus in this specification includes, in its category, an image display device that uses a light-emitting device. The light-emitting apparatus may also include a module in which a light-emitting device is provided with a connector such as an anisotropic conductive film or a TCP (Tape Carrier Package), a module in which a printed wiring board is provided at the end of a TCP, and a module in which an IC (integrated circuit) is directly mounted on a light-emitting device by a COG (Chip On Glass) method. Furthermore, in some cases, lighting equipment or the like includes the light-emitting apparatus.

Effect of the Invention

According to one embodiment of the present invention, a novel light-emitting device can be provided. A light-emitting device with a favorable lifetime can be provided. A light-emitting device with high emission efficiency can be provided. A light-emitting apparatus with favorable display quality can be provided. A light-emitting device with low driving voltage can be provided.

According to another embodiment of the present invention, a light-emitting apparatus, an electronic device, and a display device each having high reliability can be provided. According to another embodiment of the present invention, a light-emitting apparatus, an electronic device, and a display device each having low power consumption can be provided.

Note that the description of these effects does not preclude the existence of other effects. One embodiment of the present invention does not have to have all of these effects. Note that effects other than these will be apparent from the description of the specification, the drawings, the claims, and the like and effects other than these can be derived from the description of the specification, the drawings, the claims, and the like.

BRIEF DESCRIPTION OF THE DRAWINGS

FIG. 1A1, FIG. 1A2, FIG. 1B, and FIG. 1C are schematic diagrams of light-emitting devices.

FIG. 2A1, FIG. 2A2, FIG. 2B1, and FIG. 2B2 each show the concentration distribution of an eighth substance in an electron-transport layer.

FIG. 4A and FIG. 4B are conceptual diagrams of an active matrix light-emitting apparatus.

FIG. 8A, FIG. 8B1, FIG. 8B2, and FIG. 8C are diagrams illustrating electronic devices.

MODE FOR CARRYING OUT THE INVENTION

Figure 3A:
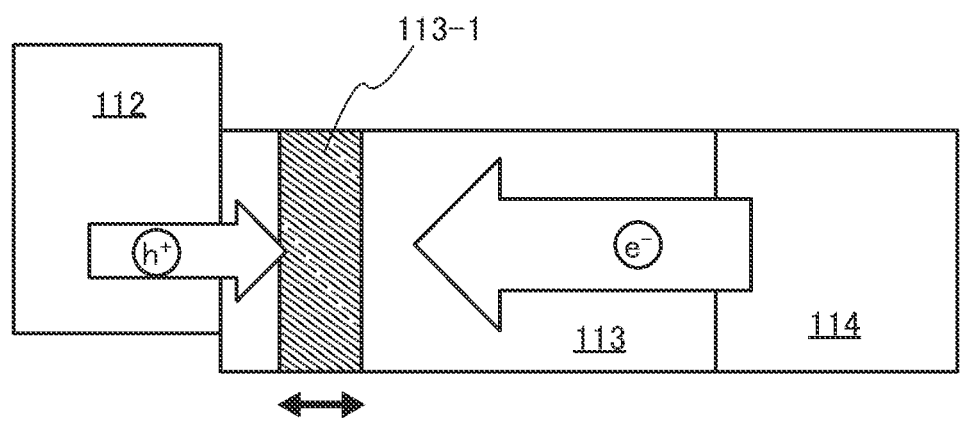
FIG. 3A and FIG. 3B are diagrams illustrating a recombination region of a light-emitting device.

Embodiments of the present invention will be described in detail below with reference to drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Embodiment 1

FIG. 1A1 and FIG. 1A2 are diagrams illustrating a light-emitting device of one embodiment of the present invention. The light-emitting device of one embodiment of the present invention includes an anode 101, a cathode 102, and an EL layer 103, and the EL layer includes a hole-injection layer 111, a hole-transport layer 112, a light-emitting layer 113, and an electron-transport layer 114. Note that it is preferable that the hole-transport layer 112 include a first hole-transport layer 112-1 and a second hole-transport layer 112-2, and the electron-transport layer 114 include, as illustrated in FIG. 1A2, a first electron-transport layer 114-1 and a second electron-transport layer 114-2.

Although, in addition to these, an electron-injection layer 115 is illustrated in the EL layer 103 in FIG. 1A1 and FIG. 1A2, the structure of the light-emitting device is not limited thereto. As long as the above-described components are included, a layer having another function may be included.

Here, in consideration of the crosstalk suppression effect, the resistivity of the hole-injection layer 111 in the light-emitting device of one embodiment of the present invention is preferably as high as possible. However, it was found that a too high resistivity prevented hole injection and did not lead to a light-emitting device with favorable lifetime. Therefore, the resistivity of a material included in the hole-injection layer 111 is preferably higher than or equal to $1\times10^4$ [Ω·cm] and lower than or equal to $1\times10^7$ [Ω·cm]. The light-emitting device has a favorable lifetime, and a light-emitting apparatus using the light-emitting device can have favorable display quality with suppressed crosstalk.

The resistivity is preferably higher than or equal to $5\times10^4$ [Ω·cm] and lower than or equal to $1\times10^7$ [Ω·cm], further preferably higher than or equal to $1\times10^5$ [Ω·cm] and lower than or equal to $1\times10^7$ [Ω·cm] in terms of the crosstalk suppression effect.

The hole-injection layer 111 facilitates injection of holes into the EL layer 103 and is formed using a material having a high hole-injection property. Although the hole-injection layer 111 may be formed using a single material, the hole-injection layer 111 is preferably formed using a material containing a first substance and a second substance. The first substance is an acceptor substance and is a substance that exhibits an electron-accepting property with respect to the second substance. The second substance is a hole-transport material and preferably has a relatively deep HOMO level of higher than or equal to −5.7 eV and lower than or equal to −5.4 eV. When the second substance has a relatively deep HOMO level, induced holes are easily injected to the hole-transport layer 112; meanwhile, the induction of holes is inhibited properly, and thus the resistivity can be increased to such a degree that crosstalk does not occur.

The first substance may be either an inorganic compound or an organic compound; for example, an organic compound having an electron-withdrawing group (in particular, a cyano group or a halogen group such as a fluoro group) is preferably used. As the first substance, a substance that exhibits an electron-accepting property with respect to the second substance is selected from such substances as appropriate. Examples of such an organic compound include 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), and 2-(7-dicyanomethylen-1,3,4,5,6,8,9,10-octafluoro-7H-pyren-2-ylidene)malononitrile. A compound in which electron-withdrawing groups are bonded to a condensed aromatic ring having a plurality of heteroatoms, such as HAT-CN, is particularly preferable because it is thermally stable. A [3]radialene derivative having an electron-withdrawing group (in particular, a cyano group or a halogen group such as a fluoro group) has a very high electron-accepting property and thus is preferable. Specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile]. In the case where the first substance is an inorganic compound, a transition metal oxide can be used. An oxide of a metal belonging to Group 4 to Group 8 in the periodic table is particularly preferred. As the oxide of a metal belonging to Group 4 to Group 8 in the periodic table, vanadium oxide, niobium oxide, tantalum oxide, chromium oxide, molybdenum oxide, tungsten oxide, manganese oxide, rhenium oxide, or the like is preferably used because their electron-accepting properties is high. In particular, molybdenum oxide is preferable because it is stable in the air, has a low hygroscopic property, and is easily handled.

The second substance is a hole-transport material which is preferably an organic compound having a hole-transport property and further preferably has any of a carbazole skeleton, a dibenzofuran skeleton, a dibenzothiophene skeleton, and an anthracene skeleton. In particular, an aromatic amine having a substituent that includes a dibenzofuran ring or a dibenzothiophene ring or an aromatic monoamine that includes a naphthalene ring is preferred, or an aromatic monoamine in which a 9-fluorenyl group is bonded to nitrogen of the amine through an arylene group may be used. Note that the second substance is preferably a substance having an N,N-bis(4-biphenyl)amino group to fabricate a light-emitting device with a favorable lifetime. Specific examples of the second organic compound include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d] furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris (1,1'-biphenyl-4-yl)amine (abbreviation: YGTBi1BP-02), 4-diphenyl-4'-(2-naphthyl)-4"-{9-(4-biphenylyl)carbazole)}triphenylamine (abbreviation: YGTBiβNB), N-[4-(9-phenyl-9H-carbazol-3-yl)phenyl]-N-[4-(1-naphthyl)phenyl]-9,9'-spirobi(9H-fluoren)-2-amine (abbreviation: PCBNBSF), N,N-bis(4-biphenylyl)-9,9'-spirobi[9H-fluoren]-2-amine (abbreviation: BBASF), N,N-bis(1,1'-biphenyl-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi(9H-fluoren)-4-amine (abbreviation: oFBiSF), N-(4-biphenyl)-N-(dibenzofuran-4-yl)-9,9-dimethyl-9H-fluoren-2-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9- phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), N-phenyl-N-[4-(9-phenyl-9H-carbazol-3-yl)phenyl]spiro-9,9'-bifluoren-2-amine (abbreviation: PCBASF), and N-(1,1'-biphenyl-4-yl)-9,9-dimethyl-N-[4-(9-phenyl-9H-carbazol-3-yl)phenyl]-9H-fluoren-2-amine (abbreviation: PCBBiF).

Note that the hole mobility of the second substance in the case where the square root of the electric field strength [V/cm] is 600 is preferably lower than or equal to $1\times10^{-3}$ cm$^2$/Vs.

The composition of the second substance to the first substance in the hole-injection layer 111 is preferably 1:0.01 to 1:0.15 (weight ratio), further preferably 1:0.01 to 1:0.1 (weight ratio).

The hole-transport layer 112 preferably includes the first hole-transport layer 112-1 and the second hole-transport layer 112-2. The first hole-transport layer 112-1 is closer to the anode 101 side than the second hole-transport layer 112-2 is. Note that the second hole-transport layer 112-2 also functions as an electron-blocking layer in some cases.

The first hole-transport layer 112-1 contains a third substance, and the second hole-transport layer 112-2 contains a fourth substance.

The third substance and the fourth substance are preferably organic compounds having a hole-transport property. As the third substance and the fourth substance, the substances given above as the organic compound that can be used as the second substance can be similarly used.

It is preferable that materials of the second substance and the third substance be selected so that the HOMO level of the third substance is deeper than the HOMO level of the second substance and a difference between the HOMO levels is lower than or equal to 0.2 eV.

In addition, the HOMO level of the fourth substance is preferably deeper than the HOMO level of the third substance. Furthermore, it is preferable that materials be selected so that a difference between the HOMO levels is lower than or equal to 0.2 eV. Owing to such a relation between the HOMO levels of the second substance to the fourth substance, holes are injected into each layer smoothly, which prevents an increase in driving voltage and deficiency of holes in the light-emitting layer.

The second substance to the fourth substance each preferably have a hole-transport skeleton. A carbazole skeleton, a dibenzofuran skeleton, a dibenzothiophene skeleton, and an anthracene skeleton, with which the HOMO levels of the organic compounds do not become too shallow, are preferably used as the hole-transport skeleton. Materials of adjacent layers (e.g., the second substance and the third substance or the third substance and the fourth substance) preferably have the same hole-transport skeleton, in which case holes can be injected smoothly. In particular, a dibenzofuran skeleton is preferably used as the hole-transport skeleton.

Furthermore, materials contained in adjacent layers (e.g., the second substance and the third substance or the third substance and the fourth substance) are preferably the same, in which case holes can be injected more smoothly. In particular, the second substance and the third substance are preferably the same material.

The light-emitting layer 113 contains a fifth substance and a sixth substance. The fifth substance is an emission center substance, and the sixth substance is a host material in which the fifth substance is dispersed. Note that the light-emitting layer 113 may contain another material in addition to the fifth substance and the sixth substance. Furthermore, the light-emitting layer 113 may be a stack of two layers with different compositions.

As the emission center material, fluorescent substances, phosphorescent substances, substances exhibiting thermally activated delayed fluorescence (TADF), or other light-emitting materials may be used. Furthermore, the light-emitting layer 113 may be a single layer or formed of a plurality of layers. Note that one embodiment of the present invention is more suitably used in the case where the light-emitting layer 113 is a layer that exhibits fluorescence, specifically, a layer that exhibits blue fluorescence.

Examples of a material that can be used as a fluorescent substance in the light-emitting layer 113 are as follows. Fluorescent substances other than those given below can also be used.

Examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1, 6mMemFLPAPm), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis[N,N',N'-triphenyl-1,4-phenylenediamine](abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylene diamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone, (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11- diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis {2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N'-diphenyl-N,N'-(1,6-pyrene-diyl)bis[(6-phenylbenzo[b]naphtho[1,2-d]furan)-8-amine] (abbreviation: 1,6BnfAPm-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b']bisbenzofuran (abbreviation: 3,10FrA2Nbf(IV)-02). Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, and high reliability.

Examples of the material that can be used when a phosphorescent substance is used as the emission center material in the light-emitting layer 113 are as follows.

Examples include an organometallic iridium complex having a 4H-triazole skeleton, such as tris {2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), and tris[4-(3-biphenyl)-5-isopropyl-3-phenyl-4H-1,2,4-triazolato]iridium(III) (abbreviation: [Ir(iPrptz-3b)$_3$]); an organometallic iridium complex having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptzl-Me)$_3$]); an organometallic iridium complex having an imidazole skeleton, such as fac-tris[(1-2,6-diisopropylphenyl)-2-phenyl-1H-imidazole]iridium(III) (abbreviation: [Ir(iPrpmi)$_3$]) and tris[3-(2,6-dimethylphenyl)-7-methylimidazo[1,2-f]phenanthridine]iridium(III) (abbreviation: [Ir(dmpimpt-Me)$_3$]); and an organometallic iridium complex in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: [Ir(CF$_3$ppy)$_2$(pic)]), and bis[2-(4',6'-difluorophenyl)pyridinato-N,C$^{2'}$]iridium(III) acetylacetonate (abbreviation: FIracac). These compounds emit blue phosphorescence having an emission peak at 440 nm to 520 nm.

Other examples include an organometallic iridium complex having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbomyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), and (acetylacetonato)bis(4,6-diphenylpyrimidinato)iridium(III) (abbreviation: [Ir(dppm)$_2$(acac)]); an organometallic iridium complex having a pyrazine skeleton, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); an organometallic iridium complex having a pyridine skeleton, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$]), and bis(2-phenylquinolinato-N,C$^{2'}$)iridium(III) acetylacetonate (abbreviation: [Ir(pq)$_2$(acac)]); and a rare earth metal complex such as tris(acetylacetonato)(monophenanthroline)terbium(III) (abbreviation: [Tb(acac)$_3$(Phen)]). These compounds mainly emit green phosphorescence having an emission peak at 500 nm to 600 nm. Note that an organometallic iridium complex having a pyrimidine skeleton has distinctively high reliability and emission efficiency and thus is especially preferable.

Other examples include an organometallic iridium complex having a pyrimidine skeleton, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanate)iridium(III) (abbreviation: [Ir(5mdppm)$_2$(dpm)]), and bis[4,6-di(naphthalen-1-yl)pyrimidinato](dipivaloylmethanate)iridium(III) (abbreviation: [Ir(d1npm)$_2$(dpm)]); an organometallic iridium complex having a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanate)iridium(III) (abbreviation: [Ir(tppr)$_2$(dpm)]), and (acetylacetonato)bis[2,3-bis(4-fluorophenyl)quinoxalinato]iridium(III) (abbreviation: [Ir(Fdpq)$_2$(acac)]); an organometallic iridium complex having a pyridine skeleton, such as tris(1-phenylisoquinolinato-N,C$^{2'}$)iridium(III) (abbreviation: [Ir(piq)$_3$]) and bis(1-phenylisoquinolinato-N,C$^{2'}$)iridium(III) acetylacetonate (abbreviation: [Ir(piq)$_2$(acac)]); a platinum complex such as 2,3,7,8,12,13,17,18-octaethyl-21H,23H-porphyrin platinum (II) (abbreviation: PtOEP); and a rare earth metal complex such as tris(1,3-diphenyl-1,3-propanedionato)(monophenanthroline)europium(III) (abbreviation: [Eu(DBM)$_3$(Phen)]) and tris[1-(2-thenoyl)-3,3,3-trifluoroacetonato](monophenanthroline)europium(III) (abbreviation: [Eu(TTA)$_3$(Phen)]). These compounds emit red phosphorescence having an emission peak at 600 nm to 700 nm. Furthermore, an organometallic iridium complex having a pyrazine skeleton can emit red light with favorable chromaticity.

Besides the above phosphorescent compounds, known phosphorescent materials may be selected and used.

Examples of the TADF material include a fullerene, a derivative thereof, an acridine, a derivative thereof, and an eosin derivative. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (SnF$_2$(Proto IX)), a mesoporphyrin-tin fluoride complex (SnF₂(Meso IX)), a hematoporphyrin-tin fluoride complex (SnF₂(Hemato IX)), a coproporphyrin tetramethyl ester-tin fluoride complex (SnF₂(Copro III-4Me)), an octaethylporphyrin-tin fluoride complex (SnF₂(OEP)), an etioporphyrin-tin fluoride complex (SnF₂(Etio I)), and an octaethylporphyrin-platinum chloride complex (PtCl₂OEP), which are represented by the following structural formulae.

[Chemical Formula 1]

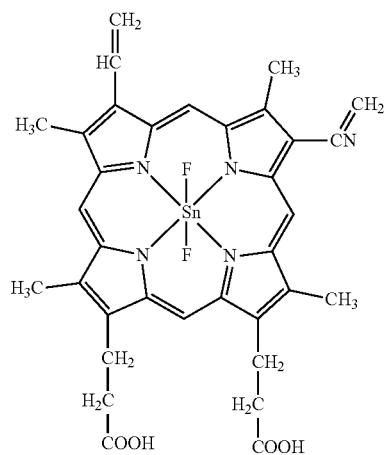

SnF₂(Proto IX)

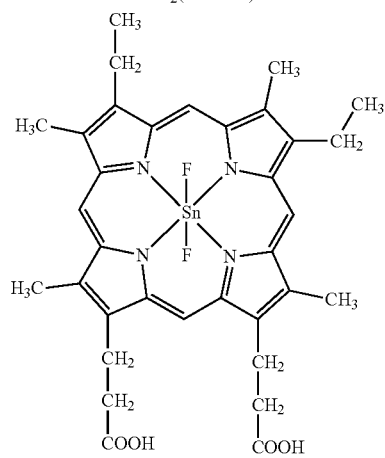

SnF₂(Meso IX)

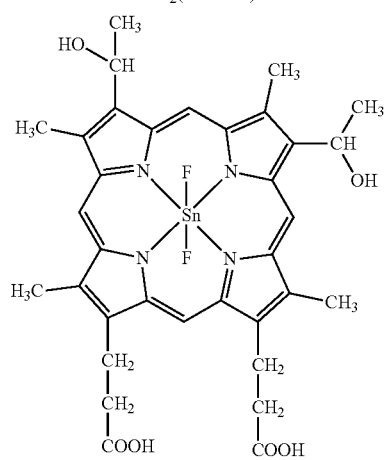

SnF₂(Hemato IX)

-continued

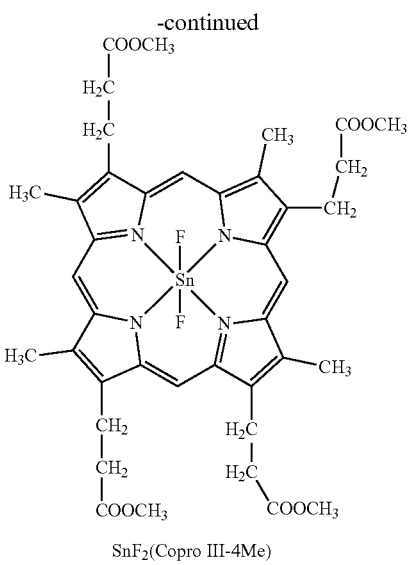

SnF₂(Copro III-4Me)

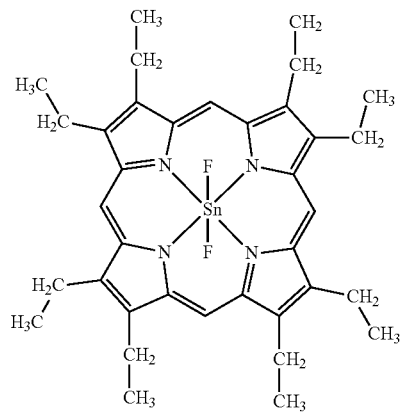

SnF₂(OEP)

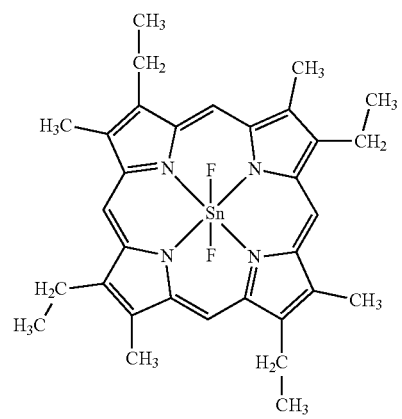

SnF₂(Etio I)

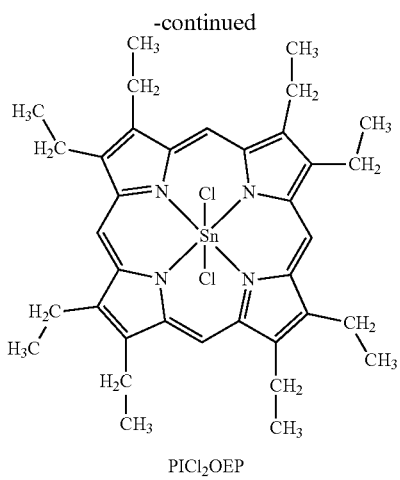

PICl₂OEP

Alternatively, a heterocyclic compound having one or both of a π-electron rich heteroaromatic ring and a π-electron deficient heteroaromatic ring which is represented by the following structural formulae, such as 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 9-[4-(4,6-diphenyl-1,3,5-triazin-2-yl)phenyl]-9'-phenyl-9H, 9'H-3,3'-bicarbazol (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) can be used. The heterocyclic compound is preferable because of having both a high electron-transport property and a high hole-transport property owing to a π-electron rich heteroaromatic ring and a π-electron deficient heteroaromatic ring. Among skeletons having a π-electron deficient heteroaromatic ring, a pyridine skeleton, a diazine skeleton (a pyrimidine skeleton, a pyrazine skeleton, or a pyridazine skeleton), and a triazine skeleton are particularly preferable because of their high stability and reliability. In particular, a benzofuropyrimidine skeleton, a benzothienopyrimidine skeleton, a benzofuropyrazine skeleton, and a benzothienopyrazine skeleton are preferable because of their high acceptor properties and reliability. Among skeletons having a π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. Note that a dibenzofuran skeleton and a dibenzothiophene skeleton are preferable as the furan skeleton and the thiophene skeleton, respectively. As the pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable. Note that a substance in which a π-electron rich heteroaromatic ring and a π-electron deficient heteroaromatic ring are directly bonded to each other is particularly preferable because the electron-donating property of the π-electron rich heteroaromatic ring and the electron-accepting property of the π-electron deficient heteroaromatic ring are both increased and the energy difference between the S1 level and the T1 level becomes small, and thus thermally activated delayed fluorescence can be obtained efficiently. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a boron-containing skeleton such as phenylborane or boranthrene, an aromatic ring or a heteroaromatic ring having a nitrile group or a cyano group, such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical Formula 2]

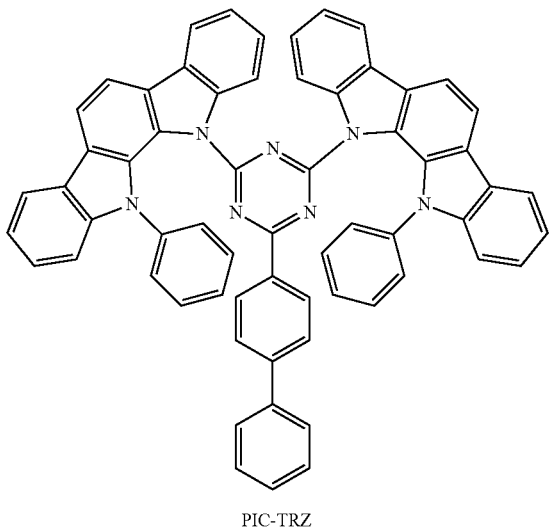

PIC-TRZ

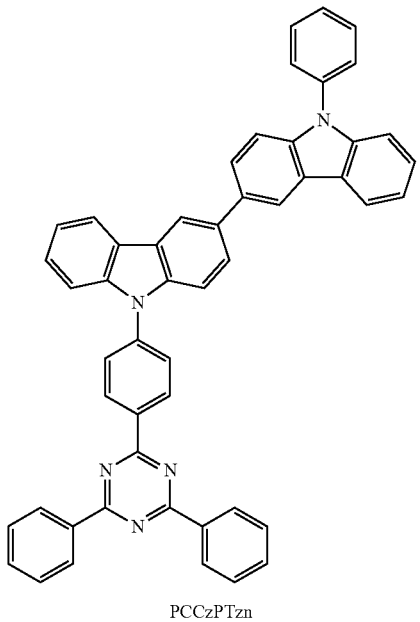

PCCzPTzn

-continued

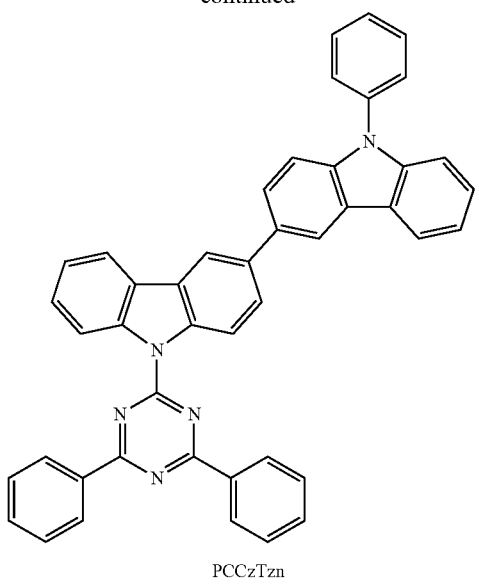

PCCzTzn

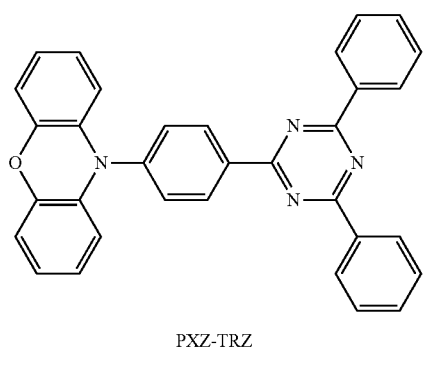

PXZ-TRZ

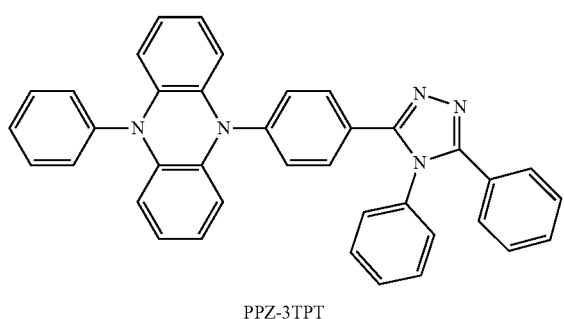

PPZ-3TPT

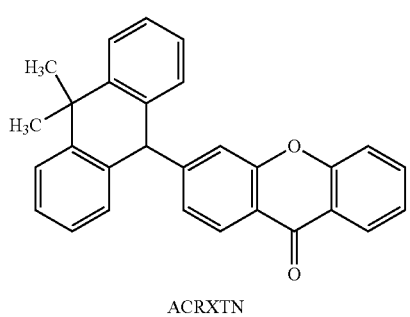

ACRXTN

-continued

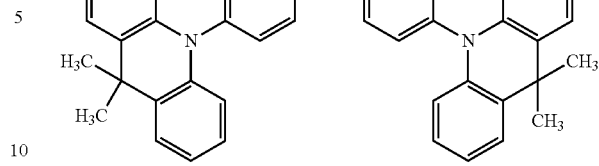

DMAC-DPS

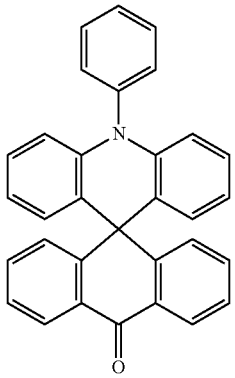

ACRSA

Note that the TADF material is a material that has a small difference between the S1 level and the T1 level and has a function of converting triplet excitation energy into singlet excitation energy by reverse intersystem crossing. Thus, it is possible to upconvert triplet excitation energy into singlet excitation energy (reverse intersystem crossing) using a little thermal energy and to efficiently generate a singlet excited state. In addition, the triplet excitation energy can be converted into light emission.

An exciplex whose excited state is formed by two kinds of substances has an extremely small difference between the S1 level and the T1 level and has a function of a TADF material that can convert triplet excitation energy into singlet excitation energy.

Note that a phosphorescent spectrum observed at low temperatures (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 and the T1 is preferably less than or equal to 0.3 eV, further preferably less than or equal to 0.2 eV.

When the TADF material is used as an emission center material, the S1 level of the host material is preferably higher than the S1 level of the TADF material. In addition, the T1 level of the host material is preferably higher than the T1 level of the TADF material.

As the host material in the light-emitting layer, various carrier-transport materials such as a material having an electron-transport property, a material having a hole-transport property, and the TADF material can be used.

The material having a hole-transport property is preferably an organic compound having an amine skeleton or a π-electron rich heteroaromatic ring skeleton. Examples include a compound having an aromatic amine skeleton, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]spiro-9,9'-bifluoren-2-amine (abbreviation: PCBASF); a compound having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); a compound having a thiophene skeleton, such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and a compound having a furan skeleton, such as 4,4',4''-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above, the compound having an aromatic amine skeleton and the compound having a carbazole skeleton are preferable because these compounds are highly reliable and have high hole-transport properties to contribute to a reduction in driving voltage. Furthermore, the hole-transport materials given above as examples of the second substance can also be used.

As the material having an electron-transport property, for example, a metal complex such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); or an organic compound having a π-electron deficient heteroaromatic ring skeleton is preferable. Examples of the organic compound having a π-electron deficient heteroaromatic ring skeleton include a heterocyclic compound having a polyazole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); a heterocyclic compound having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), and 4,6-bis[3-(4-dibenzothienyl)phenyl]pyrimidine (abbreviation: 4,6mDBTP2Pm-II); and a heterocyclic compound having a pyridine skeleton, such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB). Among the above, the heterocyclic compound having a diazine skeleton and the heterocyclic compound having a pyridine skeleton are preferable because of having high reliability. In particular, the heterocyclic compound having a diazine (pyrimidine or pyrazine) skeleton has a high electron-transport property and contributes to a reduction in driving voltage.

As the TADF material that can be used as the host material, the above-mentioned materials given as TADF materials can also be used. When the TADF material is used as the host material, triplet excitation energy generated in the TADF material is converted into singlet excitation energy by reverse intersystem crossing and transferred to the emission center substance, whereby the emission efficiency of the light-emitting device can be increased. At this time, the TADF material functions as an energy donor, and the emission center substance functions as an energy acceptor.

This is very effective in the case where the emission center substance is a fluorescent substance. In that case, the S1 level of the TADF material is preferably higher than the S1 level of the fluorescent substance in order to achieve high emission efficiency. Furthermore, the T1 level of the TADF material is preferably higher than the S1 level of the fluorescent substance. Therefore, the T1 level of the TADF material is preferably higher than the T1 level of the fluorescent substance.

It is also preferable to use a TADF material that emits light whose wavelength overlaps with the wavelength on a lowest-energy-side absorption band of the fluorescent substance. This enables smooth transfer of excitation energy from the TADF material to the fluorescent substance and accordingly enables efficient light emission, which is preferable.

In order that singlet excitation energy is efficiently generated from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protective group around a luminophore (a skeleton that causes light emission) of the fluorescent substance. As the protective group, a substituent having no π bond and saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituent having no π bond has a poor carrier-transport property; thus, the TADF material and the luminophore of the fluorescent substance can be made away from each other with little influence on carrier transportation or carrier recombination. Here, the luminophore refers to an atomic group (a skeleton) that causes light emission in a fluorescent substance. The luminophore is preferably a skeleton having a π bond, further preferably includes an aromatic ring, and still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferable because of its high fluorescence quantum yield.

In the case where a fluorescent substance is used as the emission center substance, a material having an anthracene skeleton is suitably used as the host material. When a substance having an anthracene skeleton such as 9-(1-naphthyl)-10-[4-(2-naphthyl)phenyl]anthracene (abbreviation: αN-βNPAnth) is used as the host material for the fluorescent substance, a light-emitting layer with high emission efficiency and favorable durability can be achieved. Among the substances having an anthracene skeleton, a substance having a diphenylanthracene skeleton, in particular, a substance having a 9,10-diphenylanthracene skeleton, is chemically stable and thus is preferably used as the host material. The host material preferably has a carbazole skeleton to improve the hole-injection and hole-transport properties; further preferably, the host material has a benzocarbazole skeleton where a benzene ring is further condensed to the carbazole, in which case the HOMO level thereof is shallower than that of carbazole by approximately 0.1 eV and thus holes enter the host material easily. In particular, the host material preferably has a dibenzocarbazole skeleton because the HOMO level thereof is shallower than that of carbazole by approximately 0.1 eV so that holes enter the host material easily, the hole-transport property is improved, and the heat resistance is increased. Accordingly, a substance that has both a 9,10-diphenylanthracene skeleton and a carbazole skeleton (or a benzocarbazole skeleton or a dibenzocarbazole skeleton) is further preferable as the host material. Note that in terms of the hole-injection and hole-transport properties described above, instead of a carbazole skeleton, a benzofluorene skeleton or a dibenzo fluorene skeleton may be used. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), and 9-phenyl-10-{4-(9-phenyl-9H-fluoren-9-yl)biphenyl-4'-yl}anthracene (abbreviation: FLPPA). In particular, CzPA, cgDBCzPA, 2mBnfPPA, and PCzPA are preferably selected because they exhibit excellent characteristics.

Note that the host material may be a mixture of a plurality of kinds of substances; in the case of using a mixed host material, it is preferable to mix a material having an electron-transport property with a material having a hole-transport property. By mixing the material having an electron-transport property with the material having a hole-transport property, the transport property of the light-emitting layer 113 can be easily adjusted and a recombination region can be easily controlled. The weight ratio of the content of the material having a hole-transport property to the content of the material having an electron-transport property may be 1:19 to 19:1.

Note that a phosphorescent substance can be used as part of the mixed material. When a fluorescent substance is used as the emission center material, a phosphorescent substance can be used as an energy donor for supplying excitation energy to the fluorescent substance.

An exciplex may be formed of these mixed materials. These mixed materials are preferably selected so as to form an exciplex that exhibits light emission whose wavelength overlaps with the wavelength on a lowest-energy-side absorption band of the light-emitting material, in which case energy can be transferred smoothly and light emission can be obtained efficiently. The use of such a structure is preferable because the driving voltage can also be reduced.

Note that at least one of the materials forming an exciplex may be a phosphorescent substance. In this case, triplet excitation energy can be efficiently converted into singlet excitation energy by reverse intersystem crossing.

In terms of the combination of materials forming an exciplex efficiently, the HOMO level of the material having a hole-transport property is preferably higher than or equal to the HOMO level of the material having an electron-transport property. In addition, the LUMO level of the material having a hole-transport property is preferably higher than or equal to the LUMO level of the material having an electron-transport property. Note that the LUMO levels and the HOMO levels of the materials can be derived from the electrochemical characteristics (the reduction potentials and the oxidation potentials) of the materials that are measured by cyclic voltammetry (CV) measurement.

Note that the formation of an exciplex can be confirmed by a phenomenon in which the emission spectrum of the mixed film in which the material having a hole-transport property and the material having an electron-transport property are mixed is shifted to the longer wavelength side than the emission spectrum of each of the materials (or has another peak on the longer wavelength side), observed by comparison of the emission spectra of the material having a hole-transport property, the material having an electron-transport property, and the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of transient PL of the material having a hole-transport property, the material having an electron-transport property, and the mixed film of these materials. The transient PL can be rephrased as transient electroluminescence (EL). That is, the formation of an exciplex can also be confirmed by a difference in transient response observed by comparison of the transient EL of the material having a hole-transport property, the material having an electron-transport property, and the mixed film of these materials.

It is preferable that the electron-transport layer 114 be provided in contact with the light-emitting layer 113 as illustrated in FIG. 1A1 and contain a seventh substance and an eighth substance. The seventh substance is an organic compound in which the electron-transport property is more dominant than the hole-transport property. The electron mobility of the electron-transport layer 114 when the square root of the electric field strength [V/cm] is 600 is preferably higher than or equal to $1\times10^{-7}$ cm$^2$/Vs and lower than or equal to $5\times10^{-5}$ cm$^2$/Vs. Lowering the electron-transport property of the electron-transport layer 114 enables control of the amount of electrons injected into the light-emitting layer and can prevent the light-emitting layer from having excess electrons.

The seventh substance is preferably an organic compound having an anthracene skeleton and is further preferably an organic compound having both an anthracene skeleton and a heterocyclic skeleton. The heterocyclic skeleton is preferably a nitrogen-containing five-membered ring skeleton or a nitrogen-containing six-membered ring skeleton, and particularly preferably a nitrogen-containing five-membered ring skeleton or a nitrogen-containing six-membered ring skeleton including two heteroatoms in the ring, such as a pyrazole ring, an imidazole ring, an oxazole ring, a thiazole ring, a pyrazine ring, a pyrimidine ring, or a pyridazine ring.

The eighth substance is an alkali metal, an alkali metal, a compound of an alkali metal or an alkali metal, or a complex thereof and preferably has a 8-hydroxyquinolinato structure. Specific examples include 8-hydroxyquinolinato-lithium (abbreviation: Liq) and 8-hydroxyquinolinato-sodium (abbreviation: Naq). In particular, a complex of a monovalent metal ion, especially a complex of lithium is preferable, and Liq is further preferable. Note that in the case where the 8-hydroxyquinolinato structure is included, the methyl-substituted product (e.g., a 2-methyl-substituted product or a 5-methyl-substituted product) can also be used, for example.

The concentration of the eighth substance preferably differs in the thickness direction of the electron-transport layer 114 (including the case where the concentration of the eighth substance is 0). Accordingly, the light-emitting device of one embodiment of the present invention can have favorable lifetime and reliability.

There can be many embodiment of the structure in which the concentration of the eighth substance differs in the thickness direction of the electron-transport layer 114. Examples include an embodiment in which the concentration of the eighth substance has a concentration gradient in which the concentration decreases from the light-emission layer side to the cathode side in the electron-transport layer 114 (including the case where the concentration is 0); an embodiment in which the electron-transport layer 114 includes, as in FIG. 1A2, a plurality of layers such as the first electron-transport layer 114-1 and the second electron-transport layer 114-2 in this order from the light-emitting layer 113 side, and the concentration of the eighth substance in the layer closer to the light-emitting layer side of the plurality of layers is higher than that in the layer closer to the cathode side; an embodiment in which the electron-transport layer 114 includes a first electron-transport layer positioned on the light-emitting layer side and a second electron-transport layer positioned on the cathode side, and the concentration of the eighth substance in the first electron-transport layer is higher than the concentration of the eighth substance in the second electron-transport layer. As another embodiment, the electron-transport layer 114 may include a plurality of layers, and a layer having a higher concentration of the eighth substance than a layer closest to the cathode side of the plurality of layers may be any one of the rest of the plurality of layers. It can also be said that the electron-transport layer 114 includes a first region positioned on the light-emitting layer side and a second region positioned on the cathode side, and the concentration of the eighth substance differs between the first region and the second region. There are an embodiment in which the first region has a higher concentration of the eighth substance and an embodiment in which the second region has a higher concentration of the eighth substance; the embodiment in which the first region has a higher concentration of the eighth substance is preferable to obtain a light-emitting device with favorable lifetime easily. Note that the electron-transport layer 114 may include a region other than the first region and the second region.

When there is no clear boundary between the layers as in FIG. 1A1, the concentration of the eighth substance may continuously change as in FIG. 2A1 and FIG. 2A2; when there is a boundary between the layers as in FIG. 1A2, the concentration of the eighth substance may change stepwise as in FIG. 2B1 and FIG. 2B2.

The seventh substance preferably has an electron-transport property and a HOMO level of higher than or equal to −6.0 eV.

As another organic compound having an electron-transport property that can be used as the seventh substance, the above-mentioned organic compounds having an electron-transport property that can be used as the host material or the above-mentioned organic compounds that can be used as the host material for the fluorescent substance can be used.

A region where the concentration of the eighth substance is 0 is included as a region having a low concentration of the eighth substance.

The region having a high concentration of the eighth substance and the region having a low concentration of the eighth substance can be formed by changing the mixing ratio of the seventh substance and the eighth substance; the seventh substance and the eighth substance may differ between the region having a high concentration of the eighth substance and the region having a low concentration of the eighth substance.

The electron mobility of the seventh substance when the square root of the electric field strength [V/cm] is 600 is preferably lower than that of the sixth substance or the light-emitting layer 113.

Figure 3B:
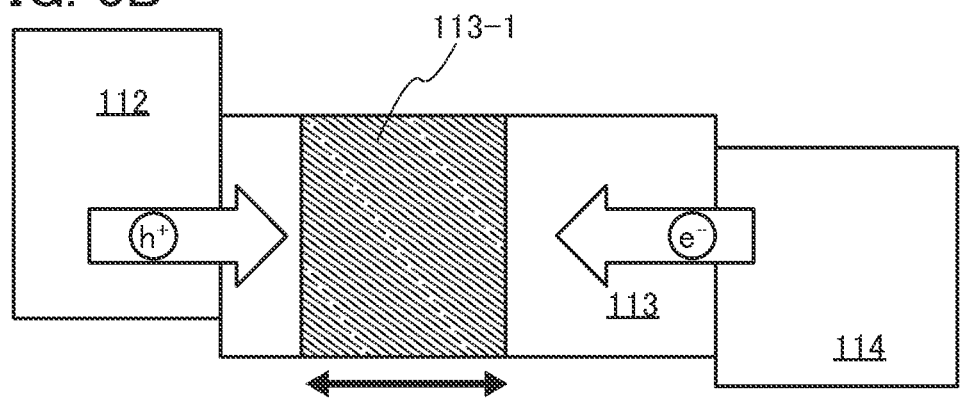

When the light-emitting layer has excess electrons, a light-emitting region 113-1 is limited to a part as illustrated in FIG. 3A and a great strain is imposed on that part, which accelerates degradation. In addition, electrons failing to recombine and passing through the light-emitting layer also diminish a lifetime and emission efficiency. In one embodiment of the present invention, a reduction in the electron-transport property of the electron-transport layer 114 expands the light-emitting region 113-1 as in FIG. 3B and spreads the strain on the material included in the light-emitting layer 113; thus, a light-emitting device with a long lifetime and high emission efficiency can be provided.

The luminance decay curve of a light-emitting device having such a structure, which is obtained by a driving test at a constant current density, sometimes shows a shape having a local maximum value. In other words, the decay curve of the light-emitting device of one embodiment of the present invention sometimes has a portion where the luminance increases with time. The light-emitting device showing such a degradation behavior enables a rapid decay at the initial driving stage, which is called an initial decay, to be canceled out by the luminance increase. Thus, the light-emitting device can have an extremely favorable driving lifetime with a smaller initial decay. Such a light-emitting device is referred to as a recombination-site tailoring injection element (ReSTI element).

A differential value of such a decay curve having the local maximum value is 0 in a part. Thus, the light-emitting device of one embodiment of the present invention with a decay curve having a differential value of 0 in a part can have an extremely favorable lifetime with a smaller initial decay.

The light-emitting device of one embodiment of the present invention having the above-described structure can have an extremely favorable lifetime. In particular, a lifetime in a region with an extremely small decay, i.e., approximately LT95, can be significantly extended.

When the initial decay can be reduced, the problem of burn-in, which has still been mentioned as a great drawback of organic EL devices, and the time and effort for aging for reducing the problem before shipment can be significantly reduced.

As described above, since the hole-injection layer of one embodiment of the light-emitting device of the present invention contains, for example, a hole-transport material with a deep HOMO level, the hole carrier generation rate is low and the resistivity is relatively high (specifically, higher than or equal to $1 \times 10^4$ [Ω·cm]). Accordingly, crosstalk can be suppressed. Since sufficient hole carriers for hole injection into the light-emitting device are needed, the resistivity has the upper limit (specifically, lower than or equal to $1 \times 10^7$ [Ω·cm]); therefore, the range of the resistivity of the hole-injection layer is higher than or equal to $1 \times 10^4$ [Ω·cm] and lower than or equal to $1 \times 10^7$ [Ω·cm].

Moreover, the hole-injection layer of one embodiment of the light-emitting device of the present invention contains, for example, a hole-transport material with a deep HOMO level in order to obtain the crosstalk suppression effect. Thus, the induced holes are easily injected into the hole-transport layer and the light-emitting layer. Accordingly, only a part of holes easily pass through the light-emitting layer to reach the electron-transport layer at the initial driving stage. Here, in the light-emitting device of one embodiment of the present invention, the electron-transport layer contains an electron-transport material and an alkali metal, an alkaline earth metal, a compound of an alkali metal or an alkaline earth metal, or a complex thereof (or includes an electron-transport material and a metal complex containing a ligand having a 8-hydroxyquinolinato structure and a monovalent metal ion); thus, when the light-emitting device continuously emits light, the phenomenon in which the electron-injection and electron-transport properties of the electron-transport layer are improved is observed. By contrast, since the induction of holes in the hole-injection layer is inhibited in such a degree that crosstalk is suppressed as described above, a large number of holes cannot be supplied to the electron-transport layer. As a result, the number of holes that can reach the electron-transport layer decreases over time, thereby increasing the probability of recombination of holes and electrons in the light-emitting layer. That is, the carrier balance shifts such that recombination occurs in the light-emitting layer more easily, while the light-emitting device continuously emits light. This shift leads to a light-emitting device in which initial decay is decreased.

Embodiment 2

Next, examples of specific structures and materials of the aforementioned light-emitting device are described. In this embodiment, a structure in which the EL layer 103 including a plurality of layers is positioned between a pair of electrodes, i.e., the anode 101 and the cathode 102, and at least the hole-injection layer 111, the first hole-transport layer 112-1, the second hole-transport layer 112-2, the light-emitting layer 113, and the electron-transport layer 114 are included in this order from the anode 101 side in the EL layer 103, is described. As the layers in the EL layer 103, various layers such as a hole-injection layer, a hole-transport layer, an electron-injection layer, a carrier-blocking layer, an exciton-blocking layer, and a charge-generation layer can be used.

The anode 101 is preferably formed using a metal, an alloy, or a conductive compound with a high work function (specifically, higher than or equal to 4.0 eV), a mixture thereof, or the like. Specific examples include indium oxide-tin oxide (ITO: Indium Tin Oxide), indium oxide-tin oxide containing silicon or silicon oxide, indium oxide-zinc oxide, and indium oxide containing tungsten oxide and zinc oxide (IWZO). Such conductive metal oxide films are usually deposited by a sputtering method but may be formed by application of a sol-gel method or the like. In an example of the formation method, indium oxide-zinc oxide is formed by a sputtering method using a target obtained by adding 1 to 20 wt % of zinc oxide to indium oxide. Furthermore, indium oxide containing tungsten oxide and zinc oxide (IWZO) can be formed by a sputtering method using a target in which tungsten oxide and zinc oxide are added to indium oxide at 0.5 to 5 wt % and 0.1 to 1 wt %, respectively. Alternatively, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), or the like can be used. Graphene can also be used. Note that although the typical substances that have a high work function and are used as a material for forming the anode are listed above, a composite material of an organic compound having a hole-transport property and a substance exhibiting an electron-accepting property with respect to the organic compound is used for the hole-injection layer 111 of one embodiment of the present invention; thus, an electrode material can be selected regardless of its work function.

Two kinds of stacked layer structure of the EL layer 103 are described: structures illustrated in FIG. 1A1 and FIG. 1A2, each of which includes the electron-injection layer 115 in addition to the hole-injection layer 111, the hole-transport layer 112 (the first hole-transport layer 112-1 and the second hole-transport layer 112-2), the light-emitting layer 113, and the electron-transport layer 114 (the first electron-transport layer 114-1 and the second electron-transport layer 114-2); and a structure illustrated in FIG. 1B, which includes a charge-generation layer 116 instead of the electron-injection layer 115. Materials for forming each layer are specifically described below.

Since the hole-injection layer 111, the hole-transport layer 112 (the hole-transport layer 112-1 and the hole-transport layer 112-2), the light-emitting layer 113, and the electron-transport layer 114 (the electron-transport layer 114-1 and the electron-transport layer 114-2) are described in detail in Embodiment 1, the description thereof is not repeated. Refer to the description in Embodiment 1.

A layer containing an alkali metal, an alkaline earth metal, or a compound of an alkali metal or an alkaline earth metal such as lithium fluoride (LiF), cesium fluoride (CsF), or calcium fluoride ($CaF_2$) may be provided as the electron-injection layer 115 between the electron-transport layer 114 and the cathode 102. An electride or a layer that is formed using a substance having an electron-transport property and that contains an alkali metal, an alkaline earth metal, or a compound of an alkali metal or an alkaline earth metal may be used as the electron-injection layer 115. Examples of the electride include a substance in which electrons are added at high concentration to calcium oxide-aluminum oxide.

Instead of the electron-injection layer 115, the charge-generation layer 116 may be provided between the electron-transport layer 114 and the cathode 102 (FIG. 1B). The charge-generation layer 116 refers to a layer capable of injecting holes into a layer in contact with the cathode side of the charge-generation layer 116 and electrons into a layer in contact with the anode side thereof when a potential is applied. The charge-generation layer 116 includes at least a p-type layer 117. The p-type layer 117 is preferably formed using any of the composite materials given above as examples of the material that can be used for the hole-injection layer 111. The p-type layer 117 may be formed by stacking a film containing the above-described electron-accepting material as a material included in the composite material and a film containing a hole-transport material. When a potential is applied to the p-type layer 117, electrons are injected into the electron-transport layer 114 and holes are injected into the cathode 102; thus, the light-emitting device operates.

Note that the charge-generation layer 116 preferably includes an electron-relay layer 118 and/or an electron-injection buffer layer 119 in addition to the p-type layer 117.

The electron-relay layer 118 contains at least the substance having an electron-transport property and has a function of preventing an interaction between the electron-injection buffer layer 119 and the p-type layer 117 and smoothly transferring electrons. The LUMO level of the substance having an electron-transport property contained in the electron-relay layer 118 is preferably between the LUMO level of the electron-accepting substance in the p-type layer 117 and the LUMO level of a substance contained in a layer of the electron-transport layer 114 that is in contact with the charge-generation layer 116. Specifically, the energy level of the LUMO level of the substance having an electron-transport property used for the electron-relay layer 118 is preferably higher than or equal to −5.0 eV, further preferably higher than or equal to −5.0 eV and lower than or equal to −3.0 eV. Note that as the substance having an electron-transport property in the electron-relay layer 118, a phthalocyanine-based material or a metal complex having a metal-oxygen bond and an aromatic ligand is preferably used.

A substance having an excellent electron-injection property can be used for the electron-injection buffer layer 119. For example, an alkali metal, an alkaline earth metal, a rare earth metal, or a compound thereof (an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)) can be used.

In the case where the electron-injection buffer layer 119 contains the substance having an electron-transport property and a substance having an electron-donating property, an organic compound such as tetrathianaphthacene (abbreviation: TTN), nickelocene, or decamethylnickelocene, as well as an alkali metal, an alkaline earth metal, a rare earth metal, or a compound thereof (an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)), can be used as the substance having an electron-donating property. As the substance having an electron-transport property, a material similar to the above-described material for the electron-transport layer 114 can be used.

As a substance for forming the cathode 102, a metal, an alloy, or an electrically conductive compound with a low work function (specifically, lower than or equal to 3.8 eV), a mixture thereof, or the like can be used. Specific examples of such a cathode material include elements belonging to Group 1 or Group 2 of the periodic table, such as alkali metals, e.g., lithium (Li) and cesium (Cs), magnesium (Mg), calcium (Ca), and strontium (Sr), alloys containing these elements (e.g., MgAg, AlLi), rare earth metals such as europium (Eu) and ytterbium (Yb), and alloys containing these rare earth metals. However, when the electron-injection layer is provided between the cathode 102 and the electron-transport layer, a variety of conductive materials such as Al, Ag, ITO, or indium oxide-tin oxide containing silicon or silicon oxide can be used for the cathode 102 regardless of the work function. These conductive materials can be deposited by a dry process such as a vacuum evaporation method or a sputtering method, an inkjet method, a spin coating method, or the like. Alternatively, a wet process using a sol-gel method or a wet process using a paste of a metal material may be employed.

Furthermore, any of a variety of methods can be used as a method for forming the EL layer 103, regardless of whether it is a dry process or a wet process. For example, a vacuum evaporation method, a gravure printing method, an offset printing method, a screen printing method, an inkjet method, or a spin coating method may be used.

Different methods may be used to form the electrodes or the layers described above.

The structure of the layers provided between the anode 101 and the cathode 102 is not limited to the above-described structure. Preferably, a light-emitting region where holes and electrons recombine is positioned away from the anode 101 and the cathode 102 so as to prevent quenching due to the proximity of the light-emitting region and a metal used for electrodes and carrier-injection layers.

Furthermore, in order that transfer of energy from an exciton generated in the light-emitting layer can be suppressed, the hole-transport layer and the electron-transport layer that are in contact with the light-emitting layer 113, particularly a carrier-transport layer closer to the recombination region in the light-emitting layer 113, are preferably formed using a substance having a wider band gap than the light-emitting material of the light-emitting layer or the light-emitting material included in the light-emitting layer.

Next, an embodiment of a light-emitting device with a structure in which a plurality of light-emitting units are stacked (this type of light-emitting device is also referred to as a stacked element or a tandem element) is described with reference to FIG. 1C. This light-emitting device includes a plurality of light-emitting units between an anode and a cathode. One light-emitting unit has substantially the same structure as the EL layer 103 illustrated in FIG. 1A1 or FIG. 1A2. In other words, the light-emitting device illustrated in FIG. 1C includes a plurality of light-emitting units and the light-emitting device illustrated in FIG. 1A1, FIG. 1A2, and FIG. 1B includes a single light-emitting unit.

In FIG. 1C, a first light-emitting unit 511 and a second light-emitting unit 512 are stacked between an anode 501 and a cathode 502, and a charge-generation layer 513 is provided between the first light-emitting unit 511 and the second light-emitting unit 512. The anode 501 and the cathode 502 correspond to the anode 101 and the cathode 102, respectively, illustrated in FIG. 1A1, and the materials given in the description for FIG. 1A1 can be used. Furthermore, the first light-emitting unit 511 and the second light-emitting unit 512 may have the same structure or different structures.

The charge-generation layer 513 has a function of injecting electrons into one of the light-emitting units and injecting holes into the other of the light-emitting units when voltage is applied between the anode 501 and the cathode 502. That is, in FIG. 1C, the charge-generation layer 513 injects electrons into the first light-emitting unit 511 and holes into the second light-emitting unit 512 when voltage is applied so that the potential of the anode becomes higher than the potential of the cathode.

The charge-generation layer 513 preferably has a structure similar to that of the charge-generation layer 116 described with reference to FIG. 1B. A composite material of an organic compound and a metal oxide has an excellent carrier-injection property and an excellent carrier-transport property; thus, low-voltage driving and low-current driving can be achieved. In the case where the anode-side surface of a light-emitting unit is in contact with the charge-generation layer 513, the charge-generation layer 513 can also function as a hole-injection layer of the light-emitting unit; therefore, a hole-injection layer is not necessarily provided in the light-emitting unit.

In the case where the charge-generation layer 513 includes the electron-injection buffer layer 119, the electron-injection buffer layer 119 functions as an electron-injection layer in the light-emitting unit on the anode side; thus, an electron-injection layer is not necessarily formed in the light-emitting unit on the anode side.

The light-emitting device having two light-emitting units is described with reference to FIG. 1C; however, one embodiment of the present invention can also be applied to a light-emitting device in which three or more light-emitting units are stacked. With a plurality of light-emitting units partitioned by the charge-generation layer 513 between a pair of electrodes as in the light-emitting device of this embodiment, it is possible to provide a long-life element that can emit light with high luminance at a low current density. A light-emitting apparatus that can be driven at a low voltage and has low power consumption can also be achieved.

When the emission colors of the light-emitting units are different, light emission of a desired color can be obtained from the light-emitting device as a whole. For example, in a light-emitting device having two light-emitting units, the emission colors of the first light-emitting unit may be red and green and the emission color of the second light-emitting unit may be blue, so that the light-emitting device can emit white light as a whole. The light-emitting device in which three or more light-emitting units are stacked can be, for example, a tandem device in which a first light-emitting unit includes a first blue light-emitting layer, a second light-emitting unit includes a yellow or yellow-green light-emitting layer and a red light-emitting layer, and a third light-emitting unit includes a second blue light-emitting layer. The tandem device can provide white light emission like the above light-emitting device.

The above-described layers and electrodes such as the EL layer 103, the first light-emitting unit 511, the second light-emitting unit 512, and the charge-generation layer can be formed by a method such as an evaporation method (including a vacuum evaporation method), a droplet discharge method (also referred to as an inkjet method), a coating method, or a gravure printing method. A low molecular material, a middle molecular material (including an oligomer and a dendrimer), or a high molecular material may be included in the layers and electrodes.

Embodiment 3

In this embodiment, a light-emitting apparatus using the light-emitting device described in Embodiment 1 and Embodiment 2 is described.

In this embodiment, the light-emitting apparatus manufactured using the light-emitting device described in Embodiment 1 and Embodiment 2 is described with reference to FIG. 4. Note that FIG. 4A is a top view of the light-emitting apparatus and FIG. 4B is a cross-sectional view taken along A-B and C-D in FIG. 4A. This light-emitting apparatus includes a driver circuit portion (source line driver circuit) 601, a pixel portion 602, and a driver circuit portion (gate line driver circuit) 603, which control light emission of a light-emitting device and are illustrated with dotted lines. Furthermore, 604 denotes a sealing substrate, 605 denotes a sealant, and a portion surrounded by the sealant 605 is a space 607.

A lead wiring 608 is a wiring for transmitting signals to be input to the source line driver circuit 601 and the gate line driver circuit 603 and receiving signals such as a video signal, a clock signal, a start signal, and a reset signal from an FPC (flexible printed circuit) 609 serving as an external input terminal. Although only the FPC is illustrated here, a printed wiring board (PWB) may be attached to the FPC. The light-emitting apparatus in this specification includes, in its category, not only the light-emitting apparatus itself but also the light-emitting apparatus provided with the FPC or the PWB.

Next, a cross-sectional structure is described with reference to FIG. 4B. The driver circuit portions and the pixel portion are formed over an element substrate 610. Here, the source line driver circuit 601, which is a driver circuit portion, and one pixel in the pixel portion 602 are illustrated.

The element substrate 610 may be a substrate formed of glass, quartz, an organic resin, a metal, an alloy, a semiconductor, or the like or a plastic substrate formed of FRP (Fiber Reinforced Plastics), PVF (polyvinyl fluoride), polyester, acrylic, or the like.

The structure of transistors used in pixels and driver circuits is not particularly limited. For example, inverted staggered transistors may be used, or staggered transistors may be used. Furthermore, top-gate transistors or bottom-gate transistors may be used. A semiconductor material used for the transistors is not particularly limited, and for example, silicon, germanium, silicon carbide, gallium nitride, or the like can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case degradation of the transistor characteristics can be suppressed.

Here, an oxide semiconductor is preferably used for semiconductor devices such as the transistors provided in the pixels and driver circuits and transistors used for touch sensors described later, and the like. In particular, an oxide semiconductor having a wider band gap than silicon is preferably used. When an oxide semiconductor having a wider band gap than silicon is used, the off-state current of the transistors can be reduced.

The oxide semiconductor preferably contains at least indium (In) or zinc (Zn). Further preferably, the oxide semiconductor contains an oxide represented by an In-M-Zn-based oxide (M represents a metal such as Al, Ti, Ga, Ge, Y, Zr, Sn, La, Ce, or Hf).

An oxide semiconductor that can be used in one embodiment of the present invention is described below.

Oxide semiconductors are classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nano crystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of oxygen atom arrangement in the a-b plane direction, a change in interatomic bond distance by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is an oxide semiconductor with high crystallinity. On the other hand, a clear crystal grain boundary is difficult to observe in the CAAC-OS; thus, it can be said that a reduction in electron mobility due to the crystal grain boundary is unlikely to occur. Entry of impurities, formation of defects, or the like might decrease the crystallinity of an oxide semiconductor; thus, it can be said that the CAAC-OS is an oxide semiconductor that has small amounts of impurities and defects (e.g., oxygen vacancies (also referred to as VO)). Thus, an oxide semiconductor including a CAAC-OS is physically stable. Therefore, the oxide semiconductor including the CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that indium-gallium-zinc oxide (hereinafter referred to as IGZO) that is a kind of oxide semiconductor containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

The a-like OS is an oxide semiconductor having a structure between those of the nc-OS and the amorphous oxide semiconductor. The a-like OS includes a void or a low-density region. That is, the a-like OS has low crystallinity compared with the nc-OS and the CAAC-OS.

An oxide semiconductor has various structures with different properties. Two or more of the amorphous oxide semiconductor, the polycrystalline oxide semiconductor, the a-like OS, the nc-OS, and the CAAC-OS may be included in an oxide semiconductor of one embodiment of the present invention.

As an oxide semiconductor other than the above, a CAC (Cloud-Aligned Composite)-OS may be used.

A CAC-OS has a conducting function in part of the material and has an insulating function in another part of the material; as a whole, the CAC-OS has a function of a semiconductor. Note that in the case where the CAC-OS is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS. In the CAC-OS, separation of the functions can maximize each function.

In addition, the CAC-OS includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

The CAC-OS is composed of components having different band gaps. For example, the CAC-OS is composed of a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS is used in a channel formation region of a transistor, the transistor in the on state can achieve high current driving capability, that is, high on-state current and high field-effect mobility.

In other words, the CAC-OS can also be referred to as a matrix composite or a metal matrix composite.

The use of the above-described oxide semiconductor materials for the semiconductor layer makes it possible to provide a highly reliable transistor in which a change in the electrical characteristics is suppressed.

Charge accumulated in a capacitor through a transistor including the above-described semiconductor layer can be retained for a long time because of the low off-state current of the transistor. The use of such a transistor in pixels allows a driver circuit to stop while the gray level of an image displayed on each display region is maintained. As a result, an electronic device with extremely low power consumption can be obtained.

For stable characteristics or the like of the transistor, a base film is preferably provided. The base film can be formed to be a single layer or a stacked layer using an inorganic insulating film such as a silicon oxide film, a silicon nitride film, a silicon oxynitride film, or a silicon nitride oxide film. The base film can be formed by a sputtering method, a CVD (Chemical Vapor Deposition) method (e.g., a plasma CVD method, a thermal CVD method, or an MOCVD (Metal Organic CVD) method), an ALD (Atomic Layer Deposition) method, a coating method, a printing method, or the like. Note that the base film is not necessarily provided when not needed.

Note that an FET 623 is illustrated as a transistor formed in the driver circuit portion 601. In addition, the driver circuit may be formed with any of a variety of circuits such as a CMOS circuit, a PMOS circuit, and an NMOS circuit. Although a driver integrated type in which the driver circuit is formed over the substrate is illustrated in this embodiment, the driver circuit is not necessarily formed over the substrate, and can be formed outside the substrate.

The pixel portion 602 includes a plurality of pixels each including a switching FET 611, a current controlling FET 612, and an anode 613 electrically connected to a drain of the current controlling FET 612. One embodiment of the present invention is not limited to the structure. The pixel portion 602 may include three or more FETs and a capacitor in combination.

Note that to cover an end portion of the anode 613, an insulator 614 is formed. The insulator 614 can be formed using a positive photosensitive acrylic here.

In order to improve the coverage with an EL layer or the like which is formed later, the insulator 614 is formed to have a curved surface with curvature at its upper or lower end portion. For example, in the case where positive photosensitive acrylic is used as a material of the insulator 614, only the upper end portion of the insulator 614 preferably has a curved surface with a curvature radius (0.2 µm to 3 µm). As the insulator 614, either a negative photosensitive resin or a positive photosensitive resin can be used.

An EL layer 616 and a cathode 617 are formed over the anode 613. Here, as a material used for the anode 613, a material having a high work function is desirably used. For example, a single-layer film of an ITO film, an indium tin oxide film containing silicon, an indium oxide film containing zinc oxide at 2 to 20 wt %, a titanium nitride film, a chromium film, a tungsten film, a Zn film, a Pt film, or the like, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance and favorable ohmic contact, and can function as an anode.

The EL layer 616 is formed by any of a variety of methods such as an evaporation method using an evaporation mask, an inkjet method, and a spin coating method. The EL layer 616 has the structure described in Embodiment 1 and Embodiment 2. As another material included in the EL layer 616, a low molecular compound or a high molecular compound (including an oligomer or a dendrimer) may be used.

As a material used for the cathode 617, which is formed over the EL layer 616, a material having a low work function (e.g., Al, Mg, Li, or Ca, or an alloy or a compound thereof, such as MgAg, MgIn, or AlLi) is preferably used. In the case where light generated in the EL layer 616 is transmitted through the cathode 617, a stack of a thin metal film and a transparent conductive film (e.g., ITO, indium oxide containing zinc oxide at 2 to 20 wt %, indium tin oxide containing silicon, or zinc oxide (ZnO)) is preferably used for the cathode 617.

Note that the light-emitting device is formed with the anode 613, the EL layer 616, and the cathode 617. The light-emitting device is the light-emitting device described in Embodiment 1 and Embodiment 2. In the light-emitting apparatus of this embodiment, the pixel portion, which includes a plurality of light-emitting devices, may include both the light-emitting device described in Embodiment 1 and Embodiment 2 and a light-emitting device having a different structure.

The sealing substrate 604 is attached to the element substrate 610 with the sealant 605, so that a light-emitting device 618 is provided in the space 607 surrounded by the element substrate 610, the sealing substrate 604, and the sealant 605. The space 607 is filled with a filler; it is filled with an inert gas (e.g., nitrogen or argon) in some cases, and filled with the sealant in some cases. It is preferable that the sealing substrate have a recessed portion provided with a desiccant, in which case degradation due to the influence of moisture can be suppressed.

Note that an epoxy-based resin or glass frit is preferably used for the sealant 605. It is desirable that such a material transmit moisture or oxygen as little as possible. As the sealing substrate 604, a glass substrate, a quartz substrate, or a plastic substrate formed of FRP (Fiber Reinforced Plastics), PVF (polyvinyl fluoride), polyester, acrylic, or the like can be used.

Although not illustrated in FIG. 4, a protective film may be provided over the cathode. As the protective film, an organic resin film or an inorganic insulating film can be formed. The protective film may be formed so as to cover an exposed portion of the sealant 605. The protective film can be provided so as to cover surfaces and side surfaces of the pair of substrates and exposed side surfaces of a sealing layer, an insulating layer, and the like.

For the protective film, a material that is less likely to transmit an impurity such as water can be used. Thus, diffusion of an impurity such as water from the outside into the inside can be effectively suppressed.

As a material included in the protective film, an oxide, a nitride, a fluoride, a sulfide, a ternary compound, a metal, a polymer, or the like can be used; for example, it is possible to use a material containing aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, or indium oxide; or a material containing aluminum nitride, hafnium nitride, silicon nitride, tantalum nitride, titanium nitride, niobium nitride, molybdenum nitride, zirconium nitride, or gallium nitride; a material containing a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The protective film is preferably formed using a deposition method with favorable step coverage. One such method is an atomic layer deposition (ALD) method. A material that can be formed by an ALD method is preferably used for the protective film. A dense protective film having reduced defects such as cracks or pinholes or a uniform thickness can be formed by an ALD method. Furthermore, damage to a process member in forming the protective film can be reduced.

For example, by an ALD method, a uniform protective film with few defects can be formed even on a surface with a complex uneven shape or upper, side, and lower surfaces of a touch panel.

As described above, the light-emitting apparatus manufactured using the light-emitting device described in Embodiment 1 and Embodiment 2 can be obtained.

The light-emitting apparatus in this embodiment uses the light-emitting device described in Embodiment 1 and Embodiment 2 and thus can have favorable characteristics. Specifically, since the light-emitting device described in Embodiment 1 and Embodiment 2 has a long lifetime, the light-emitting apparatus can have high reliability. Since the light-emitting apparatus using the light-emitting device described in Embodiment 1 and Embodiment 2 has high emission efficiency, the light-emitting apparatus can achieve low power consumption.

Figures 5A, 5B:
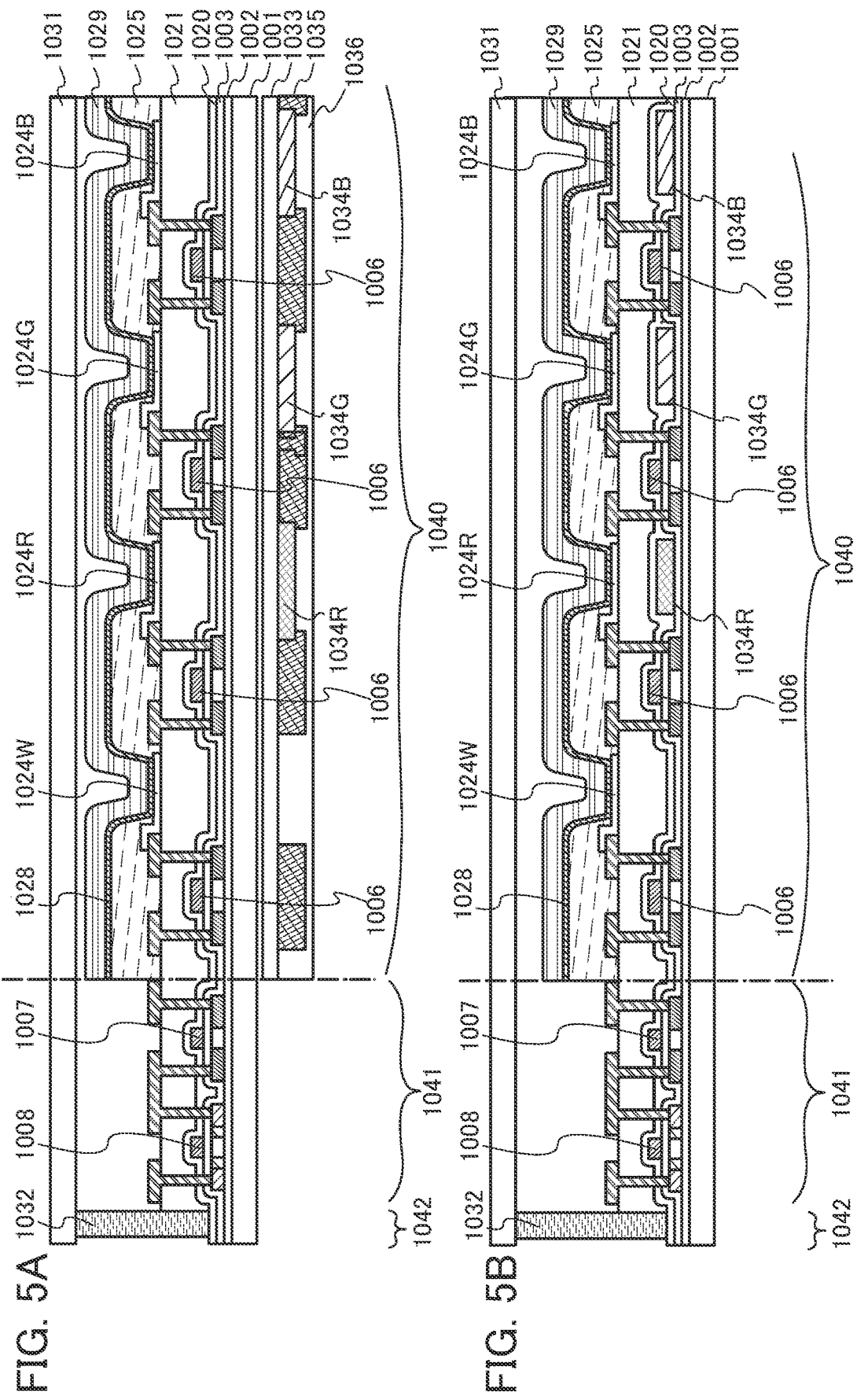
FIG. 5A and FIG. 5B are conceptual diagrams of active matrix light-emitting apparatuses.

FIG. 5 illustrates an example of a light-emitting apparatus in which a light-emitting device exhibiting white light emission is formed and coloring layers (color filters) and the like are provided to achieve full-color display. FIG. 5A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, anodes 1024W, 1024R, 1024G, and 1024B of light-emitting devices, a partition 1025, an EL layer 1028, a cathode 1029 of the light-emitting devices, a sealing substrate 1031, a sealant 1032, and the like.

In FIG. 5A, coloring layers (a red coloring layer 1034R, a green coloring layer 1034G, and a blue coloring layer 1034B) are provided on a transparent base material 1033. A black matrix 1035 may be additionally provided. The transparent base material 1033 provided with the coloring layers and the black matrix is aligned and fixed to the substrate 1001. Note that the coloring layers and the black matrix 1035 are covered with an overcoat layer 1036. In FIG. 5A, there is a light-emitting layer from which light is extracted to the outside without passing through the coloring layers and a light-emitting layer from which light is extracted to the outside after passing through the coloring layers of the respective colors. The light that does not pass through the coloring layers is white, and the light that passes through the coloring layers is red, green, and blue, so that an image can be expressed with the pixels of four colors.

FIG. 5B illustrates an example in which the coloring layers (the red coloring layer 1034R, the green coloring layer 1034G, and the blue coloring layer 1034B) are formed between the gate insulating film 1003 and the first interlayer insulating film 1020. As in this structure, the coloring layers may be provided between the substrate 1001 and the sealing substrate 1031.

Figure 6:
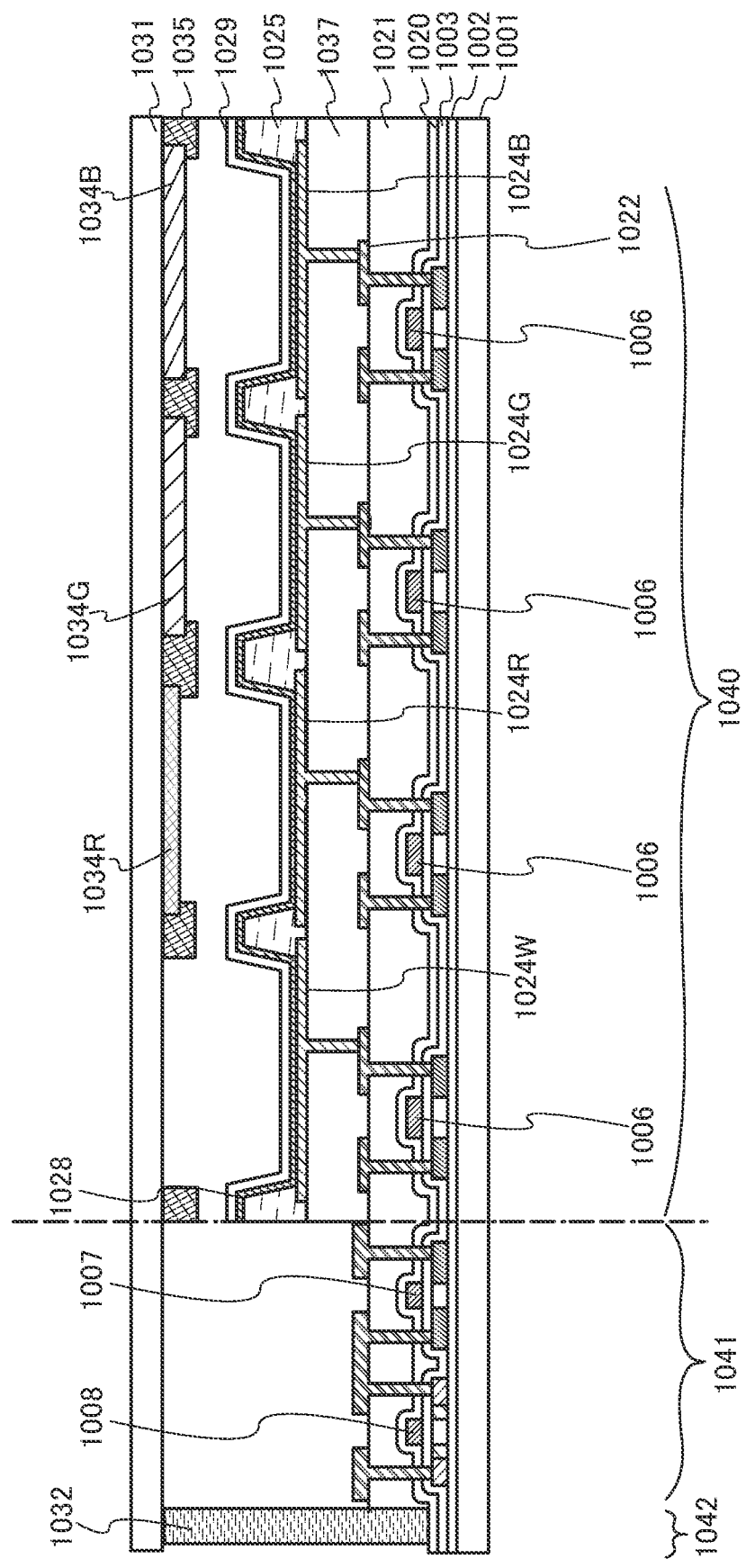
FIG. 6 is a conceptual diagram of an active matrix light-emitting apparatus.

The above-described light-emitting apparatus has a structure in which light is extracted from the substrate 1001 side where FETs are formed (a bottom emission structure), but may have a structure in which light is extracted from the sealing substrate 1031 side (a top emission structure). FIG. 6 is a cross-sectional view of a light-emitting apparatus having a top emission structure. In this case, a substrate that does not transmit light can be used as the substrate 1001. The process up to the step of forming a connection electrode that connects the FET and the anode of the light-emitting device is performed in a manner similar to that of the light-emitting apparatus having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film or using any of other known materials.

The anodes 1024W, 1024R, 1024G, and 1024B of the light-emitting devices are anodes here, but may be formed as cathodes. Furthermore, in the case of a light-emitting apparatus having a top emission structure as illustrated in FIG. 6, the anodes are preferably reflective electrodes. The EL layer 1028 is formed to have a structure similar to the structure of the EL layer 103 described in Embodiment 1 and Embodiment 2, with which white light emission can be obtained.

In the case of a top emission structure as illustrated in FIG. 6, sealing can be performed with the sealing substrate 1031 on which the coloring layers (the red coloring layer 1034R, the green coloring layer 1034G, and the blue coloring layer 1034B) are provided. The sealing substrate 1031 may be provided with the black matrix 1035 that is positioned between pixels. The coloring layers (the red coloring layer 1034R, the green coloring layer 1034G, and the blue coloring layer 1034B) and the black matrix may be covered with the overcoat layer 1036. Note that a light-transmitting substrate is used as the sealing substrate 1031. Although an example in which full color display is performed using four colors of red, green, blue, and white is shown here, there is no particular limitation and full color display using four colors of red, yellow, green, and blue or three colors of red, green, and blue may be performed.

In the light-emitting apparatus having a top emission structure, a microcavity structure can be suitably employed. A light-emitting device with a microcavity structure can be obtained with the use of a reflective electrode as the anode and a semi-transmissive and semi-reflective electrode as the cathode. At least an EL layer is provided between the reflective electrode and the semi-transmissive and semi-reflective electrode, and the EL layer includes at least a light-emitting layer functioning as a light-emitting region.

Note that the reflective electrode is a film having a visible light reflectance of 40% to 100%, preferably 70% to 100%, and a resistivity of $1 \times 10^{-2}$ Ωcm or lower. The semi-transmissive and semi-reflective electrode is a film having a visible light reflectance of 20% to 80%, preferably 40% to 70%, and a resistivity of $1 \times 10^{-2}$ Ωcm or lower.

Light emitted from the light-emitting layer included in the EL layer is reflected and resonated by the reflective electrode and the semi-transmissive and semi-reflective electrode.

In the light-emitting device, by changing the thicknesses of the transparent conductive film, the above-described composite material, the carrier-transport material, and the like, the optical path length between the reflective electrode and the semi-transmissive and semi-reflective electrode can be changed. Thus, light with a wavelength that is resonated between the reflective electrode and the semi-transmissive and semi-reflective electrode can be intensified while light with a wavelength that is not resonated therebetween can be attenuated.

Note that light that is reflected back by the reflective electrode (first reflected light) considerably interferes with light that directly enters the semi-transmissive and semi-reflective electrode from the light-emitting layer (first incident light); therefore, the optical path length between the reflective electrode and the light-emitting layer is preferably adjusted to $(2n-1)\lambda/4$ (n is a natural number of 1 or larger and $\lambda$ is a wavelength of light emission to be amplified). By adjusting the optical path length, the phases of the first reflected light and the first incident light can be aligned with each other and the light emitted from the light-emitting layer can be further amplified.

Note that in the above structure, the EL layer may include a plurality of light-emitting layers or may include a single light-emitting layer; for example, in combination with the structure of the above-described tandem light-emitting device, a plurality of EL layers each including a single or a plurality of light-emitting layer(s) may be provided in one light-emitting device with a charge-generation layer interposed between the EL layers.

With the microcavity structure, emission intensity with a specific wavelength in the front direction can be increased, whereby power consumption can be reduced. Note that in the case of a light-emitting apparatus which displays images with subpixels of four colors of red, yellow, green, and blue, the light-emitting apparatus can have favorable characteristics because the luminance can be increased owing to yellow light emission and each subpixel can employ a microcavity structure suitable for the wavelength of the corresponding color.

The light-emitting apparatus in this embodiment uses the light-emitting device described in Embodiment 1 and Embodiment 2 and thus can have favorable characteristics. Specifically, since the light-emitting device described in Embodiment 1 and Embodiment 2 has a long lifetime, the light-emitting apparatus can have high reliability. Furthermore, since the light-emitting apparatus using the light-emitting device described in Embodiment 1 and Embodiment 2 has high emission efficiency, the light-emitting apparatus can achieve low power consumption.

Embodiment 4

Figure 7A:
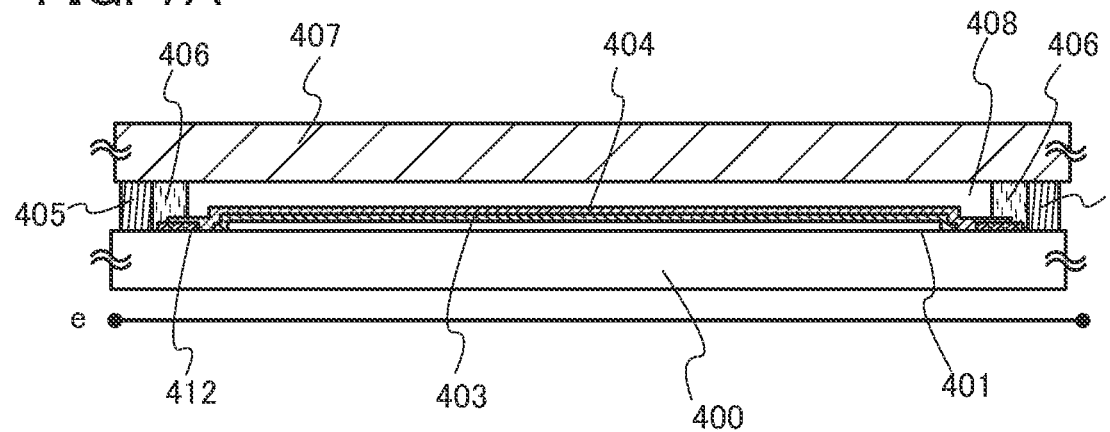
FIG. 7A and FIG. 7B are diagrams illustrating a lighting device.
Figure 7B:
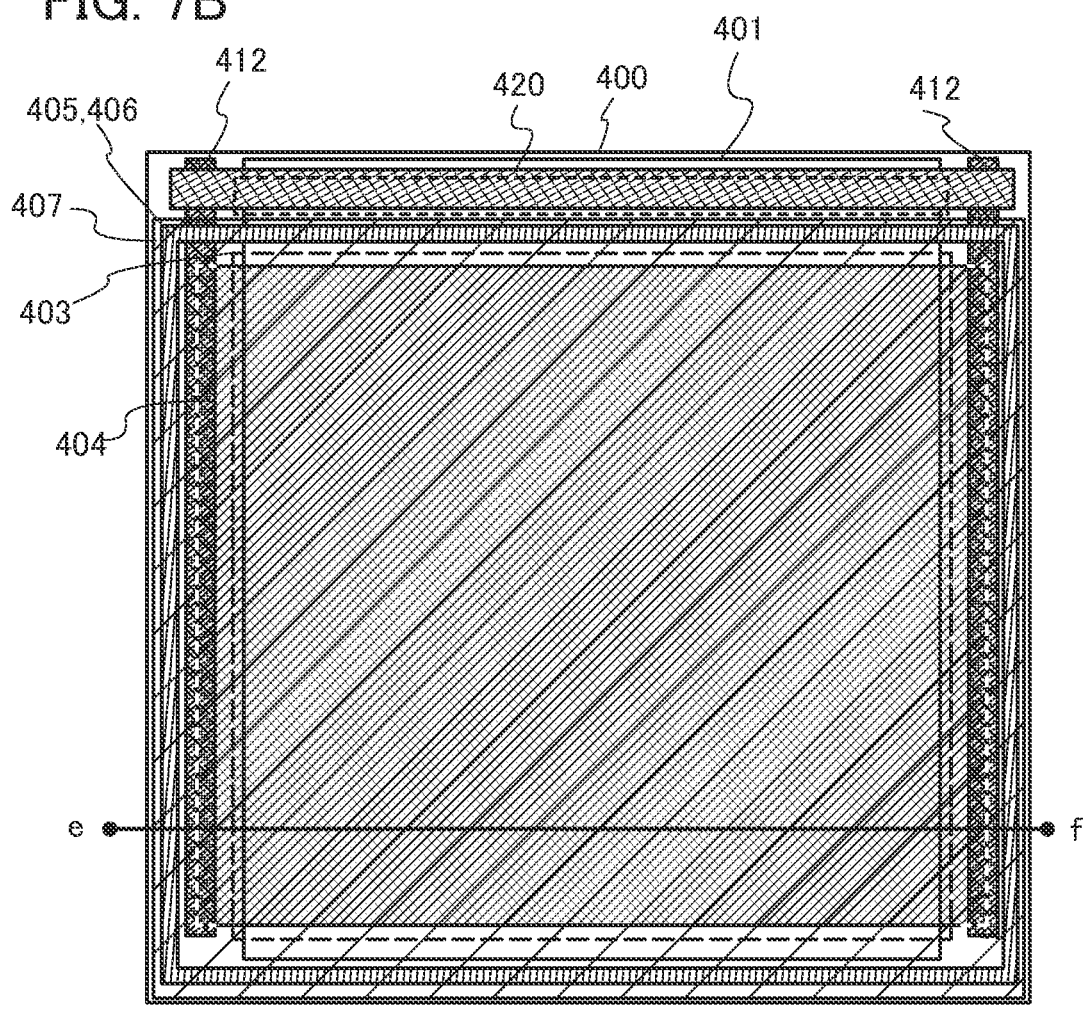

In this embodiment, an example in which the light-emitting device described in Embodiment 1 and Embodiment 2 is used for a lighting device is described with reference to FIG. 7. FIG. 7B is a top view of the lighting device, and FIG. 7A is a cross-sectional view taken along e-f in FIG. 7B.

In the lighting device in this embodiment, an anode 401 is formed over a substrate 400 which is a support and has a light-transmitting property. The anode 401 corresponds to the anode 101 in Embodiment 2. When light is extracted from the anode 401 side, the anode 401 is formed using a material having a light-transmitting property.

A pad 412 for supplying voltage to a cathode 404 is formed over the substrate 400.

An EL layer 403 is formed over the anode 401. The structure of the EL layer 403 corresponds to, for example, the structure of the EL layer 103 in Embodiment 1 and Embodiment 2, or the structure in which the light-emitting units 511 and 512 and the charge-generation layer 513 are combined. Refer to the descriptions for the structures.

The cathode 404 is formed to cover the EL layer 403. The cathode 404 corresponds to the cathode 102 in Embodiment 2. The cathode 404 is formed using a material having high reflectance when light is extracted from the anode 401 side. The cathode 404 is connected to the pad 412, whereby voltage is supplied.

As described above, the lighting device described in this embodiment includes a light-emitting device including the anode 401, the EL layer 403, and the cathode 404. Since the light-emitting device has high emission efficiency, the lighting device in this embodiment can have low power consumption.

The substrate 400 provided with a light-emitting device having the above structure is fixed to a sealing substrate 407 with sealants 405 and 406 and sealing is performed, whereby the lighting device is completed. It is possible to use only either the sealant 405 or the sealant 406. The inner sealant 406 (not illustrated in FIG. 7B) can be mixed with a desiccant that enables moisture to be adsorbed, which results in improved reliability.

When parts of the pad 412 and the anode 401 are extended to the outside of the sealants 405 and 406, the extended parts can function as external input terminals. An IC chip 420 mounted with a converter or the like may be provided over the external input terminals.

The lighting device described in this embodiment includes, as an EL element, the light-emitting device described in Embodiment 1 and Embodiment 2; thus, the light-emitting apparatus can have high reliability. In addition, the light-emitting apparatus can consume less power.

Embodiment 5

In this embodiment, examples of electronic devices each including the light-emitting device described in Embodiment 1 and Embodiment 2 are described. The light-emitting device described in Embodiment 1 and Embodiment 2 has a favorable lifetime and high reliability. As a result, the electronic devices described in this embodiment can each include a light-emitting portion having high reliability.

Examples of the electronic devices including the above light-emitting device include a television device (also referred to as a television or a television receiver), a monitor for a computer or the like, a digital camera, a digital video camera, a digital photo frame, a cellular phone (also referred to as a mobile phone or a mobile phone device), a portable game machine, a portable information terminal, an audio playback device, and a large game machine such as a pachinko machine. Specific examples of these electronic devices are described below.

FIG. 8A illustrates an example of a television device. In the television device, a display portion 7103 is incorporated in a housing 7101. Here, the housing 7101 is supported by a stand 7105. Images can be displayed on the display portion 7103, and in the display portion 7103, the light-emitting devices described in Embodiment 1 and Embodiment 2 are arranged in a matrix.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device is provided with a receiver, a modem, and the like. With the use of the receiver, a general television broadcast can be received. Moreover, when the television device is connected to a communication network with or without wires via the modem, one-way (from a sender to a receiver) or two-way (between a sender and a receiver or between receivers) data communication can be performed.

FIG. 8B1 illustrates a computer, which includes a main body 7201, a housing 7202, a display portion 7203, a keyboard 7204, an external connection port 7205, a pointing device 7206, and the like. Note that this computer is fabricated using the light-emitting devices described in Embodiment 1 and Embodiment 2 and arranged in a matrix in the display portion 7203. The computer in FIG. 8B1 may have a structure in FIG. 8B2. A computer in FIG. 8B2 is provided with a second display portion 7210 instead of the keyboard 7204 and the pointing device 7206. The second display portion 7210 is a touch panel, and input operation can be performed by touching display for input on the second display portion 7210 with a finger or a dedicated pen. The second display portion 7210 can also display images other than the display for input. The display portion 7203 may also be a touch panel. Connecting the two screens with a hinge can prevent troubles; for example, the screens can be prevented from being cracked or broken while the computer is being stored or carried.

FIG. 8C illustrates an example of a portable terminal. A cellular phone is provided with a display portion 7402 incorporated in a housing 7401, operation buttons 7403, an external connection port 7404, a speaker 7405, a microphone 7406, and the like. Note that the cellular phone has the display portion 7402 including the light-emitting devices described in Embodiment 1 and Embodiment 2 and arranged in a matrix.

When the display portion 7402 of the portable terminal illustrated in FIG. 8C is touched with a finger or the like, data can be input into the portable terminal. In this case, operations such as making a call and creating an e-mail can be performed by touching the display portion 7402 with a finger or the like.

The display portion 7402 has mainly three screen modes. The first mode is a display mode mainly for displaying images. The second mode is an input mode mainly for inputting data such as text. The third mode is a display-and-input mode in which the two modes, the display mode and the input mode, are combined.

For example, in the case of making a call or creating an e-mail, a text input mode mainly for inputting text is selected for the display portion 7402 so that text displayed on the screen can be input. In this case, it is preferable to display a keyboard or number buttons on almost the entire screen of the display portion 7402.

When a sensing device including a sensor for sensing inclination, such as a gyroscope sensor or an acceleration sensor, is provided inside the portable terminal, display on the screen of the display portion 7402 can be automatically changed by determining the orientation (horizontal or vertical) of the portable terminal.

The screen modes are changed by touching the display portion 7402 or operating the operation buttons 7403 of the housing 7401. Alternatively, the screen modes can be changed depending on the kind of image displayed on the display portion 7402. For example, when a signal of an image displayed on the display portion is moving image data, the screen mode is changed to the display mode, and when the signal is text data, the screen mode is changed to the input mode.

Moreover, in the input mode, when input by touching the display portion 7402 is not performed for a certain period while a signal sensed by an optical sensor in the display portion 7402 is sensed, the screen mode may be controlled so as to be switched from the input mode to the display mode.

The display portion 7402 can also function as an image sensor. For example, an image of a palm print, a fingerprint, or the like is taken when the display portion 7402 is touched with the palm or the finger, whereby personal authentication can be performed. Furthermore, by using a backlight that emits near-infrared light or a sensing light source that emits near-infrared light in the display portion, an image of a finger vein, a palm vein, or the like can be taken.

Note that the structure described in this embodiment can be combined with any of the structures described in Embodiment 1 to Embodiment 4 as appropriate.

As described above, the application range of the light-emitting apparatus having the light-emitting device described in Embodiment 1 and Embodiment 2 is extremely wide, so that this light-emitting apparatus can be used in electronic devices in a variety of fields. By using the light-emitting device described in Embodiment 1 and Embodiment 2, an electronic device with high reliability can be obtained.

Figure 9A:
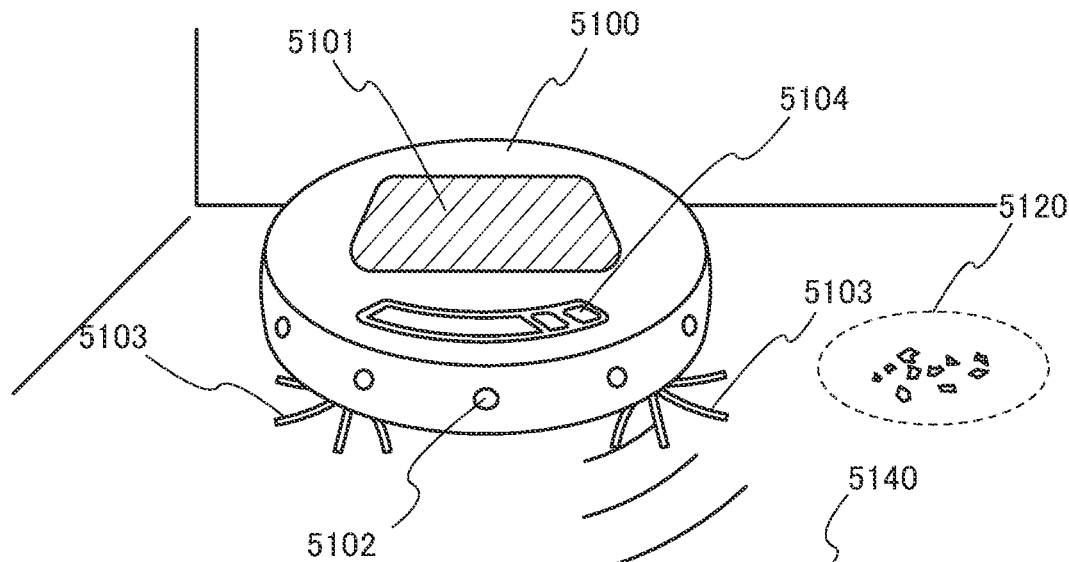
FIG. 9A, FIG. 9B, and FIG. 9C are diagrams illustrating electronic devices.

FIG. 9A is a schematic view illustrating an example of a cleaning robot.

A cleaning robot 5100 includes a display 5101 placed on its top surface, a plurality of cameras 5102 placed on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The cleaning robot 5100 is self-propelled, detects dust 5120, and sucks up the dust through the inlet provided on the bottom surface.

The cleaning robot 5100 can determine whether there is an obstacle such as a wall, furniture, or a step by analyzing images taken by the cameras 5102. When an object that is likely to be caught in the brush 5103, such as a wire, is detected by image analysis, the rotation of the brush 5103 can be stopped.

The display 5101 can display the remaining capacity of a battery, the amount of collected dust, and the like. The display 5101 may display a path on which the cleaning robot 5100 has run. The display 5101 may be a touch panel, and the operation buttons 5104 may be provided on the display 5101.

The cleaning robot 5100 can communicate with a portable electronic device 5140 such as a smartphone. The portable electronic device 5140 can display images taken by the cameras 5102. Accordingly, an owner of the cleaning robot 5100 can monitor the room even from the outside. The owner can also check the display on the display 5101 by the portable electronic device such as a smartphone.

The light-emitting apparatus of one embodiment of the present invention can be used for the display 5101.

Figure 9B:
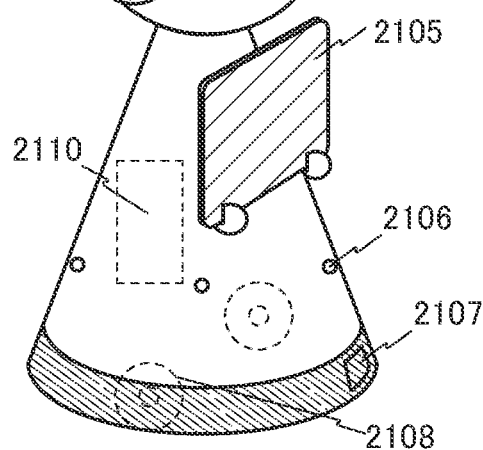

A robot 2100 illustrated in FIG. 9B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of capturing an image of the surroundings of the robot 2100. The obstacle sensor 2107 can detect the presence of an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting apparatus of one embodiment of the present invention can be used for the display 2105.

Figure 9C:
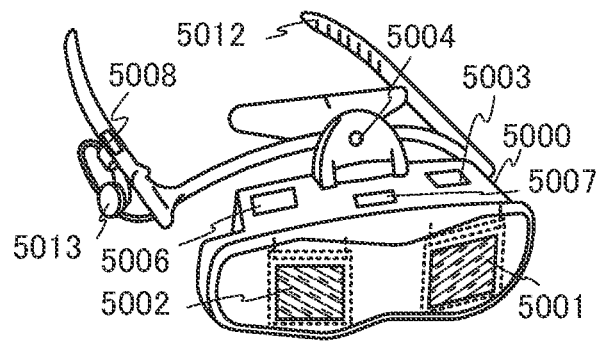

FIG. 9C illustrates an example of a goggle-type display. The goggle-type display includes, for example, a housing 5000, a display portion 5001, a speaker 5003, an LED lamp 5004, a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, a display portion 5002, a support 5012, and an earphone 5013.

The light-emitting apparatus of one embodiment of the present invention can be used for the display portion 5001 and the display portion 5002.

Figure 10:
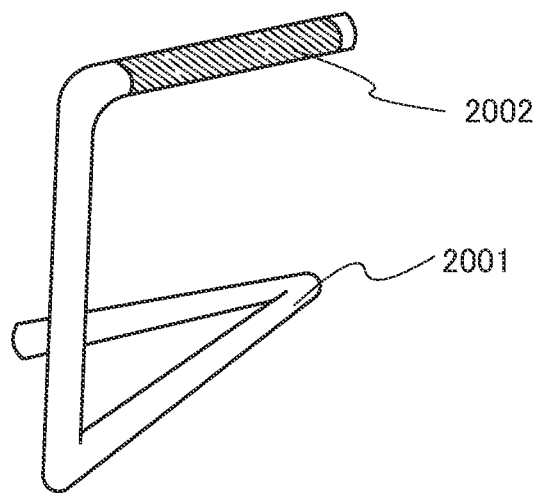
FIG. 10 is a diagram illustrating a lighting device.

FIG. 10 illustrates an example in which the light-emitting device described in Embodiment 1 and Embodiment 2 is used for a table lamp which is a lighting device. The table lamp illustrated in FIG. 10 includes a housing 2001 and a light source 2002, and the lighting device described in Embodiment 3 may be used for the light source 2002.

Figure 11:
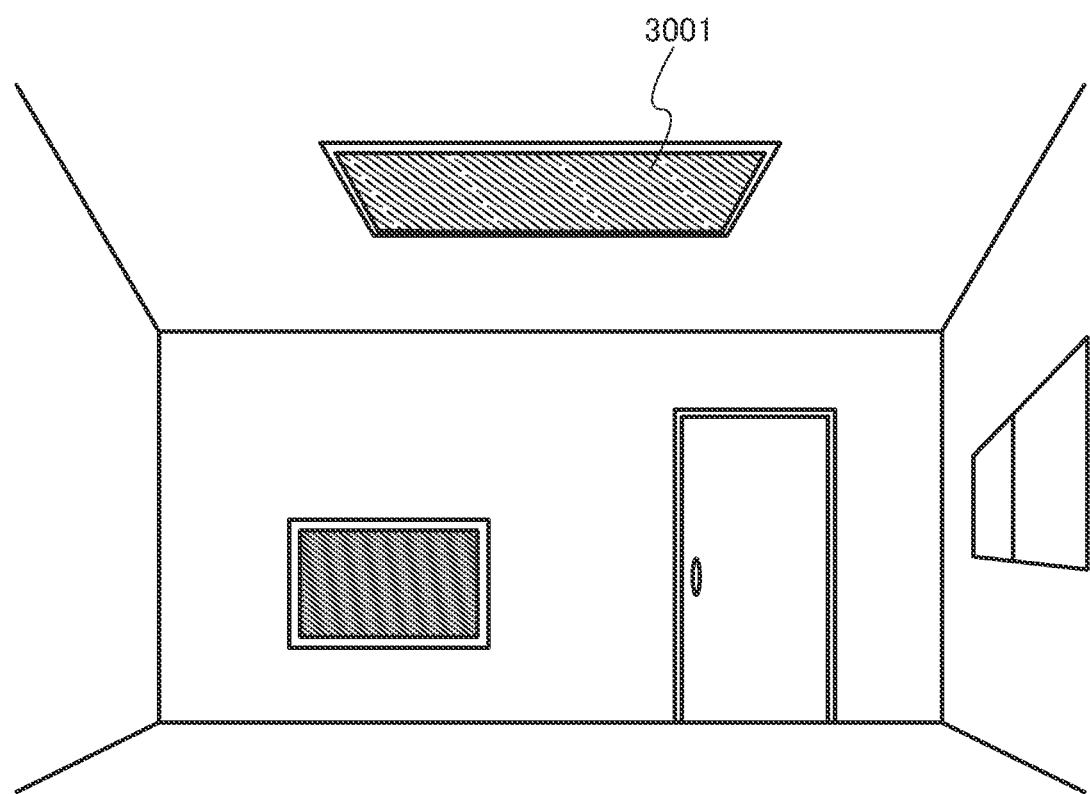
FIG. 11 is a diagram illustrating a lighting device.

FIG. 11 illustrates an example in which the light-emitting device described in Embodiment 1 and Embodiment 2 is used for an indoor lighting device 3001. Since the light-emitting device described in Embodiment 1 and Embodiment 2 has high reliability, the lighting device can have high reliability. Furthermore, since the light-emitting device described in Embodiment 1 and Embodiment 2 can have a large area, the light-emitting device can be used for a large-area lighting device. Furthermore, since the light-emitting device described in Embodiment 1 and Embodiment 2 is thin, the light-emitting device can be used for a lighting device having a reduced thickness.

Figure 12:
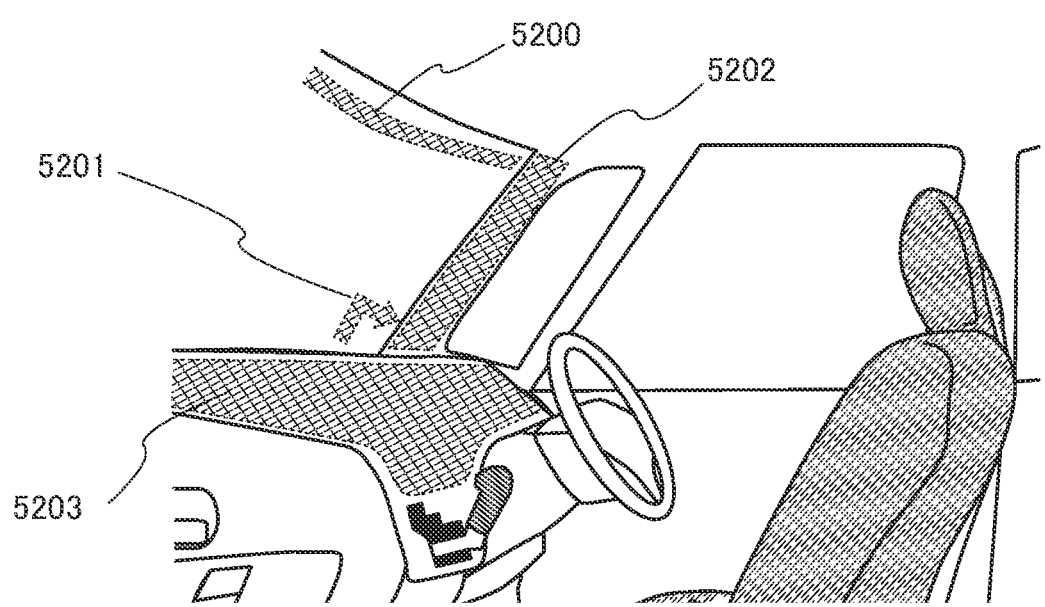
FIG. 12 is a diagram illustrating in-vehicle display devices and lighting devices.

The light-emitting device described in Embodiment 1 and Embodiment 2 can also be used for an automobile windshield or an automobile dashboard. FIG. 12 illustrates one mode in which the light-emitting device described in Embodiment 1 and Embodiment 2 are used for an automobile windshield and an automobile dashboard. A display region 5200 to a display region 5203 each include the light-emitting device described in Embodiment 1 and Embodiment 2.

The display region 5200 and the display region 5201 are display devices which are provided in the automobile windshield and in which the light-emitting devices described in Embodiment 1 and Embodiment 2 are incorporated. When the light-emitting devices described in Embodiment 1 and Embodiment 2 are fabricated using electrodes having light-transmitting properties as an anode and a cathode, what is called see-through display devices, through which the opposite side can be seen, can be obtained. Such see-through display can be provided even in the automobile windshield without hindering the view. In the case where a driving transistor or the like is provided, a transistor having a light-transmitting property, such as an organic transistor including an organic semiconductor material or a transistor including an oxide semiconductor, is preferably used.

The display region 5202 is a display device which is provided in a pillar portion and in which the light-emitting device described in Embodiment 1 and Embodiment 2 is incorporated. The display region 5202 can compensate for the view hindered by the pillar by displaying an image taken by an imaging means provided on the car body. Similarly, the display region 5203 provided in the dashboard portion can display an image taken by an imaging means provided on the outside of the automobile, so that the view hindered by the car body can be compensated for to avoid blind areas and enhance the safety. Displaying an image so as to compensate for the area that cannot be seen makes it possible to confirm safety more naturally and comfortably.

The display region 5203 can provide a variety of kinds of information such as navigation data, a speedometer, a tachometer, air-condition setting, and the like. The content or layout of the display can be changed freely in accordance with the preference of a user. Note that such information can also be displayed on the display region 5200 to the display region 5202. The display region 5200 to the display region 5203 can also be used as lighting devices.

Figure 13A:
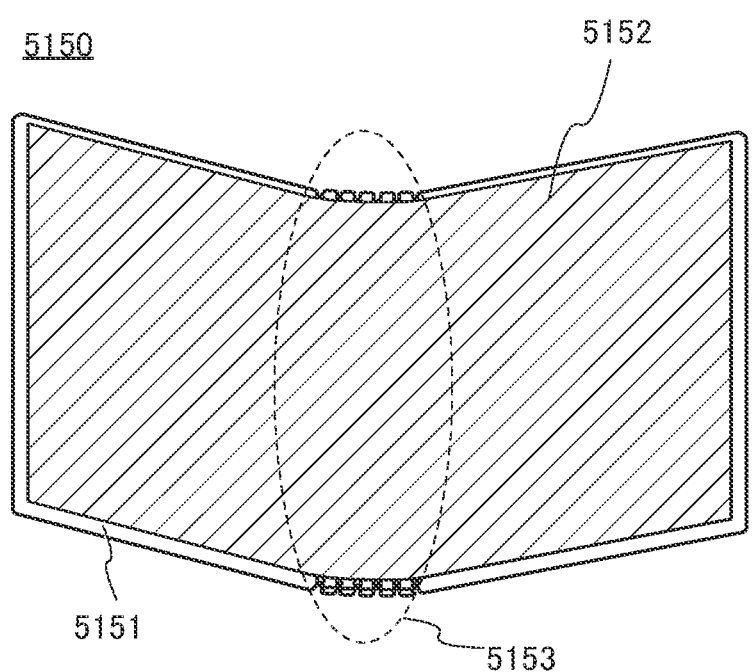
FIG. 13A and FIG. 13B are diagrams illustrating an electronic device.
Figure 13B:
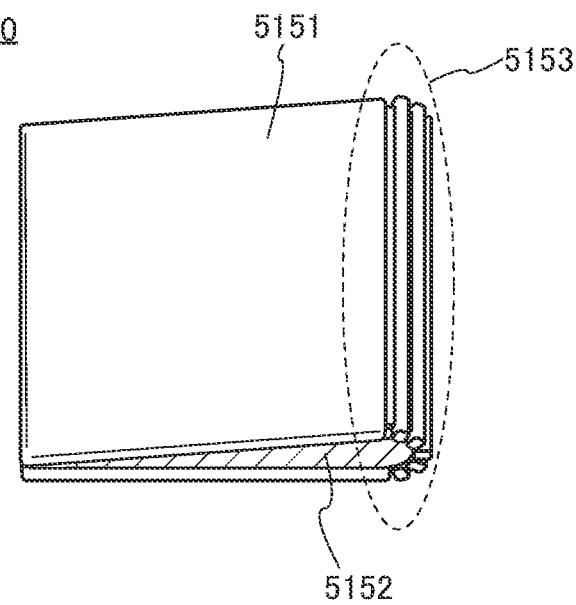

FIG. 13A and FIG. 13B illustrate a foldable portable information terminal 5150. The foldable portable information terminal 5150 includes a housing 5151, a display region 5152, and a bend portion 5153. FIG. 13A illustrates the portable information terminal 5150 that is opened. FIG. 13B illustrates the portable information terminal that is folded. Despite its large display region 5152, the portable information terminal 5150 is compact in size and has excellent portability when folded.

The display region 5152 can be folded in half with the bend portion 5153. The bend portion 5153 includes a stretchable member and a plurality of supporting members. When the display region is folded, the stretchable member stretches and the bend portion 5153 is folded with a radius of curvature of greater than or equal to 2 mm, preferably greater than or equal to 3 mm.

Note that the display region 5152 may be a touch panel (an input/output device) including a touch sensor (an input device). The light-emitting apparatus of one embodiment of the present invention can be used for the display region 5152.

Figure 14A:
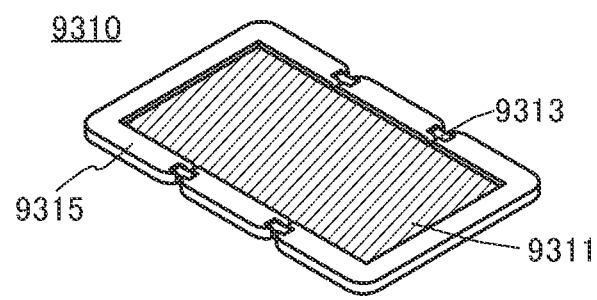
FIG. 14A, FIG. 14B, and FIG. 14C are diagrams illustrating an electronic device.
Figure 14B:
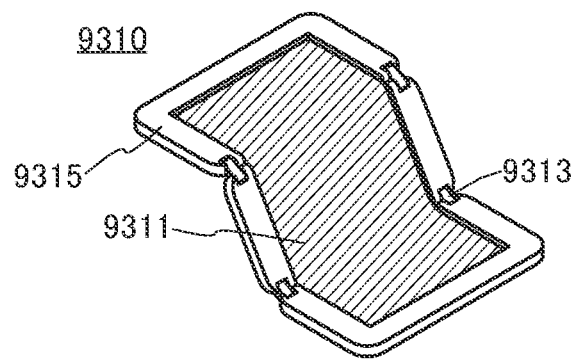
Figure 14C:
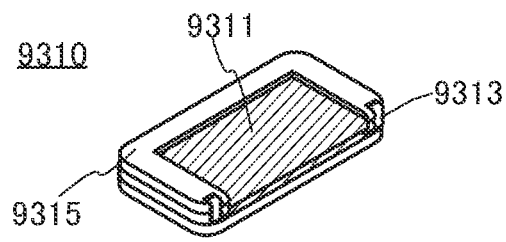

FIG. 14A to FIG. 14C illustrate a foldable portable information terminal 9310. FIG. 14A illustrates the portable information terminal 9310 that is opened. FIG. 14B illustrates the portable information terminal 9310 which is in the state of being changed from one of an opened state and a folded state to the other. FIG. 14C illustrates the portable information terminal 9310 that is folded. The portable information terminal 9310 is excellent in portability when folded, and is excellent in display browsability when opened because of a seamless large display region.

A display panel 9311 is supported by three housings 9315 joined together by hinges 9313. Note that the display panel 9311 may be a touch panel (an input/output device) including a touch sensor (an input device). By folding the display panel 9311 at the hinges 9313 between two housings 9315, the portable information terminal 9310 can be reversibly changed in shape from the opened state to the folded state. The light-emitting apparatus of one embodiment of the present invention can be used for the display panel 9311.

Example 1
In this example, the light-emitting device of one embodiment of the present invention is described. Structural Formulae of organic compounds used in this example are shown below.
[Chemical Formula 3]
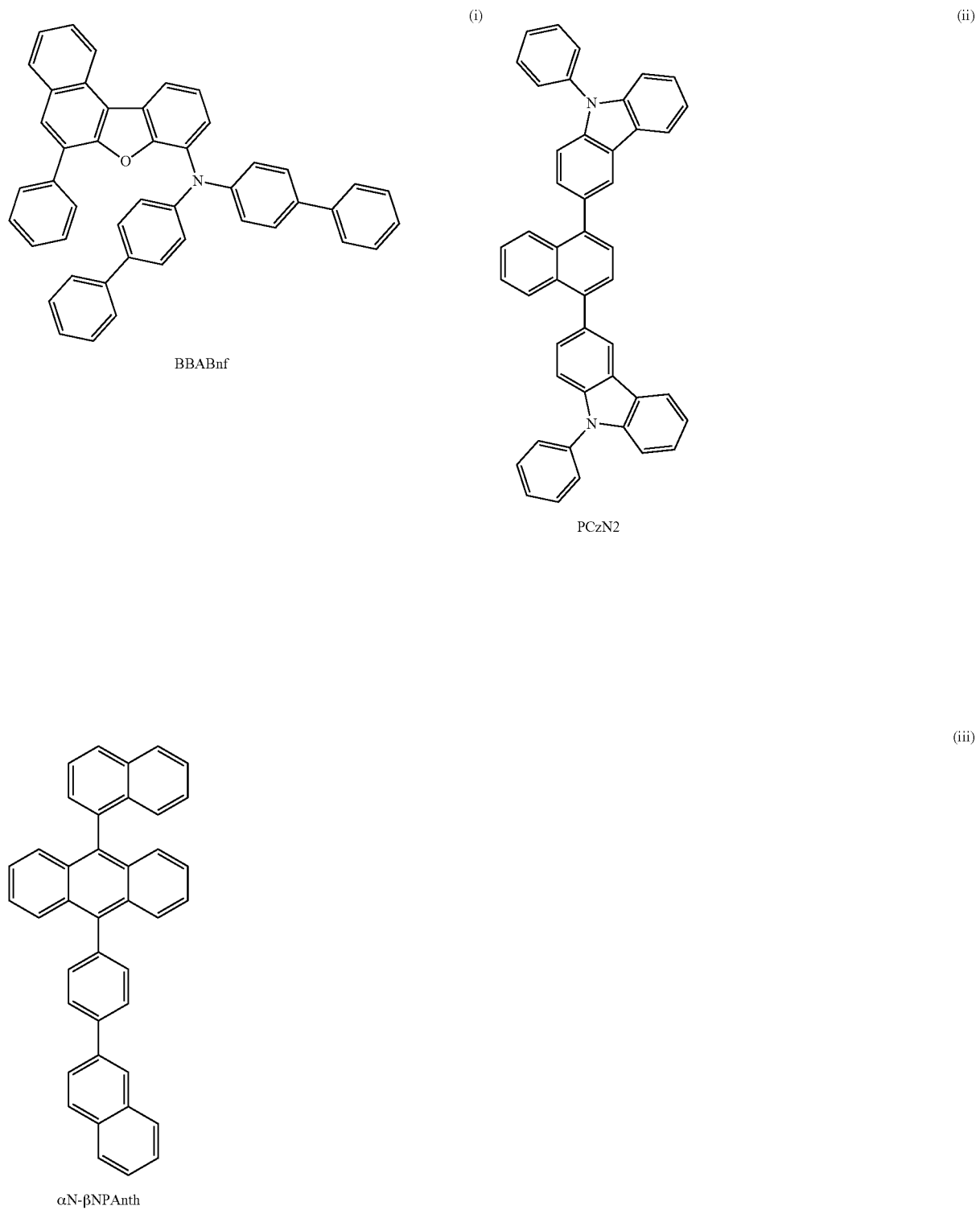

(iv)
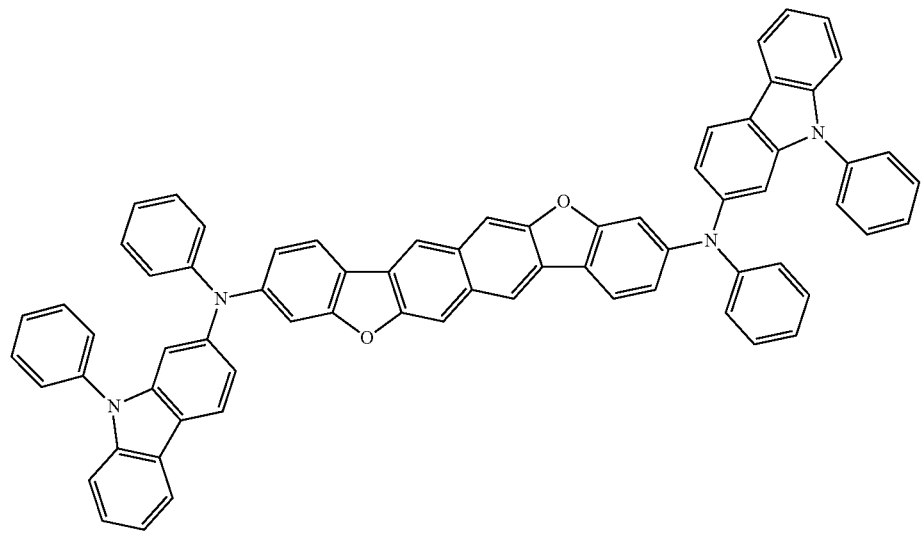
3,10PCA2Nbf(IV)-02
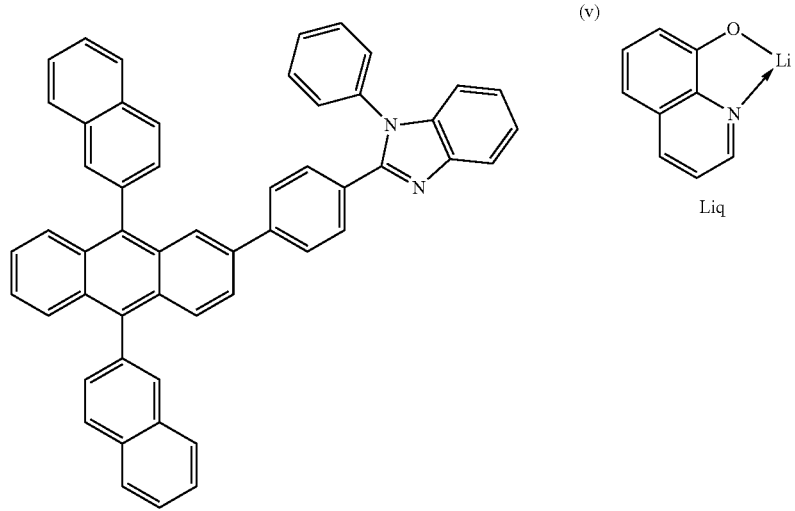
ZADN (v)
Liq (vi)

-continued

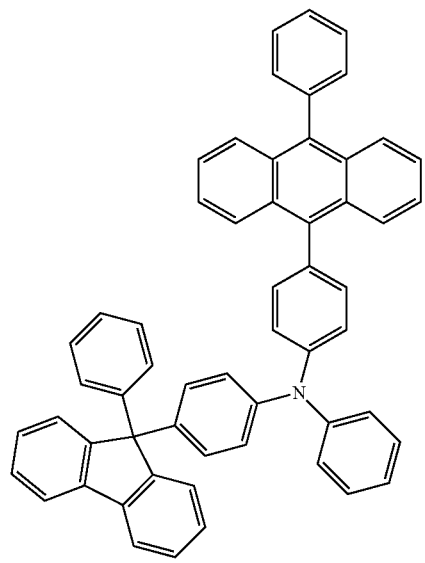

FLPAPA
(vii)

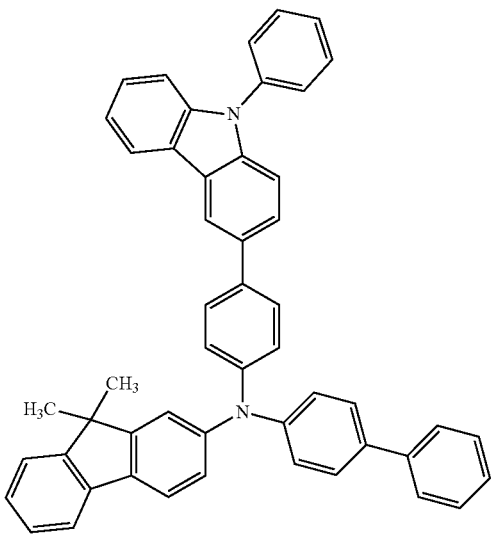

PCBBiF
(viii)

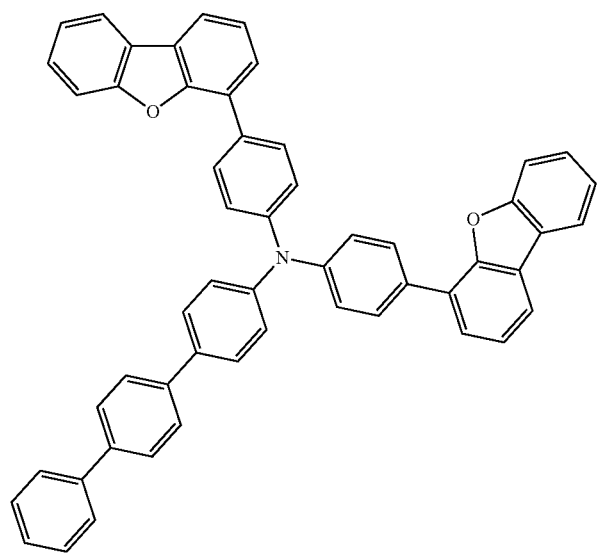

DBfBB1TP
(ix)

(Fabrication Method of Light-Emitting Device 1-1)

First, indium tin oxide containing silicon oxide (ITSO) was deposited on a glass substrate by a sputtering method to form the anode 101. Note that the film thickness was 70 nm and the area of the electrode was 2 mm×2 mm.

Next, in pretreatment for forming the light-emitting device over the substrate, the surface of the substrate was washed with water and baked at 200° C. for one hour, and then UV ozone treatment was performed for 370 seconds.

After that, the substrate was transferred into a vacuum evaporation apparatus in which the pressure was reduced to approximately $10^{-4}$ Pa, vacuum baking at 170° C. for 30 minutes was performed in a heating chamber in the vacuum evaporation apparatus, and then the substrate was cooled down for approximately 30 minutes.

Next, the substrate over which the anode 101 was formed was fixed to a substrate holder provided in the vacuum evaporation apparatus so that the surface provided with the anode 101 faced downward, and N,N-bis(4-biphenyl)-6-phenylbenzo[b]naphtho[1,2-d]furan-8-amine (abbreviation: BBABnf) represented by Structural Formula (i) above and ALD-MP001Q (produced by Analysis Atelier Corporation, material serial No. 1S20180314) were deposited by co-evaporation by an evaporation method using resistance heating over the anode 101 to a thickness of 10 nm at a weight ratio of 1:0.05 (=BBABrif:ALD-MP001Q), whereby the hole-injection layer 111 was formed.

Next, as the first hole-transport layer 112-1, BBABnf was deposited by evaporation to a thickness of 20 nm over the hole-injection layer 111, and then, as the second hole-transport layer 112-2, 3,3'-(naphthalene-1,4-diyl)bis(9-phenyl-9H-carbazole) (abbreviation: PCzN2) represented by Structural Formula (ii) above was deposited by evaporation to a thickness of 10 nm, whereby the hole-transport layer 112 was formed. Note that the second hole-transport layer 112-2 also functions as an electron-blocking layer.

Subsequently, 9-(1-naphthyl)-10-[4-(2-naphthyl)phenyl]anthracene (abbreviation: αN-βNPAnth) represented by Structural Formula (iii) above, and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) represented by Structural Formula (iv) above were deposited by co-evaporation to a thickness of 25 nm at a weight ratio of 1:0.015 (=αN-βNPAnth:3,10PCA2Nbf(IV)-02), so that the light-emitting layer 113 was formed.

Then, over the light-emitting layer 113, 2-{4-[9,10-di(naphthalen-2-yl)-2-anthryl]phenyl}-1-phenyl-1H-benzimidazole (abbreviation: ZADN) represented by Structural Formula (v) above and 8-hydroxyquinolinato-lithium (abbreviation: Liq) represented by Structural Formula (vi) above were deposited by co-evaporation to a thickness of 25 nm at a weight ratio of 1:1 (=ZADN:Liq), whereby the electron-transport layer 114 was formed.

After the formation of the electron-transport layer 114, Liq was deposited by evaporation to a thickness of 1 nm to form the electron-injection layer 115, and then aluminum was deposited by evaporation to a thickness of 200 nm to form the cathode 102, whereby a light-emitting device 1 of this example was fabricated.

(Fabrication Method of Light-Emitting Device 1-2)

A light-emitting device 1-2 was fabricated in a manner similar to that of the light-emitting device 1-1 except that the hole-injection layer 111 was deposited by co-evaporation to a thickness of 10 nm at BBABnf:ALD-MP001Q=1:0.1 (weight ratio).

(Fabrication Method of Light-Emitting Device 2-1)

A light-emitting device 2-1 was fabricated in a manner similar to that of the light-emitting device 1-1 except that BBABnf of the light-emitting device 1-1 was replaced with 4-(10-phenyl-9-anthryl)-4'-(9-phenyl-9H-fluoren-9-yl)triphenylamine (abbreviation: FLPAPA) represented by Structural Formula (vii) above.

(Fabrication Method of Light-Emitting Device 2-2)

A light-emitting device 2-2 was fabricated in a manner similar to that of the light-emitting device 1-2 except that BBABnf of the light-emitting device 1-2 was replaced with FLPAPA.

(Fabrication Method of Comparative Light-Emitting Device)

A comparative light-emitting device was fabricated in a manner similar to that of the light-emitting device 1-2 except that BBABnf of the light-emitting device 1-2 was replaced with N-(1,1'-biphenyl-4-yl)-9,9-dimethyl-N-[4-(9-phenyl-9H-carbazol-3-yl)phenyl]-9H-fluoren-2-amine (abbreviation: PCBBiF) represented by Structural Formula (viii) above, and PCzN2 was replaced with N,N-bis[4-(dibenzofuran-4-yl)phenyl]-4-amino-p-terphenyl (abbreviation: DBfBB1TP) represented by Structural Formula (ix) above.

The element structures of the light-emitting device 1-1, the light-emitting device 1-2, the light-emitting device 2-1, the light-emitting device 2-2, and the comparative light-emitting device are listed in the following table.

TABLE 1

| | Hole-injection layer 10 nm | Hole-transport layer 1 20 nm | Hole-transport layer 2 10 nm | Light-emitting layer 25 nm | Electron-transport layer 25 nm | Electron-injection layer 1 nm |
|---|---|---|---|---|---|---|
| Light-emitting device 1-1 | BBABnf: ALD-MP001Q (1:0.05) | BBABnf | PCzN2 | αN-βNPAnth: 3,10P CANbf(IV)-02 (1:0.015) | ZADN:Liq (1:1) | Liq |
| Light-emitting device 1-2 | BBABnf: ALD-MP001Q (1:0.1) | | | | | |
| Light-emitting device 2-1 | FLPAPA: ALD-MP001Q (1:0.05) | FLPAPA | | | | |
| Light-emitting device 2-2 | FLPAPA: ALD-MP001Q (1:0.1) | | | | | |
| Comparative light-emitting device | PCBBiF: ALD-MP001Q (1:0.1) | PCBBiF | DBfBB1TP | | | |

Here, the HOMO levels, the LUMO levels, and the electron mobilities of the organic compounds used in this example are listed in the following table. The electron mobilities were measured when the square root of the electric field strength [V/cm] was 600.

TABLE 2

| | HOMO level (eV) | LUMO level (eV) | Electron mobility ($cm^2/Vs$) |
|---|---|---|---|
| BBABnf | −5.56 | — | — |
| PCzN2 | −5.71 | — | — |
| αN-βNPAnth | −5.85 | −2.74 | — |
| ZADN | — | −2.87 | — |
| ZADN:Liq (1:1) | — | — | $3.5 \times 10^{-6}$ |
| FLPAPA | −5.54 | −2.87 | — |
| PCBBiF | −5.36 | — | — |
| DBf3B1TP | −5.50 | — | — |

These light-emitting devices were subjected to sealing with a glass substrate (a sealant was applied to surround the elements, followed by UV treatment and one-hour heat treatment at 80° C. at the time of sealing) in a glove box containing a nitrogen atmosphere so that the light-emitting devices were not exposed to the air. Then, the initial characteristics and reliability of the light-emitting device 1-1, the light-emitting device 1-2, the light-emitting device 2-1, the light-emitting device 2-2, and the comparative light-emitting device were measured. Note that the measurement was performed at room temperature.

Figure 15:
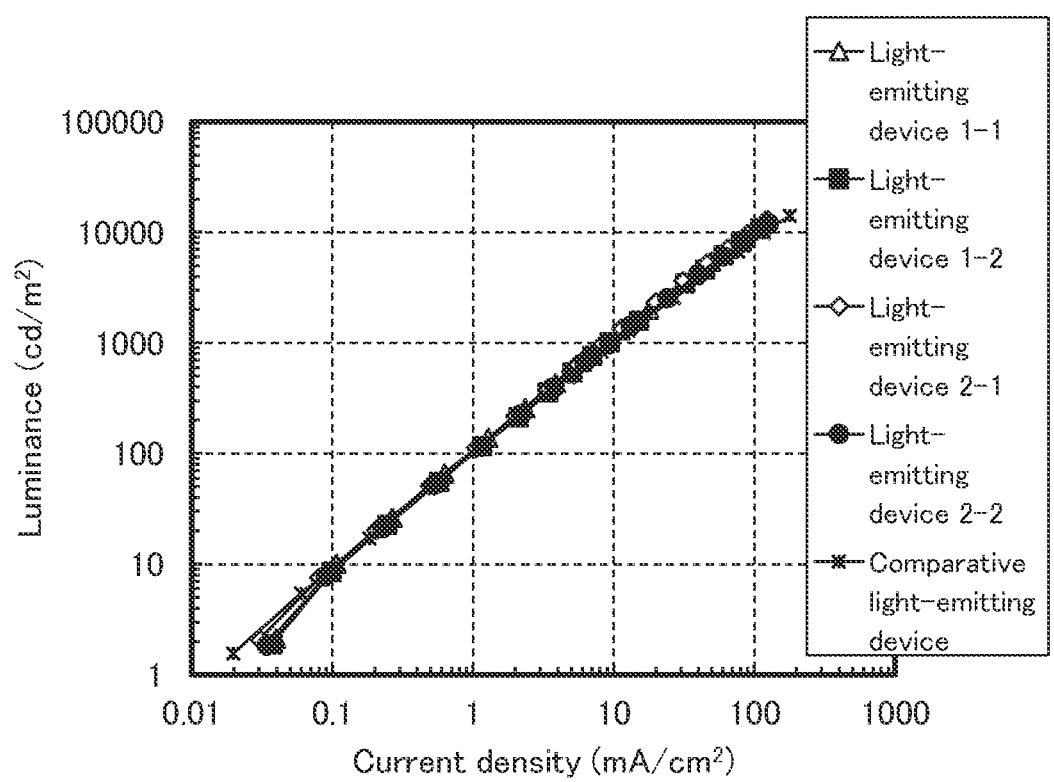
FIG. 15 is a diagram showing luminance-current density characteristics of light-emitting devices 1-1, 1-2, 2-1, and 2-2 and a comparative light-emitting device.
Figure 16:
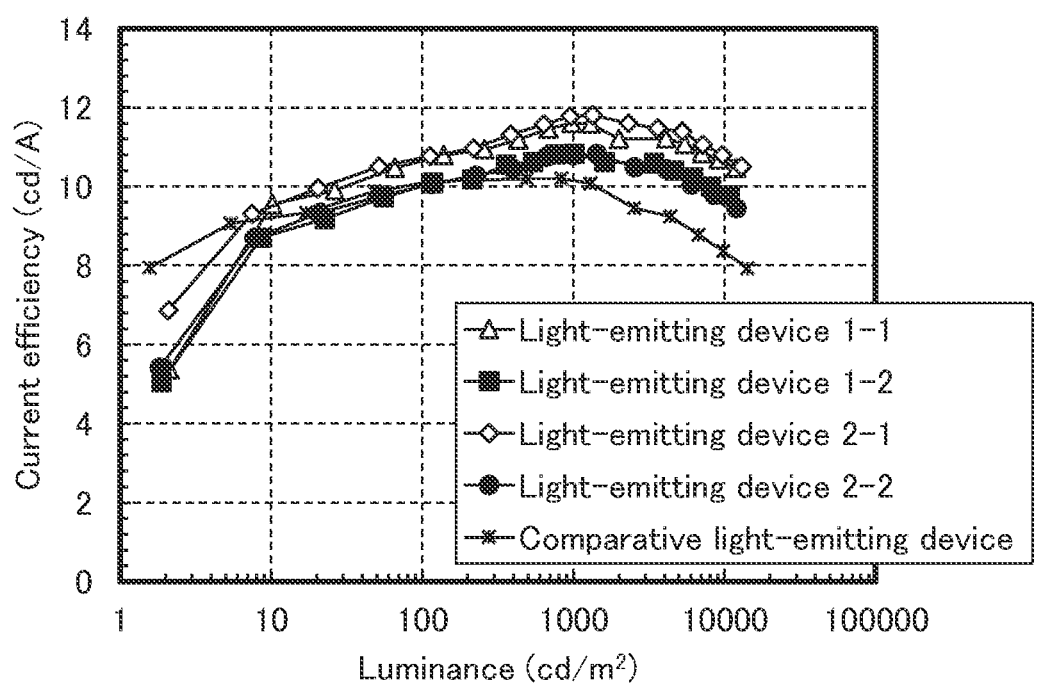
FIG. 16 is a diagram showing current efficiency-luminance characteristics of the light-emitting devices 1-1, 1-2, 2-1, and 2-2 and the comparative light-emitting device.
Figure 17:
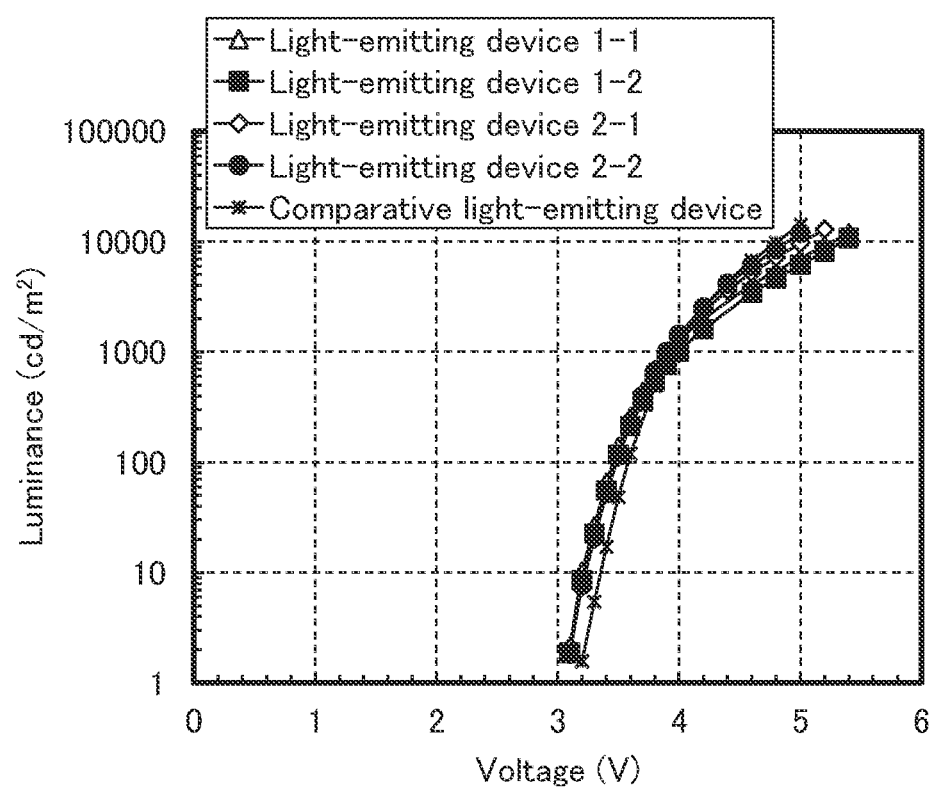
FIG. 17 is a diagram showing luminance-voltage characteristics of the light-emitting devices 1-1, 1-2, 2-1, and 2-2 and the comparative light-emitting device.
Figure 18:
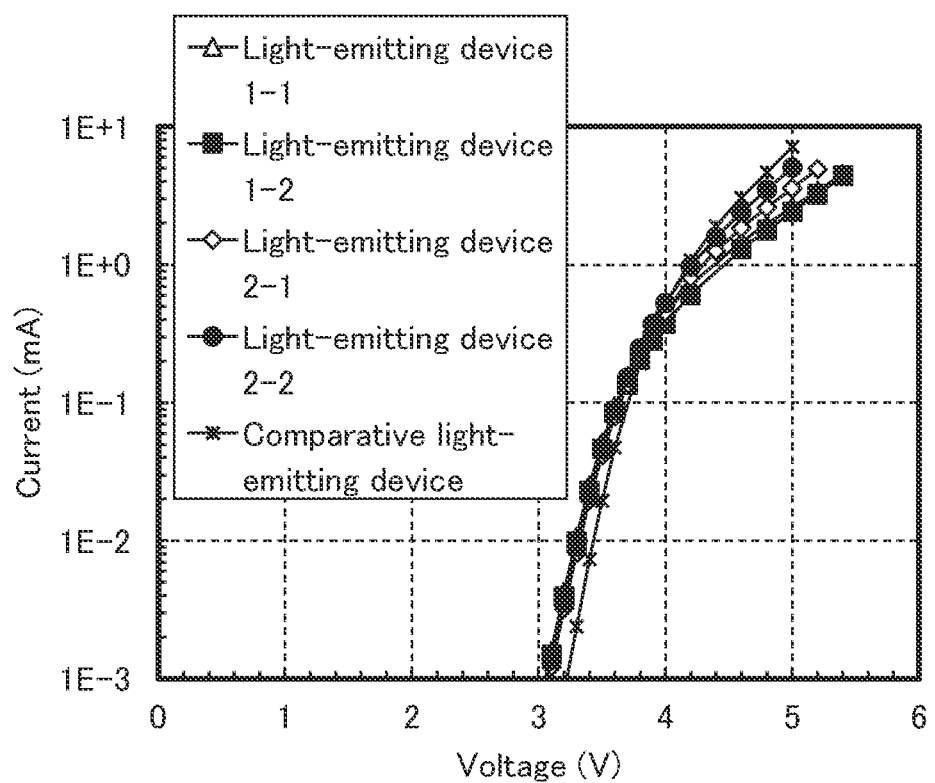
FIG. 18 is a diagram showing current-voltage characteristics of the light-emitting devices 1-1, 1-2, 2-1, and 2-2 and the comparative light-emitting device.
Figure 19:
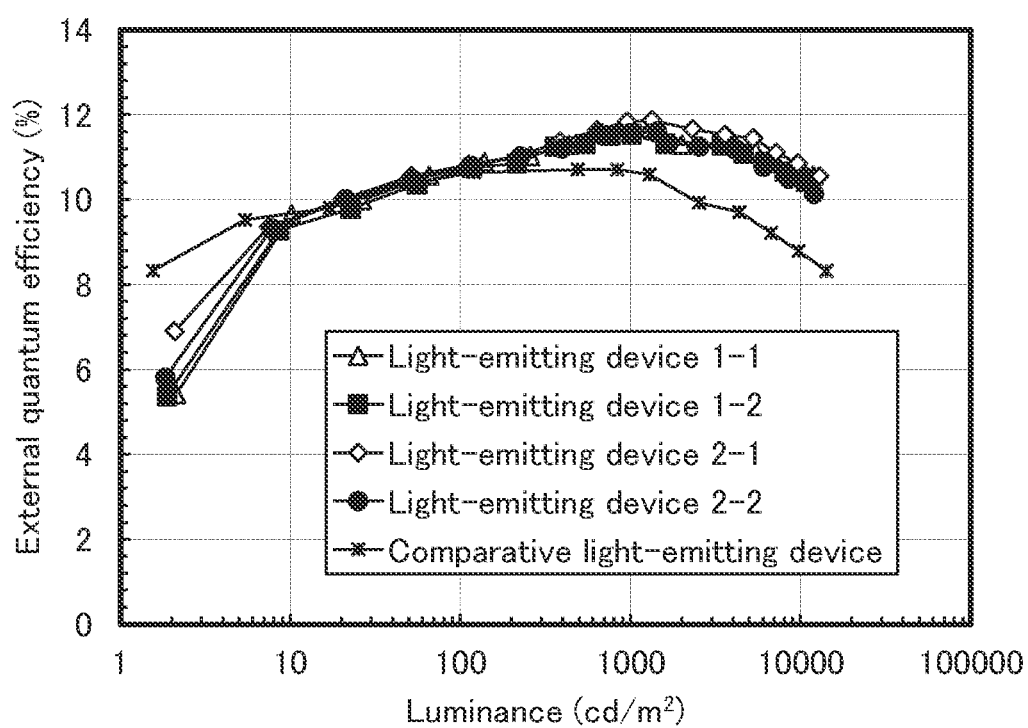
FIG. 19 is a diagram showing external quantum efficiency-luminance characteristics of the light-emitting devices 1-1, 1-2, 2-1, and 2-2 and the comparative light-emitting device.
Figure 20:
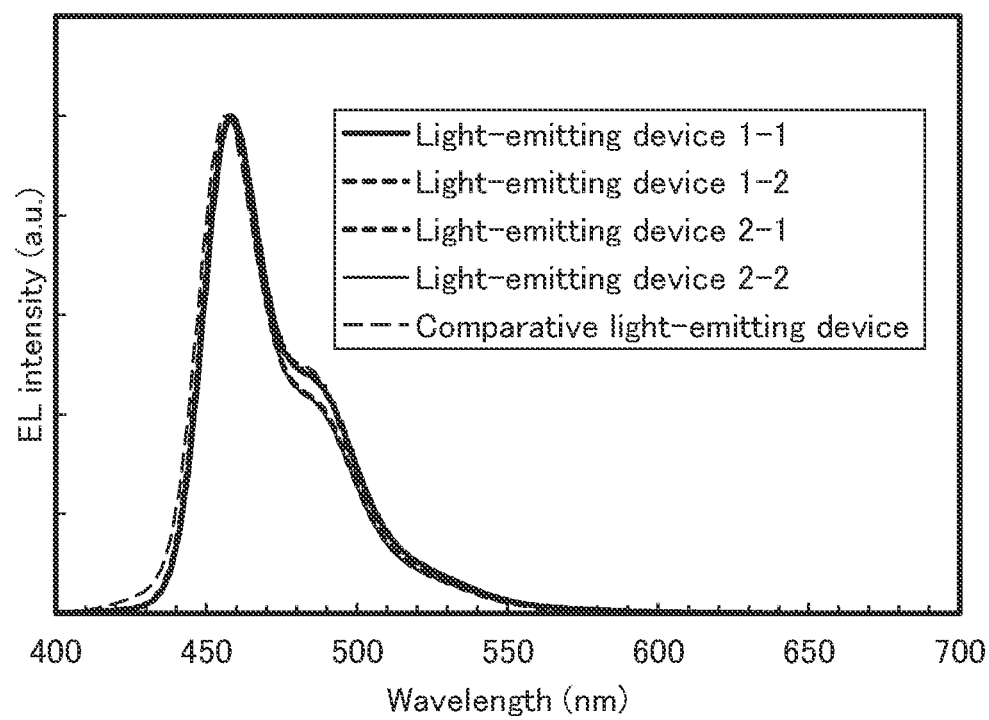
FIG. 20 is a diagram showing emission spectra of the light-emitting devices 1-1, 1-2, 2-1, and 2-2 and the comparative light-emitting device.

FIG. 15 shows the luminance-current density characteristics of the light-emitting device 1; FIG. 16 shows the current efficiency-luminance characteristics thereof; FIG. 17 shows the luminance-voltage characteristics thereof; FIG. 18 shows the current-voltage characteristics thereof; FIG. 19 shows the external quantum efficiency-luminance characteristics thereof; and FIG. 20 shows the emission spectra thereof. Table 3 shows main characteristics of the light-emitting device 1 at approximately 1000 cd/m$^2$.

|  | Voltage (V) | Current (fiA) | Current density (mA/cm$^2$) | Chromaticity x | Chromaticity Y | Current efficiency (cd/A) | External quantum efficiency (%) |
|---|---|---|---|---|---|---|---|
| Light-emitting device 1-1 | 3.9 | 0.34 | 8.4 | 0.14 | 0.12 | 11.6 | 11.7 |
| Light-emitting device 1-2 | 4.0 | 0.37 | 9.4 | 0.14 | 0.11 | 10.8 | 11.5 |
| Light-emitting device 2-1 | 3.9 | 0.32 | 8.1 | 0.14 | 0.12 | 11.8 | 11.8 |
| Light-emitting device 2-2 | 3.9 | 0.37 | 9.3 | 0.14 | 0.11 | 10.8 | 11.6 |
| Comparative light-emitting device | 3.9 | 0.33 | 8.2 | 0.14 | 0.12 | 10.2 | 10.7 |

FIG. 15 to FIG. 20 and Table 3 show that the light-emitting device 1 of one embodiment of the present invention is a blue-light-emitting device having favorable initial characteristics.

Figure 21:
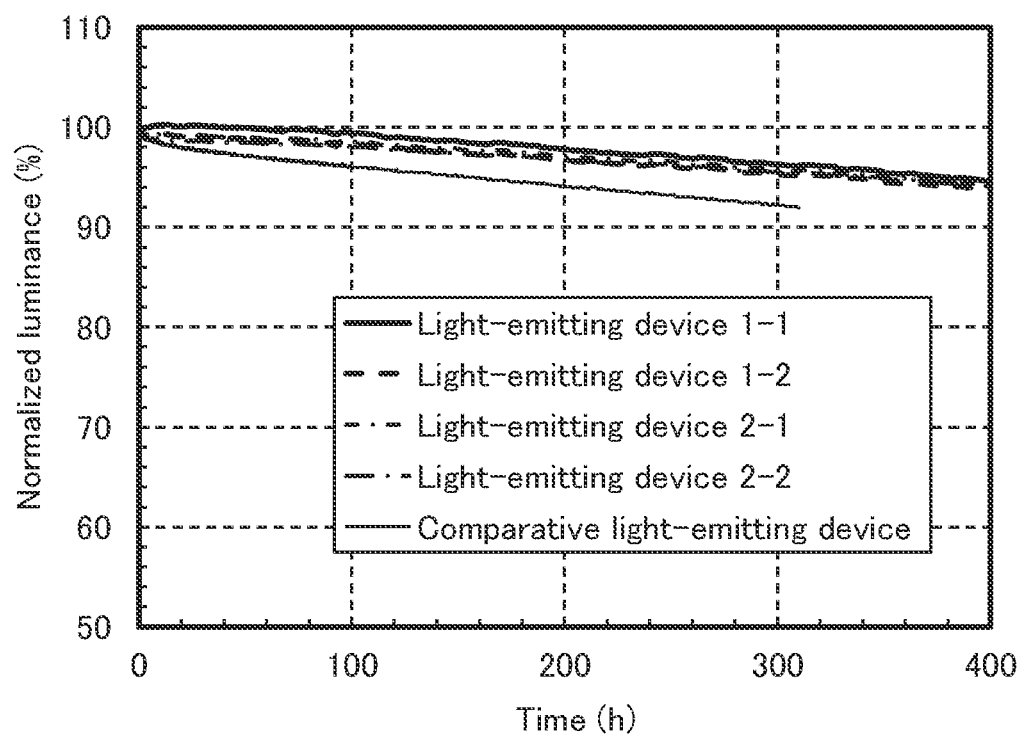
FIG. 21 is a diagram showing normalized luminance-time change characteristics of the light-emitting devices 1-1, 1-2, 2-1, and 2-2 and the comparative light-emitting device.

A graph showing a change in luminance over driving time at a current density of 50 mA/cm$^2$ is shown in FIG. 21. As shown in FIG. 21, it is found that, in the light-emitting devices 1-1 and 1-2 and the light-emitting devices 2-1 and 2-2, the rapid luminance decay, which is normally occurs at the initial driving, does not occur and the luminance decreases gradually. This is because the luminance increase at the initial driving cancels out the initial decay in the light-emitting devices 1-1 and 1-2 and the light-emitting devices 2-1 and 2-2. In particular, after the start of the driving, the light-emitting device 1-1 showed a luminance increase to a luminance that is higher than the initial luminance, and then the luminance decreases. Accordingly, in the light-emitting devices 1-1 and 1-2 and the light-emitting devices 2-1 and 2-2, which are one embodiment of the present invention, the driving lifetime was improved greatly, mainly with the decay state of, in particular, 2 to 5% decay.

Next, the resistivity of a film included in each of the hole-injection layers in the light-emitting devices was measured, and the electric conductivity was calculated.

Samples used for the measurements are described below. All of the samples were each deposited over a glass substrate to have a size 4 mm×4 mm. An acceptor material that is a first substance (ALD-MP001Q in this example) and a hole-transport material that is a second substance (BBABnf for Samples 1-1, 1-2, and 1-3, FLPAPA for Sample 2-1, and PCBBiF for Comparative Sample 3-1) were deposited by co-evaporation to form the samples.

The samples were fabricated in the following manner: the glass substrate was fixed to a holder provided in a vacuum evaporation apparatus so that the surface on the substance deposition side faced downward, the pressure in the vacuum apparatus was reduced to 10$^{-4}$ Pa, and then the first substance and the second substance were deposited by co-evaporation. The thickness of all the samples was adjusted to 1000 nm.

The molar ratio between the first substance and the second substance in each sample was adjusted by the evaporation rate. Table 4 below shows the weight ratio and the molar ratio between the first substance and the second substance in each sample. In this example, samples having different mixing ratios from the mixing ratios used for the above light-emitting devices were fabricated and subjected to the measurement.

TABLE 4

| Hole-transport material | Sample name | Weight ratio (second substance:first substance) | Molar ratio (second substance:first substance) |
|---|---|---|---|
| BBABnf | 1-1 | 1:0.05 | 1:0.046 |
|  | 1-2 | 1:0.10 | 1:0.091 |
|  | 1-3 | 1:0.20 | 1:0.183 |
| FLPAPA | 2-1 | 1:0.05 | 1:0.055 |
| PCBBiF | 3-1 | 1:0.01 | 1:0.010 |

The resistivity measurement (the Van der Pauw method) was performed using a semiconductor parameter analyzer 4155B (Keysight: originally Hawlett Packard). The Van der Pauw method is a measurement method for obtaining the electrical resistivity and electrical conductivity of a thin-sheet-shaped substance such as a thin film, and can be applied regardless of the sample's two-dimensional shape as long as a condition such as being uniform in the thickness direction is satisfied. The measurement was performed at room temperature and in a DRY (a dew point of approximately −70° C.) environment. Four electrodes (probers) were provided to touch the film so that they are vertices of a square substantially, the potential difference between two points facing each other at the time when current flows between the two points was measured, and the amount having the same dimension as resistance was estimated with the following formula (1). In consideration of the f-value correcting the shape, the resistivity was calculated with the resistance estimated with the formula (1) and the following formula (2). The position and the direction of the current were varied, and the resistivity of the film was obtained by the average of eight points in total.

[Formula 1]

$$R_{12} = \frac{V_4 - V_3}{I_{12}}, \quad R_{23} = \frac{V_1 - V_4}{I_{23}} \quad (1)$$

$$R_{12} = \frac{V_4 - V_3}{I_{12}}, \quad R_{23} = \frac{V_1 - V_4}{I_{23}} \quad (2)$$

Figure 22A:
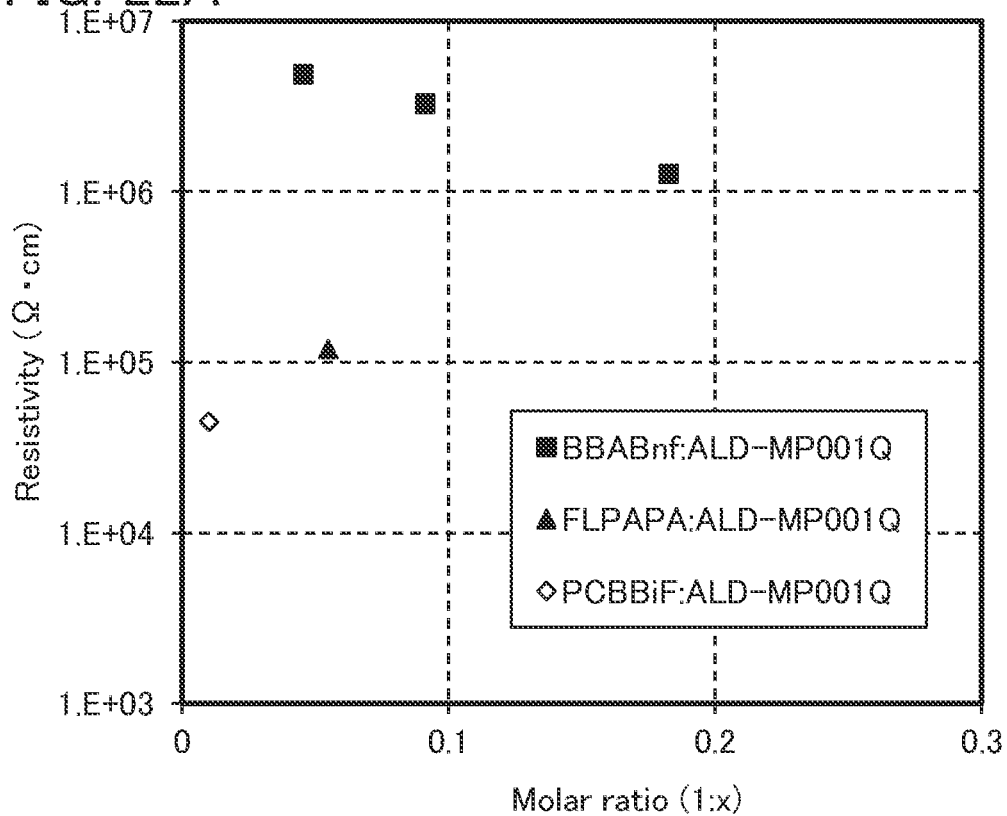
FIG. 22A is a diagram showing the resistivity of each of Samples 1-1, 1-2, 1-3, 2-1, 2-2, and 3-1.
Figure 22B:
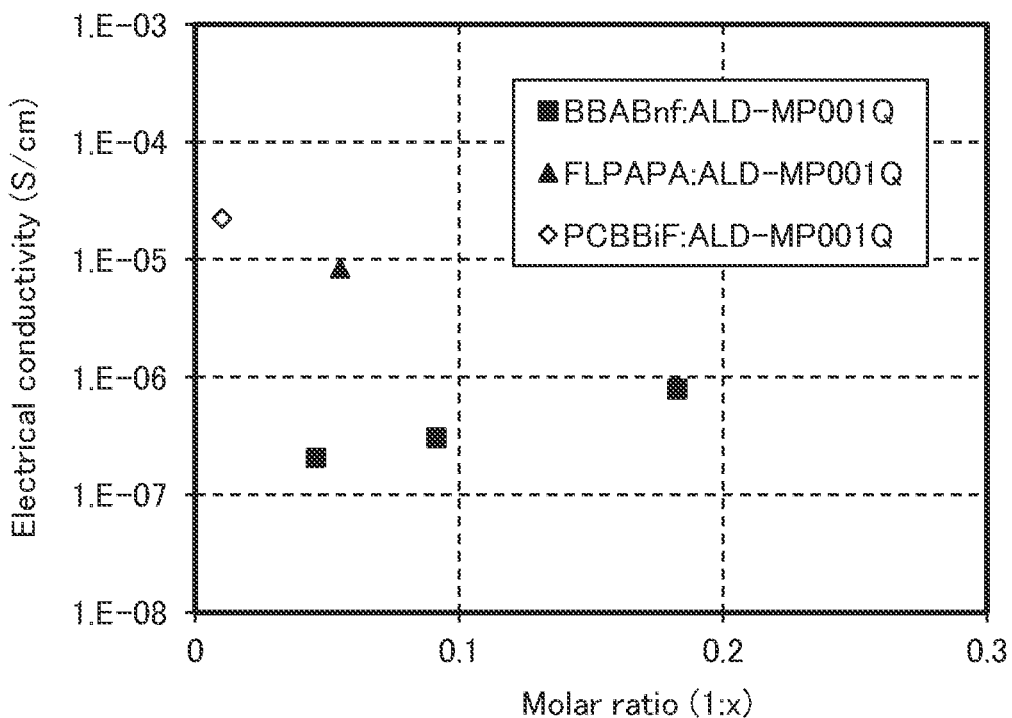
FIG. 22B is a diagram showing the electrical conductivity.

FIG. 22A is a graph showing the relation between the molar ratio of the first substance to the second substance in each sample and the resistivity, and FIG. 22B is a graph showing the relation between the molar ratio of the first substance to the second substance and the electrical conductivity calculated from the above resistivity. FIG. 22 shows that the resistivity of each of Samples 1-1 and 1-2 and Sample 2-1 having the same molar ratio as materials included in the hole-injection layer of the light-emitting devices 1-1 and 1-2 and the light-emitting device 2-1 was in the range of higher than or equal to $1\times10^4$ [Ω·cm] and lower than or equal to $1\times10^7$ [Ω·cm].

Meanwhile, it was found that Sample 3-1 had a low resistivity and a high electrical conductivity despite the lower molar ratio of the second substance than that of the material included in the hole-injection layer of the comparative light-emitting device 3-1 by approximately 10 times. Accordingly, it is predicted that the material included in the hole-injection layer used for the comparative light-emitting device has a resistivity lower than $1\times10^4$ [Ω·cm].

In the light-emitting apparatus of one embodiment of the present invention, a light-emitting device included in the light-emitting apparatus contains an electron-transport material and an alkali metal, an alkaline earth metal, a compound of an alkali metal or an alkaline earth metal, or a complex thereof in an electron-transport layer, and the resistivity of a hole-injection layer is higher than or equal to $1\times10^4$ [Ω·cm] and lower than or equal to $1\times10^7$ [Ω·cm], whereby favorable characteristics such as a long lifetime can be exhibited, and the occurrence of crosstalk between adjacent pixels can be suppressed even when the resolution is made high; therefore, the light emitting apparatus can have favorable display quality.

Note that when the resistivity is too low, the driving voltage increases and the carrier balance breaks down; thus, the resistivity is preferably higher than or equal to $5\times10^4$ [Ω·cm] and lower than or equal to $1\times10^7$ [Ω·cm], further preferably higher than or equal to $1\times10^5$ [Ω·cm] and lower than or equal to $1\times10^7$ [Ω·cm].

Reference Example 1

In this reference example, methods for calculating the HOMO levels, the LUMO levels, and the electron mobilities of the organic compounds used in the examples are described.

The HOMO level and the LUMO level can be calculated through cyclic voltammetry (CV) measurement.

An electrochemical analyzer (model number: ALS model 600A or 600C, manufactured by BAS Inc.) was used as a measurement apparatus. To prepare a solution for the CV measurement, dehydrated dimethylformamide (DMF) (manufactured by Sigma-Aldrich Co. LLC., 99.8%, catalog No. 22705-6) was used as a solvent, tetra-n-butylammonium perchlorate (n-Bu$_4$NClO$_4$) (manufactured by Tokyo Chemical Industry Co., Ltd., catalog No. T0836) as a supporting electrolyte was dissolved at a concentration of 100 mmol/L, and the object to be measured was dissolved at a concentration of 2 mmol/L. A platinum electrode (PTE platinum electrode, manufactured by BAS Inc.) was used as a working electrode, another platinum electrode (Pt counter electrode for VC-3 (5 cm), manufactured by BAS Inc.) was used as an auxiliary electrode, and an Ag/Ag+ electrode (RE7 reference electrode for non-aqueous solvent, manufactured by BAS Inc.) was used as a reference electrode. Note that the measurement was conducted at room temperature (20 to 25° C.). The scan speed in the CV measurement was fixed to 0.1 V/sec, and an oxidation potential Ea [V] and a reduction potential Ec [V] with respect to the reference electrode were measured. Ea is an intermediate potential of an oxidation-reduction wave, and Ec is an intermediate potential of a reduction-oxidation wave. Here, since the potential energy of the reference electrode used in this example with respect to the vacuum level is known to be −4.94 [eV], the HOMO level and the LUMO level can be calculated by the following formulae: HOMO level [eV]=−4.94−Ea and LUMO level [eV]=−4.94−Ec.

The electron mobility can be measured by an impedance spectroscopy method (IS method).

As a method for measuring the carrier mobility of an EL material, a time-of-flight method (TOF method), a method (SCLC method) using I-V characteristics of a space-charge-limited current (SCLC), or the like has been known for a long time. The TOF method needs a sample with a much larger thickness than that of an actual organic EL element. The SCLC method has a disadvantage in that electric field strength dependence of carrier mobility cannot be obtained, for example. Since an organic film required for the measurement by the IS method is as thin as approximately several hundreds of nanometers, the film can be deposited using a relatively small amount of an EL material; accordingly, the IS method is characterized by the capability of measuring the mobility with a thickness close to the thickness of a film in an actual EL element, and can also measure the electric field strength dependence of the carrier mobility.

In the IS method, a micro sinusoidal voltage signal (V=V$_0$[exp(jωt)]) is applied to an EL element, and the impedance of the EL element (Z=V/I) is obtained from a phase difference between the current amplitude of a response current signal (I=I$_0$exp[/(ωt+φ)]) and the input signal. By applying the voltage to the element while the frequency of the voltage is changed from a high level to a low level, components having various relaxation times that contribute to the impedance can be separated and measured.

Here, admittance Y (=1/Z), which is the reciprocal number of the impedance, can be represented by conductance G and susceptance B as shown in the following formula (3).

[Formula 2]

$$Y = \frac{1}{Z} = G + jB \quad (3)$$

In addition, by a single injection model, calculation of the following formulae (4) and (5) can be performed. Here, g (the formula (6)) is differential conductance. In the formula, C represents capacitance, θ represents a transit angle ωt, ω represents angular frequency, and t represents transit time. For the analysis, the current equation, the Poisson's equation, and the current continuity equation are used, and a diffusion current and a trap state are ignored.

[Formula 3]

$$G = \frac{g\theta^3}{6} \frac{\theta - \sin\theta}{(\theta - \sin\theta)^2 + \left(\frac{\theta^2}{2} + \cos\theta - 1\right)^2} \quad (4)$$

$$B = \omega C = \frac{g\theta^3}{6} \frac{\frac{\theta^2}{2} + \cos\theta - 1}{(\theta - \sin\theta)^2 + \left(\frac{\theta^2}{2} + \cos\theta - 1\right)^2} \quad (5)$$

$$g = \frac{9}{4}\varepsilon\mu\frac{V_0}{d^3} \quad (6)$$

A method for calculating mobility from the frequency characteristics of capacitance is a −ΔB method. A method for calculating mobility from the frequency characteristics of conductance is a ωΔG method.

Figure 23:
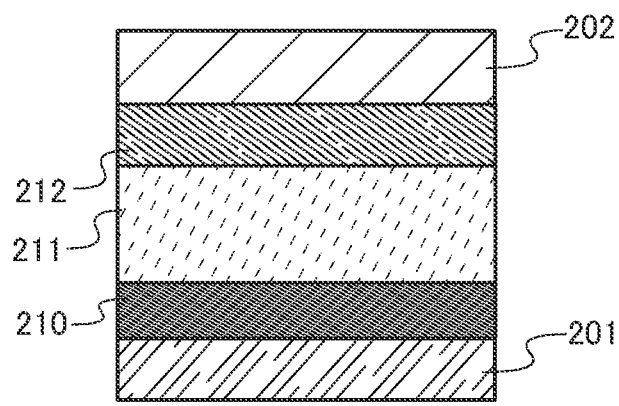
FIG. 23 is a diagram illustrating a structure of a measurement element.

In practice, first, an electron-only element is fabricated using a material whose electron mobility is intended to be calculated. The electron-only element is an element designed such that only electrons flow therein as carriers. In this specification, a method for calculating mobility from the frequency characteristics of capacitance (the −ΔB method) is described. FIG. 23 is a schematic diagram of an electron-only element that was used.

As illustrated in FIG. 23, the electron-only element fabricated in this time for the measurement includes a first layer 210, a second layer 211, and a third layer 212 between an anode 201 and a cathode 202. The material whose electron mobility is intended to be calculated is used as a material for the second layer 211. For explanation, an example of measuring in which the electron mobility of a film deposited by co-evaporation of ZADN and Liq in a weight ratio of 1:1 is given. A specific structure example is listed in the following table.

| Anode | | | First layer | Second layer | Third layer | Cathode |
|---|---|---|---|---|---|---|
| 100 nm | 50 nm | 100 nm | 1 nm | 200 nm | 1 nm | 100 nm |
| APC | NITO | Al | Liq | ZADN:Liq (0.5:0.5) | Liq | Al |

Figure 24:
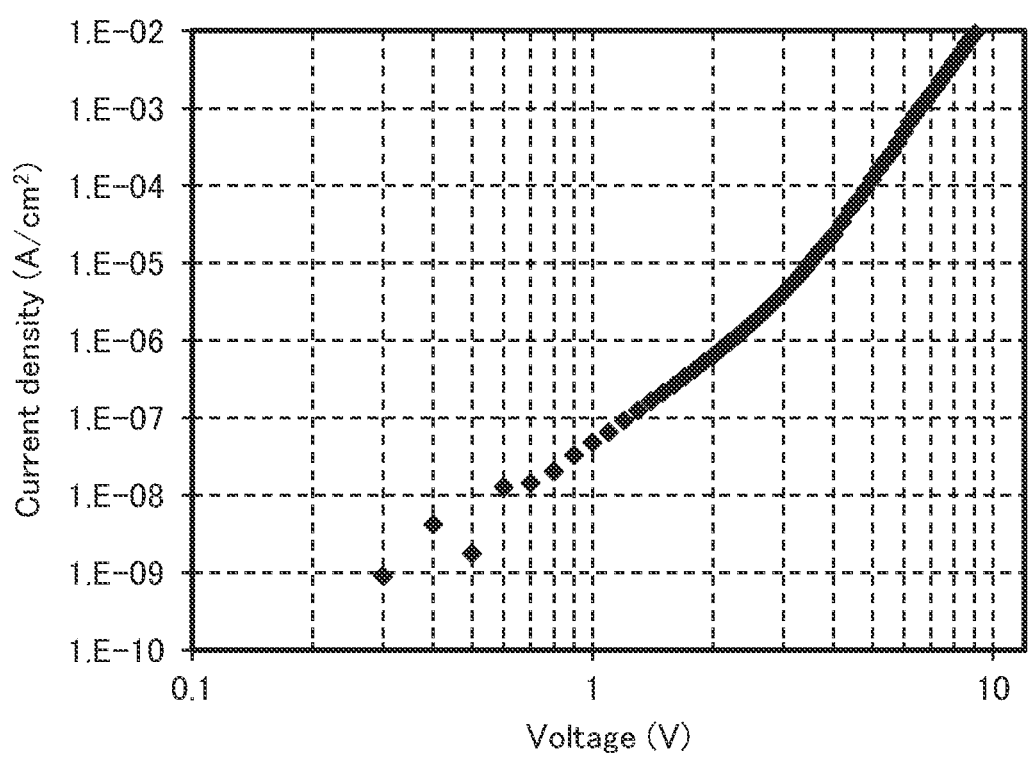
FIG. 24 is a diagram showing current density-voltage characteristics of the measurement element.

FIG. 24 shows the current density-voltage characteristics of the electron-only element using the film deposited by co-evaporation of ZADN and Liq as the second layer 211.

Figure 25:
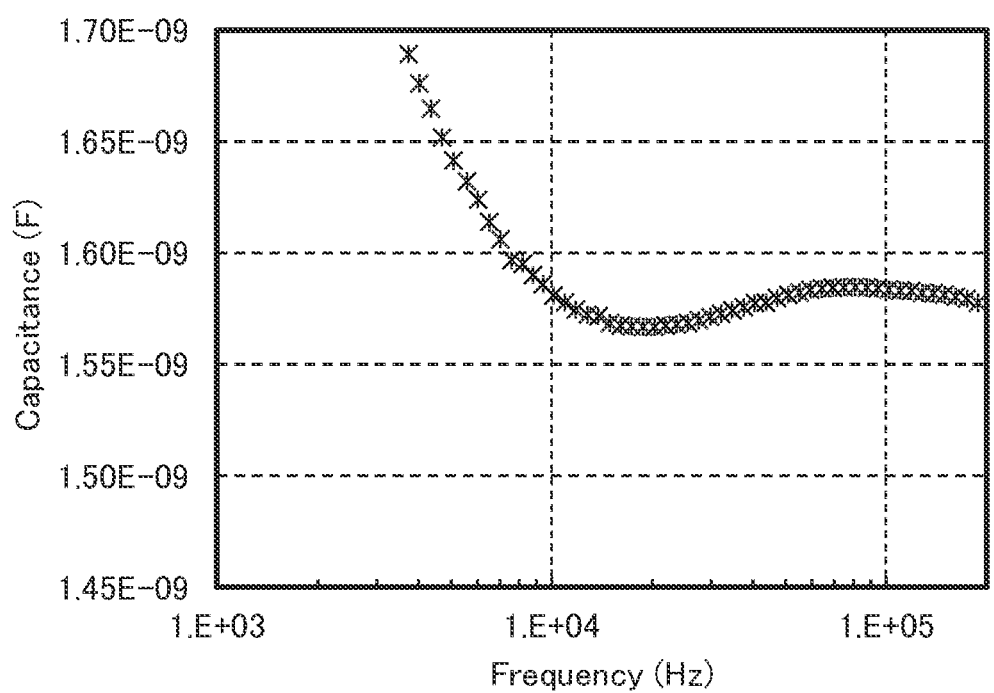
FIG. 25 is a diagram showing frequency characteristics of calculated capacitance C in the case of ZADN:Liq (1:1) at a DC power of 7.0 V.

The impedance was measured under the conditions where the DC voltage was applied in the range of 5.0 V to 9.0 V, the AC voltage was 70 mV, and the frequency was 1 Hz to 3 MHz. Here, capacitance is calculated from admittance, which is the reciprocal number of the obtained impedance (the above formula (3)). FIG. 25 shows the frequency characteristics of the calculated capacitance C when the application voltage was 7.0 V.

The frequency characteristics of the capacitance C are obtained from a phase difference in current, which is generated because a space charge generated by carriers injected by the micro voltage signal cannot completely follow the micro AC voltage. The transit time of the injected carriers in the film is defined by time T until the carriers reach a counter electrode, and is represented by the following formula (7).

[Formula 4]

$$T = \frac{4}{3}\frac{L^2}{\mu V_0} \quad (7)$$

A negative susceptance change (−ΔB) corresponds to a value (−ωΔC) obtained by multiplying a capacitance change −ΔC by angular frequency ω. According to the formula (5), there is a relation between peak frequency on the lowest frequency side $f'_{max}$ (=$\omega_{max}/2\pi$) and the transit time T as shown in the following formula (8).

[Formula 5]

$$T = \frac{4.5}{2\pi f'_{max}} \quad (8)$$

Figure 26:
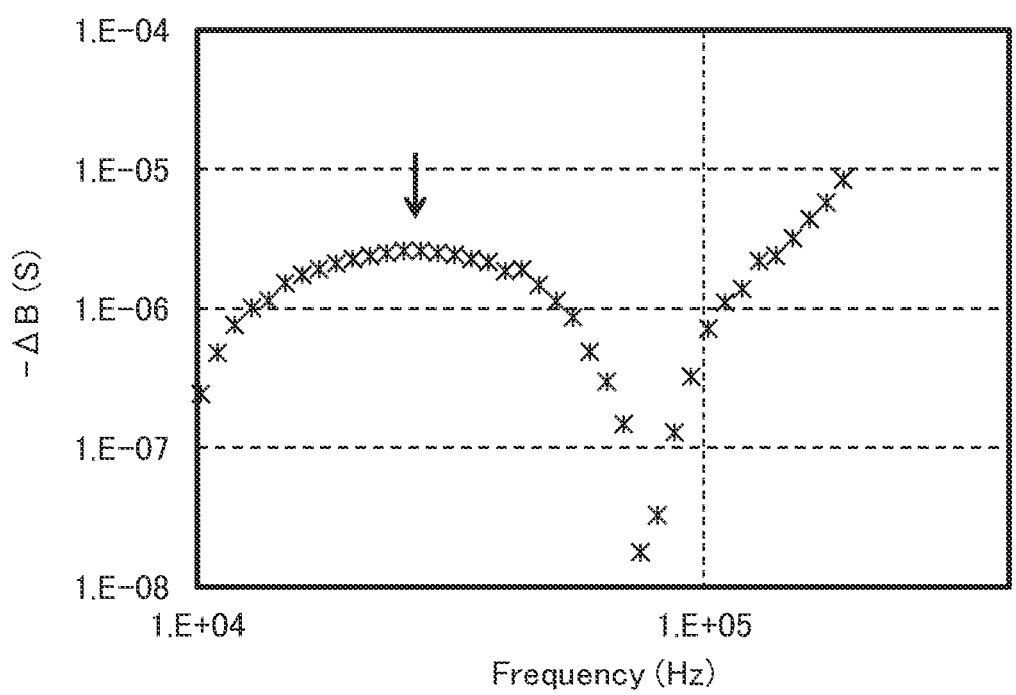
FIG. 26 is a diagram showing frequency characteristics of −ΔB in the case of ZADN:Liq (1:1) at a DC voltage of 7.0 V.

FIG. 26 shows the frequency characteristics of −ΔB calculated from the above measurement (i.e., −ΔB at a DC voltage of 7.0 V). The peak frequency on the lowest frequency side $f'_{max}$ that is obtained from FIG. 26 is indicated by an arrow in the diagram.

The transit time T is obtained from $f'_{max}$ obtained from the above measurement and analysis (see the above formula (8)); thus, in this example, the electron mobility at a voltage of 7.0 V can be obtained from the above formula (7). Through the same measurement with the DC voltage in the range of 5.0 V to 9.0 V, the electron mobility at each voltage (electric field strength) can be calculated, so that the electric field strength dependence of the mobility can also be measured.

Figure 27:
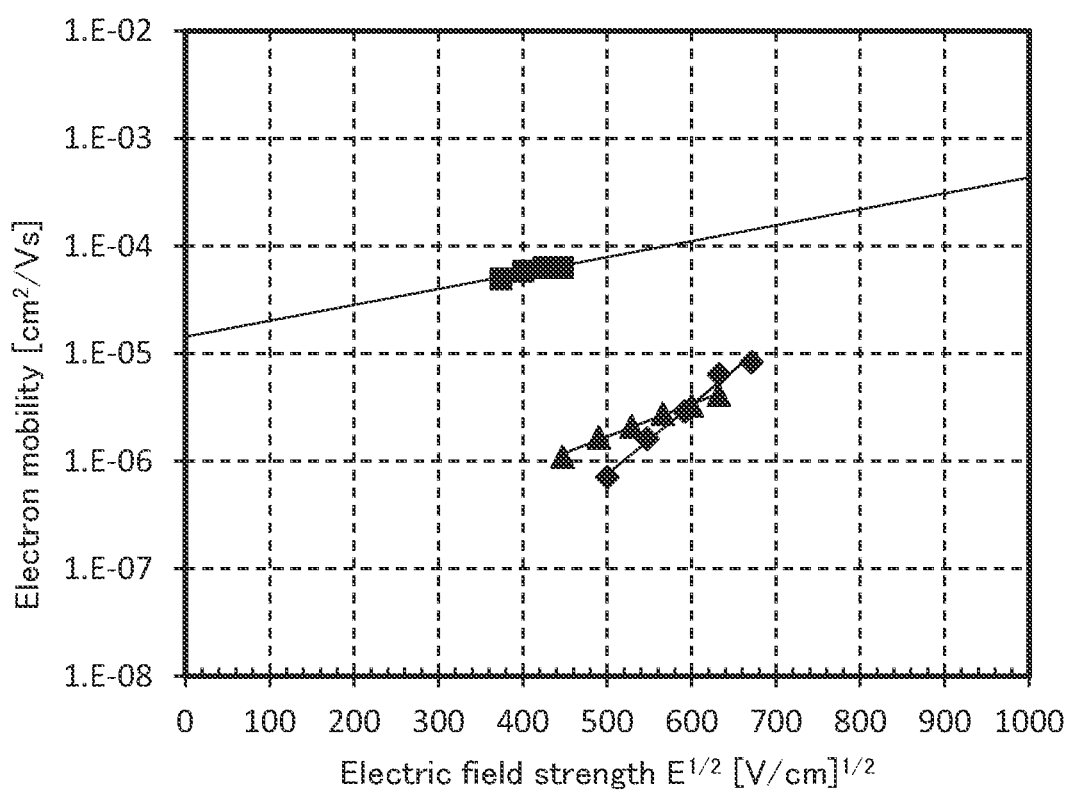
FIG. 27 is a diagram showing electric field strength dependence of electron mobility of organic compounds.

FIG. 27 shows the final electric field strength dependence of the electron mobility of the organic compounds obtained by the above calculation method, and Table 9 shows the values of the electron mobility when the square root of the electric field strength [V/cm] read from the figure was 600 $[V/cm]^{1/2}$.

TABLE 6

| | Electron mobility ($cm^2/Vs$) |
|---|---|
| cgDBCzPA | $7.7 \times 10^{-5}$ |
| 2mDBTBPDBq-II | $2.2 \times 10^{-5}$ |
| ZADN:Liq (1:1) | $3.5 \times 10^{-6}$ |

The electron mobility can be calculated as described above. For the details about the measurement method, refer to the following reference: T. Okachi et al., *Japanese Journal of Applied Physics*, vol. 47, No. 12, 2008, pp. 8965-8972.

REFERENCE NUMERALS

101: anode, 102: cathode, 103: EL layer, 111: hole-injection layer, 112: hole-transport layer, 112-1: first hole-transport layer, 112-2: second hole-transport layer, 113: light-emitting layer, 113-1: light-emitting region, 114: electron-transport layer, 114-1: first electron-transport layer, 114-2: second electron-transport layer, 115: electron-injection layer, 116: charge generation layer, 117: p-type layer, 118: electron-relay layer, 119: electron-injection buffer layer, 201: anode, 202: cathode, 210: first layer, 211: second layer, 212: third layer, 400: substrate, 401: anode, 403: EL layer, 404: cathode, 405: sealant, 406: sealant, 407: sealing substrate, 412: pad, 420: IC chip, 501: anode, 502: cathode, 511: first light-emitting unit, 512: second light-emitting unit, 513: charge generation layer, 601: driver circuit portion (source line driver circuit), 602: pixel portion, 603: driver circuit portion (gate line driver circuit), 604: sealing substrate, 605: sealant, 607: space, 608: wiring, 609: FPC (flexible printed circuit), 610: element substrate, 611: switching FET, 612: current controlling FET, 613: anode, 614: insulator, 616: EL layer, 617: cathode, 618: light-emitting device, 1001: substrate, 1002: base insulating film, 1003: gate insulating film, 1006: gate electrode, 1007: gate electrode, 1008: gate electrode, 1020: first interlayer insulating film, 1021: second interlayer insulating film, 1022: electrode, 1024W: anode, 1024R: anode, 1024G: anode, 1024B: anode, 1025: partition, 1028: EL layer, 1029: cathode, 1031: sealing substrate, 1032: sealant, 1033: transparent base material, 1034R: red coloring layer, 1034G: green coloring layer, 1034B: blue coloring layer, 1035: black matrix, 1036: overcoat layer, 1037: third interlayer insulating film, 1040: pixel portion, 1041: driver circuit portion, 1042: peripheral portion, 2001: housing, 2002: light source, 2100: robot, 2110: arithmetic device, 2101: illuminance sensor, 2102: microphone, 2103: upper camera, 2104: speaker, 2105: display, 2106: lower camera, 2107: obstacle sensor, 2108: moving mechanism, 3001: lighting device, 5000: housing, 5001: display portion, 5002: display portion, 5003: speaker, 5004: LED lamp, 5005: operation key, 5006: connection terminal, 5007: sensor, 5008: microphone, 5012: support, 5013: earphone, 5100: cleaning robot, 5101: display, 5102: camera, 5103: brush, 5104: operation button, 5150: portable information terminal, 5151: housing, 5152: display region, 5153: bend portion, 5120: dust, 5200: display region, 5201: display region, 5202: display region, 5203: display region, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7210: second display portion, 7401: housing, 7402: display portion, 7403: operation button, 7404: external connection port, 7405: speaker, 7406: microphone, 9310: portable information terminal, 9311: display panel, 9313: hinge, 9315: housing

The invention claimed is:

1. A light-emitting device comprising:
an anode;
a cathode; and
an EL layer positioned between the anode and the cathode,
wherein the EL layer comprises a hole-injection layer, a light-emitting layer, and an electron-transport layer,
wherein the electron-transport layer contains an electron-transport material and at least one of an alkali metal, an alkaline earth metal, a compound of an alkali metal or an alkaline earth metal, and a complex of an alkali metal or an alkaline earth metal,
wherein the hole-injection layer comprises a hole-transport material comprising at least one of an anthracene skeleton and a 9-fluorenyl group, and
wherein a resistivity of a film included in the hole-injection layer is higher than or equal to $1\times10^4$ [Ω·cm] and lower than or equal to $1\times10^7$ [Ω·cm].

2. A light-emitting device comprising:
an anode;
a cathode; and
an EL layer positioned between the anode and the cathode,
wherein the EL layer comprises a hole-injection layer, a light-emitting layer, and an electron-transport layer,
wherein the hole-injection layer comprises a hole-transport material comprising at least one of an anthracene skeleton and a 9-fluorenyl group,
wherein the electron-transport layer comprises an electron-transport material and a metal complex containing a ligand having a 8-hydroxyquinolinato structure and a monovalent metal ion, and
wherein a resistivity of a film included in the hole-injection layer is higher than or equal to $1\times10^4$ [Ω·cm] and lower than or equal to $1\times10^7$ [Ω·cm].

3. The light-emitting device according to claim 1,
wherein the electron-transport material is an organic compound having an anthracene skeleton.

4. The light-emitting device according to claim 1,
wherein an electron mobility of the electron-transport layer in the case where the square root of the electric field strength [V/cm] is 600 is higher than or equal to $1\times10^{-7}$ cm$^2$/Vs and lower than or equal to $5\times10^{-5}$ cm$^2$/Vs.

5. The light-emitting device according to claim 1,
wherein the electron-transport layer comprises a first region and a second region,
wherein the first region is positioned between the light-emitting layer and the second region, and
wherein a concentration of at least one of the alkali metal, the alkaline earth metal, the compound of an alkali metal or an alkaline earth metal, and the complex thereof is different between the first region and the second region.

6. The light-emitting device according to claim 5,
wherein the concentration of at least one of the alkali metal, the alkaline earth metal, the compound of an alkali metal or an alkaline earth metal, and the complex of an alkali metal or an alkaline earth metal in the first region is high.

7. The light-emitting device according to claim 5,
wherein the concentration of at least one of the alkali metal, the alkaline earth metal, the compound of an alkali metal or an alkaline earth metal, and the complex of an alkali metal or an alkaline earth metal in the second region is high.

8. The light-emitting device according to claim 5,
wherein the concentration of at least one of the alkali metal, the alkaline earth metal, the compound of an alkali metal or an alkaline earth metal, and the complex of an alkali metal or an alkaline earth metal in the first region or the second region is 0.

9. The light-emitting device according to claim 1,
wherein the hole-injection layer further contains an electron-accepting material,
wherein the electron-accepting material exhibits an electron-accepting property with respect to the hole-transport material, and
wherein the hole-transport material is an organic compound having a HOMO level of higher than or equal to −5.7 eV and lower than or equal to −5.4 eV.

10. The light-emitting device according to claim 1,
wherein an electron mobility of the hole-transport material in the case where the square root of the electric field strength [V/cm] is 600 is lower than or equal to $1\times10^{-3}$ cm$^2$/Vs.

11. The light-emitting device according to claim 1,
wherein the resistivity of the film included in the hole-injection layer is higher than or equal to $5\times10^4$ [Ω·cm] and lower than or equal to $1\times10^7$ [Ω·cm].

12. The light-emitting device according to claim 1,
wherein the EL layer comprises a hole-transport layer between the hole-injection layer and the light-emitting layer.

13. The light-emitting device according to claim 12,
wherein the hole-transport layer has a two-layer structure of a first hole-transport layer positioned on the hole-injection layer side and a second hole-transport layer positioned on the light-emitting layer side.

14. The light-emitting device according to claim 13,
wherein the second hole-transport layer also functions as an electron-blocking layer.

15. The light-emitting device according to claim 1,
wherein the light-emitting layer contains a host material and an emission center material, and
wherein an electron mobility of the electron-transport material is lower than an electron mobility of the host material.

16. The light-emitting device according to claim 15,
wherein the emission center material exhibits fluorescence.

17. The light-emitting device according to claim 15,
wherein the emission center material exhibits blue fluorescence.

18. An electronic device comprising:
the light-emitting device according to claim 1; and
at least one of a sensor, an operation button, a speaker, and a microphone.

19. A light-emitting apparatus comprising:
the light-emitting device according to claim 1; and
a transistor and a substrate.

20. A lighting device comprising:
the light-emitting device according to claim 1; and
a housing.

* * * * *